(12) United States Patent
Yamazaki et al.

(10) Patent No.: US 8,378,343 B2
(45) Date of Patent: Feb. 19, 2013

(54) SEMICONDUCTOR DEVICE AND MANUFACTURING METHOD THEREOF

(75) Inventors: Shunpei Yamazaki, Setagaya (JP); Junichiro Sakata, Atsugi (JP); Hiroyuki Miyake, Atsugi (JP); Hideaki Kuwabara, Isehara (JP); Mari Terashima, Ayase (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 392 days.

(21) Appl. No.: 12/835,119

(22) Filed: Jul. 13, 2010

(65) Prior Publication Data

US 2011/0012106 A1    Jan. 20, 2011

(30) Foreign Application Priority Data

Jul. 17, 2009    (JP) .................................. 2009-169597

(51) Int. Cl.
    *H01L 29/10* (2006.01)
(52) U.S. Cl. ........... 257/43; 257/E29.296; 257/E21.476; 438/104
(58) Field of Classification Search ................. 257/43, 257/59, E29.296, E21.476; 438/104
    See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,713,785 B2 | 3/2004 | Yagi |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |

(Continued)

FOREIGN PATENT DOCUMENTS

| | | |
|---|---|---|
| EP | 1737044 A | 12/2006 |
| EP | 1770788 | 4/2007 |

(Continued)

OTHER PUBLICATIONS

Fortunato.E et al., "Wide-Bandgap High-Mobility ZNO Thin-Film Transistors Produced At Room Temperature,", Appl. Phys. Lett. (Applied Physics Letters), Sep. 27, 2004, vol. 85, No. 13, pp. 2541-2543.

(Continued)

*Primary Examiner* — Trung Q Dang
(74) *Attorney, Agent, or Firm* — Eric J. Robinson; Robinson Intellectual Property Law Office, P.C.

(57) ABSTRACT

A semiconductor device is provided in which a pixel portion and a driver circuit each including a thin film transistor are provided over one substrate; the thin film transistor in the pixel portion includes a gate electrode layer, a gate insulating layer, an oxide semiconductor layer having an end region with a small thickness, an oxide insulating layer in contact with part of the oxide semiconductor layer, source and drain electrode layers, and a pixel electrode layer; the thin film transistor in the pixel portion has a light-transmitting property; and source and drain electrode layers of the thin film transistor in the driver circuit portion are formed using a conductive material having lower resistance than a material of the source and drain electrode layer in the pixel portion.

42 Claims, 38 Drawing Sheets

U.S. PATENT DOCUMENTS

| | | |
|---|---|---|
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,298,084 B2 | 11/2007 | Baude et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,719,185 B2 | 5/2010 | Jin et al. |
| 7,732,819 B2 | 6/2010 | Akimoto et al. |
| 7,745,798 B2 | 6/2010 | Takahashi |
| 7,855,379 B2 | 12/2010 | Hayashi et al. |
| 8,088,652 B2 | 1/2012 | Hayashi et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0111663 A1 | 6/2003 | Yagi |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0057261 A1 | 3/2007 | Jeong et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0291350 A1 | 11/2008 | Hayashi et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0140438 A1 | 6/2009 | Yamazaki et al. |
| 2009/0152506 A1 | 6/2009 | Umeda et al. |
| 2009/0152541 A1 | 6/2009 | Maekawa et al. |
| 2009/0189155 A1 | 7/2009 | Akimoto |
| 2009/0189156 A1 | 7/2009 | Akimoto |
| 2009/0278122 A1 | 11/2009 | Hosono et al. |
| 2009/0280600 A1 | 11/2009 | Hosono et al. |
| 2009/0283762 A1 | 11/2009 | Kimura |
| 2010/0044701 A1 | 2/2010 | Sano et al. |
| 2010/0065844 A1 | 3/2010 | Tokunaga |
| 2010/0084648 A1 | 4/2010 | Watanabe |
| 2010/0092800 A1 | 4/2010 | Itagaki et al. |
| 2010/0109002 A1 | 5/2010 | Itagaki et al. |
| 2010/0163868 A1* | 7/2010 | Yamazaki et al. ............. 257/43 |
| 2011/0003429 A1* | 1/2011 | Oikawa et al. ............... 438/104 |
| 2011/0006302 A1* | 1/2011 | Yamazaki et al. ............. 257/43 |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 | 9/1993 |
| JP | 08-264794 | 10/1996 |
| JP | 08-264794 A | 10/1996 |
| JP | 11-505377 | 5/1999 |
| JP | 2000-044236 A | 2/2000 |
| JP | 2000-150900 | 5/2000 |
| JP | 2002-076356 A | 3/2002 |
| JP | 2002-289859 A | 10/2002 |
| JP | 2003-029293 | 1/2003 |
| JP | 2003-086000 | 3/2003 |
| JP | 2003-086000 A | 3/2003 |
| JP | 2003-086808 | 3/2003 |
| JP | 2003-179233 A | 6/2003 |
| JP | 2004-103957 | 4/2004 |
| JP | 2004-273614 A | 9/2004 |
| JP | 2004-273732 A | 9/2004 |
| JP | 2007-081362 | 3/2007 |
| JP | 2007-096055 | 4/2007 |
| JP | 2007-123861 | 5/2007 |
| JP | 2007-163467 | 6/2007 |
| JP | 2007-171932 | 7/2007 |
| JP | 2008-235871 A | 10/2008 |
| JP | 2008-281988 A | 11/2008 |
| JP | 2009-158940 A | 7/2009 |
| JP | 2009-265271 | 11/2009 |
| JP | 2010-098280 | 4/2010 |
| WO | WO 2004/114391 | 12/2004 |
| WO | WO-2008/105347 | 9/2008 |
| WO | WO-2008/126879 | 10/2008 |

OTHER PUBLICATIONS

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Hayashi.R et al., "42.1: Invited Paper: Improved Amorphous In-Ga-Zn-O TFTs,", SID Digest '08 : SID International Symposium Digest of Technical Papers, May 20, 2008, vol. 39, pp. 621-624.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Son.K et al., "42.4L: Late-News Paper: 4 Inch QVGA AMOLED Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Nakamura.M, "Synthesis of Homologous Compound with New Long-Period Structure,", NIRIM Newsletter, Mar. 1, 1995, vol. 150, pp. 1-4.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B. (Physical Review. B), 2008, vol. 77, pp. 245202-1-245202-6.

Orita.M et al., "Amorphous transparent conductive oxide InGaO3(ZnO)m (m <4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZNO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

Nozawa, T., "Transparent Circuit,", Nikkei Electronics, Aug. 27, 2007, No. 959, pp. 39-52.

Kimizuka et al., "Spinel, $YbFe_2O_4$, and $Yb_2Fe_3O_7$ Types of Structures for Compounds in the $In_2O_3$ and $Sc_2O_3$-$A_2O_3$-BO Systems [A: Fe, Ga, Or Al; B: Mg, Mn, Fe, Ni, Cu, or Zn] at Temperatures Over 1000°C" Journal of Solid State Chemistry, 1985, vol. 60, pp. 382-384.

Kimizuka et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$-$ZnGa_2O_4$-ZnO System," Journal of Solid State Chemistry, Apr. 1, 1995, vol. 116, No. 1, pp. 170-178.

Nakamura et al., "The Phase Relations in the $In_2O_3$-$Ga_2ZnO_4$-ZnO System at 1350°C," Journal of Solid State Chemistry, Aug. 1, 1991, vol. 93, No. 2, pp. 298-315.

Li et al., "Modulated Structures of Homologous Compounds $InMO_3(ZnO)_m$ (M=In,Ga; m=Integer) Described by Four-Dimensional Superspace Group," Journal of Solid State Chemistry, 1998, vol. 139, pp. 347-355.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Nomura et al., "Thin-Film Transistor Fabricated in Single-Crystalline Transparent Oxide Semiconductor," Science, May 23, 2003, vol. 300, No. 5623, pp. 1269-1272.

Lee et al., "Current Status of, Challenges to, and Perspective View of AM-OLED," IDW '06: Proceedings of the 13TH International Display Workshops, Dec. 7, 2006, pp. 663-666.

Jeong et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.

Asaoka et al., "29.1: Polarizer-Free Reflective LCD Combined With Ultra Low-Power Driving Technology," SID Digest '09: SID International Symposium Digest of Technical Papers, 2009, pp. 395-398.

Tsuda et al., "Ultra Low Power Consumption Technologies for Mobile TFT-LCDs," IDW '02: Proceedings of the 9th International Display Workshops, Dec. 4, 2002, pp. 295-298.

Kanno et al., "White Stacked Electrophosphorecent Organic Light-Emitting Device Employing $MoO_3$ as a Charge-Generation Layer," Adv. Mater. (Advanced Materials), 2006, vol. 18, No. 3, pp. 339-342.

Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.

Ikeda et al., "Full-Functional System Liquid Crystal Display Using CG-Silicon Technology," SID Digest '04: SID International Symposium Digest of Technical Papers, 2004, vol. 35, pp. 860-863.

Kurokawa et al., "UHF RFCPUS on Flexible and Glass Substrates for Secure RFID Systems," Journal of Solid-State Circuits, 2008, vol. 43, No. 1, pp. 292-299.

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

Hirao et al., "Novel Top-Gate Zinc Oxide Thin-Film Transistors (ZnO TFTs) for AMLCDs," Journal of the SID, 2007, vol. 15, No. 1, pp. 17-22.

Lee et al., "World's Largest (15-inch) XGA AMLCD Panel using IGZO Oxide TFT," SID Digest '08: SID International Symposium Digest of Technical Papers, May 20, 2008, vol. 39, pp. 625-628.

Park et al., "Challenge to Future Displays: Transparent AM-OLED Driven by PEALD Grown ZnO TFT," IMID '07 Digest, 2007, pp. 1249-1252.

Park et al., "Amorphous Indium-Gallium-Zinc Oxide TFTs and their Application for Large Size AMOLED," AM-FPD '08 Digest of Technical Papers, Jul. 2, 2008, pp. 275-277.

Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Lee et al., "15.4: Excellent Performance of Indium-Oxide-Based Thin-Film Transistors by DC Sputtering," SID Digest '09: SID International Symposium Digest of Technical Papers, May 31, 2009, pp. 191-193.

Cho et al., "21.2: Al and Sn-doped Zinc Indium Oxide Thin Film Transistors for AMOLED Back-Plane," SID Digest '09: SID International Symposium Digest of Technical Papers, May 31, 2009, pp. 280-283.

Coates et al., "Optical Studies of the Amorphous Liquid-Cholesteric Liquid Crystal Transition: The "Blue Phase"," Physics Letters, Sep. 10, 1973, vol. 45A, No. 2, pp. 115-116.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

Costello et al., "Electron Microscopy of a Cholesteric Liquid Crystal and Its Blue Phase," Phys. Rev. A (Physical Review. A), May 1, 1984, vol. 29, No. 5, pp. 2957-2959.

Kitzerow et al., "Observation of Blue Phases in Chiral Networks," Liquid Crystals, 1993, vol. 14, No. 3, pp. 911-916.

Kikuchi et al., "Polymer-Stabilized Liquid Crystal Blue Phases," Nature Materials, Sep. 2, 2002, vol. 1, pp. 64-68.

Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Park et al., "High performance amorphous oxide thin film transistors with self-aligned top-gate structure," IEDM 09: Technical Digest of International Electron Devices Meeting, Dec. 7, 2009, pp. 191-194.

Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Miyasaka, "58.2: Invited Paper: Suftla Flexible Microelectronics on their Way to Business," SID Digest '07: SID International Symposium Digest of Technical Papers, 2007, vol. 38, pp. 1673-1676.

Dembo et al., "RFCPUS on Glass and Plastic Substrates Fabricated by TFT Transfer Technology,"IEDM 05: Technical Digest of International Electron Devices Meeting, Dec. 5, 2005, pp. 1067-1069.

Prins et al., "A Ferroelectric Transparent Thin-Film Transistor," Appl. Phys. Lett. (Applied Physics Letters), Jun. 17, 1996, vol. 68, No. 25, pp. 3650-3652.

Takahashi et al., "Theoretical Analysis of IGZO Transparent Amorphous Oxide Semiconductor," IDW '08: Proceedings of the 15th International Display Workshops, Dec. 3, 2008, pp. 1637-1640.

Osada et al., "15.2: Development of Driver-Integrated Panel using Amorphous In-Ga-Zn-Oxide TFT,"SID Digest '09: SID International Symposium Digest of Technical Papers, May 31, 2009, pp. 184-187.

Ohara et al., "21.3: 4.0 IN. QVGA AMOLED Display Using In-Ga-Zn-Oxide TFTs with a Novel Passivation Layer," SID International Symposium Digest of Technical Papers, May 31, 2009, pp. 284-287.

Godo et al., "P-9: Numerical Analysis on Temperature Dependence of Characteristics of Amorphous In-Ga-Zn-Oxide TFT," SID Digest '09: SID International Symposium Digest of Technical Papers, May 31, 2009, pp. 1110-1112.

Osada et al., "Development of Driver-Integrated Panel using Amorphous In-Ga-Zn-Oxide TFT," AM-FPD '09 Digest of Technical Papers, Jul. 1, 2009, pp. 33-36.

Godo et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Ohara et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Sakata et al., "Development of 4.0-In. AMOLED Display with Driver Circuit Using Amorphous In-Ga-Zn-Oxide TFTs," IDW '09: Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

International Search Report (Application No. PCT/JP2010/061218) Dated Aug. 17, 2010.

Written Opinion (Application No. PCT/JP2010/061218) Dated Aug. 17, 2010.

* cited by examiner

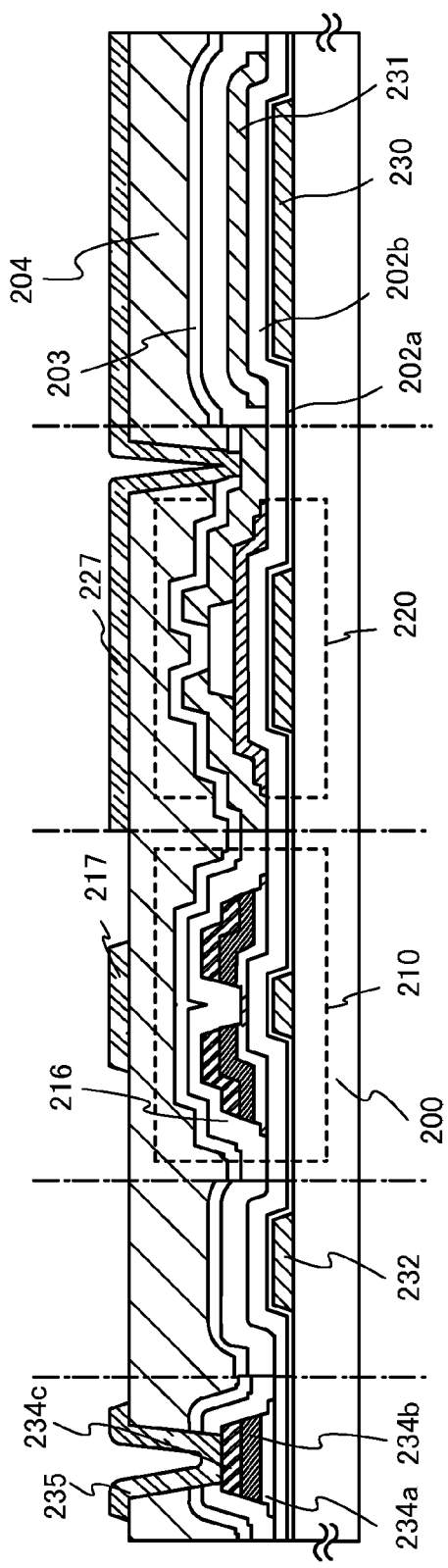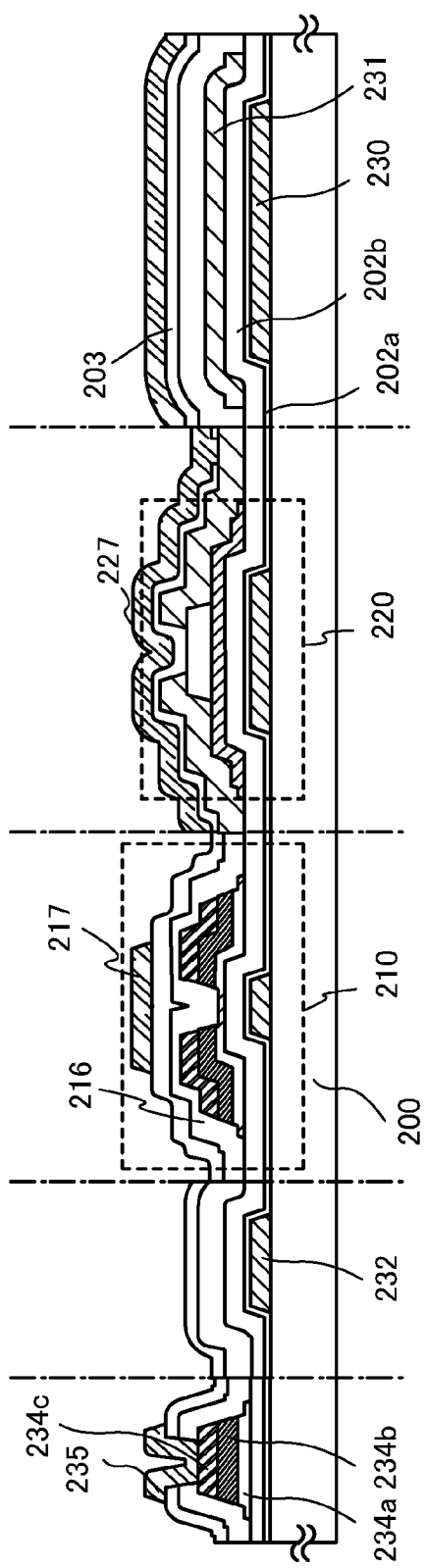

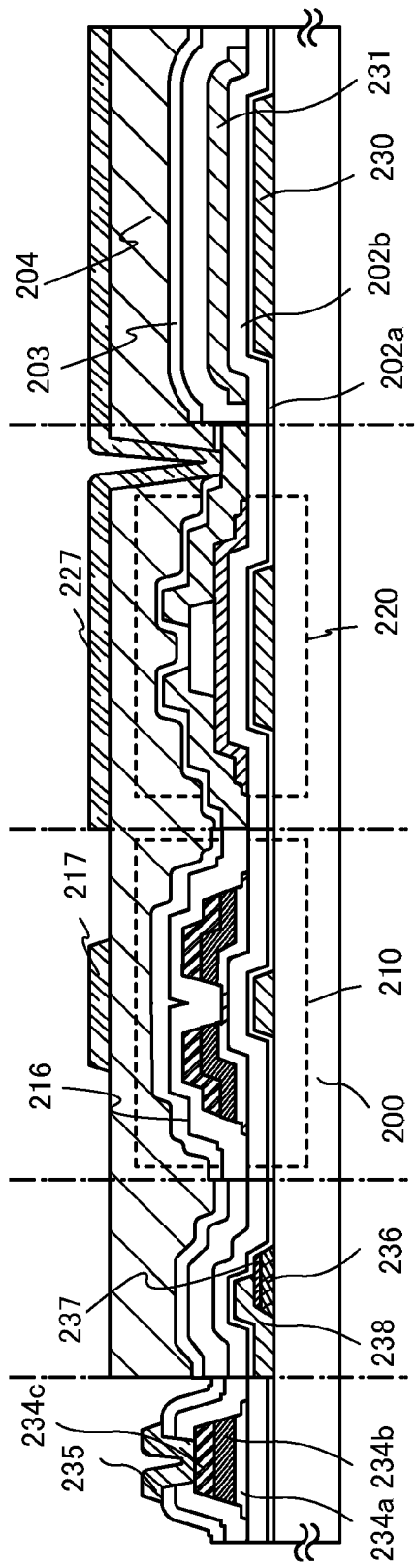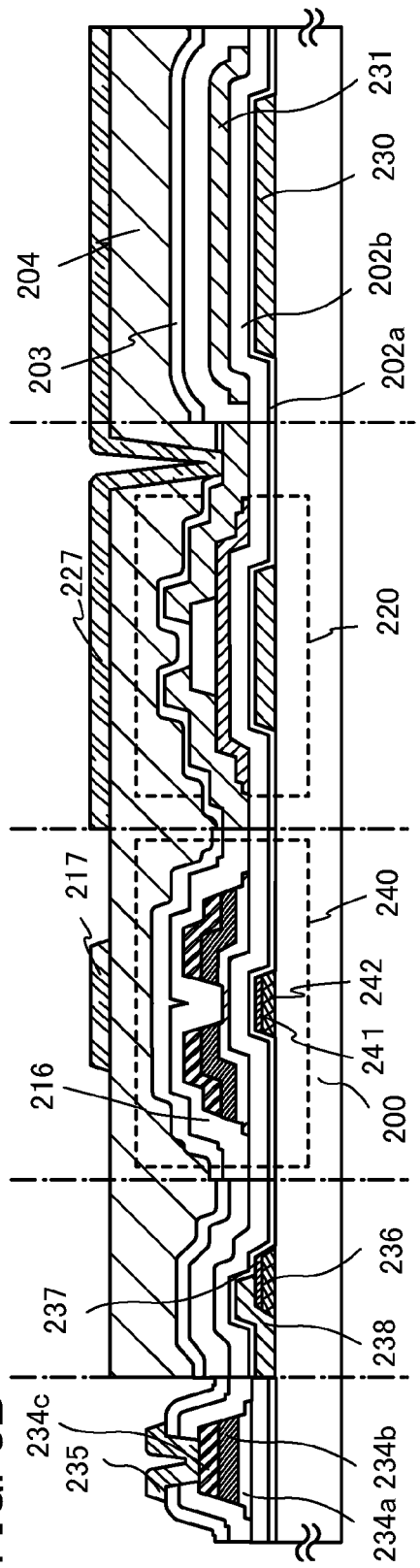

SEMICONDUCTOR DEVICE AND MANUFACTURING METHOD THEREOF

TECHNICAL FIELD

The present invention relates to a semiconductor device including an oxide semiconductor and a manufacturing method thereof.

Note that a semiconductor device in this specification refers to a general device which can function by utilizing semiconductor characteristics. Electrooptic devices such as display devices, semiconductor circuits, and electronic devices are all semiconductor devices.

BACKGROUND ART

Light-transmitting metal oxides have been used in semiconductor devices. For example, conductive metal oxides (hereinafter referred to as oxide conductors) such as indium tin oxide (ITO) have been used as transparent electrode materials needed in display devices such as liquid crystal displays.

In addition, light-transmitting metal oxides have attracted attention as materials having semiconductor characteristics. For example, In—Ga—Zn—O-based oxides and the like have been expected to be used as semiconductor materials needed in display devices such as liquid crystal displays. In particular, they have been expected to be used for channel layers of thin film transistors (hereinafter also referred to as TFTs).

TFTs which include metal oxides having semiconductor properties (hereinafter referred to as oxide semiconductors) can be formed through low-temperature processes. Thus, expectations for oxide semiconductors as materials which replace or surpass amorphous silicon used in display devices and the like are increased.

Further, the use of oxide conductors and oxide semiconductors having light-transmitting properties allows the production of light-transmitting TFTs (for example, see Reference 1).

Furthermore, TFTs including oxide semiconductors as channel layers have high field effect mobility. Thus, driver circuits of display devices or the like can be formed using the TFTs (for example, see Reference 2).

REFERENCE

Reference 1: T. Nozawa, "Transparent Circuitry", *Nikkei Electronics*, No. 959, Aug. 27, 2007, pp. 39-52.
Reference 2: T. Osada et al., "Development of Driver-Integrated Panel using Amorphous In—Ga—Zn—Oxide TFT", *Proc. SID'09 Digest,* 2009, pp. 184-187.

DISCLOSURE OF INVENTION

It is an object of one embodiment of the present invention to reduce the manufacturing cost of a semiconductor device.

It is an object of one embodiment of the present invention to improve the aperture ratio of a semiconductor device.

It is an object of one embodiment of the present invention to increase the resolution of an image displayed on a display portion of a semiconductor device.

It is an object of one embodiment of the present invention to provide a semiconductor device which can be driven at high speed.

One embodiment of the present invention is a semiconductor device including a driver circuit portion and a display portion (also referred to as a pixel portion) over one substrate. The driver circuit portion includes a driver circuit thin film transistor and a driver circuit wiring. A source electrode (also referred to as a source electrode layer) and a drain electrode (also referred to as a drain electrode layer) of the driver circuit thin film transistor are formed using a metal, and a semiconductor layer of the driver circuit thin film transistor is formed using an oxide semiconductor. The driver circuit wiring is formed using a metal. The display portion includes a pixel thin film transistor and a display portion wiring. A source electrode layer and a drain electrode layer of the pixel thin film transistor are formed using an oxide conductor, and a semiconductor layer of the pixel thin film transistor is formed using an oxide semiconductor. The display portion wiring is formed using an oxide conductor.

An inverted-staggered thin film transistor having a bottom-gate structure is used as each of the pixel thin film transistor and the driver circuit thin film transistor. The pixel thin film transistor is a channel protective (channel-stop) thin film transistor where a channel protective layer is provided over a channel formation region of a semiconductor layer. In contrast, the driver circuit thin film transistor is a channel-etched thin film transistor where an oxide insulating film is provided in contact with a region of a semiconductor layer which is positioned between a source electrode layer and a drain electrode layer.

Note that a specific manufacturing process of a TFT, a specific structure of a different element (e.g., a capacitor) included in a semiconductor device, and the like are not disclosed in Reference 1. In addition, it is also not disclosed that a driver circuit and a light-transmitting TFT are formed over one substrate.

In a semiconductor device of one embodiment of the present invention, a driver circuit portion including a driver circuit TFT and a display portion including a pixel TFT are formed over one substrate. Thus, the manufacturing cost of the semiconductor device can be reduced.

In a semiconductor device of one embodiment of the present invention, a display portion includes a pixel TFT and a display portion wiring. A source electrode and a drain electrode of the pixel TFT are formed using an oxide conductor. A semiconductor layer of the pixel TFT is formed using an oxide semiconductor. The display portion wiring is formed using an oxide conductor. That is, in the semiconductor device, a region where the pixel TFT and the display portion wiring are formed can be used as a display region in a pixel. Thus, the aperture ratio of the semiconductor device can be improved.

In a semiconductor device of one embodiment of the present invention, a display portion includes a pixel TFT and a display portion wiring. A source electrode and a drain electrode of the pixel TFT are formed using an oxide conductor, and a semiconductor layer of the pixel TFT is formed using an oxide semiconductor. The display portion wiring is formed using an oxide conductor. That is, the pixel size of the semiconductor device can be determined without limitation by the size of the pixel TFT. Thus, it is possible to increase the resolution of an image displayed on the display portion of the semiconductor device.

In a semiconductor device of one embodiment of the present invention, a driver circuit portion includes a driver circuit TFT and a driver circuit wiring. A source electrode and a drain electrode of the driver circuit TFT are formed using a metal, and a channel layer of the driver circuit TFT is formed using an oxide semiconductor. The driver circuit wiring is formed using a metal. That is, in the semiconductor device, a driver circuit includes a TFT having high field effect mobility and a wiring having low resistance. Thus, the semiconductor device can be driven at high speed.

As an oxide semiconductor used in this specification, a thin film of a material expressed by $InMO_3(ZnO)_m$ (m>0) is formed, and a thin film transistor including the thin film as an oxide semiconductor layer is formed. Note that M denotes one or more metal elements selected from Ga, Fe, Ni, Mn, or Co. For example, M may be Ga or may be Ga and the above metal element other than Ga, e.g., M might be Ga and Ni or Ga and Fe. Further, in the oxide semiconductor, in some cases, a transitional metal element such as Fe or Ni or an oxide of the transitional metal is contained as an impurity element in addition to the metal element contained as M. In this specification, among oxide semiconductor layers whose composition formulae are expressed by $InMO_3(ZnO)_m$ (m>0), an oxide semiconductor which includes Ga as M is referred to as an In—Ga—Zn—O-based oxide semiconductor, and a thin film of the In—Ga—Zn—O-based oxide semiconductor is referred to as an In—Ga—Zn—O-based non-single-crystal film.

As a metal oxide used for the oxide semiconductor layer, any of the following metal oxides other than above can be used: an In—Sn—Zn—O-based metal oxide; an In—Al—Zn—O-based metal oxide; a Sn—Ga—Zn—O-based metal oxide; an Al—Ga—Zn—O-based metal oxide; a Sn—Al—Zn—O-based metal oxide; an In—Zn—O-based metal oxide; a Sn—Zn—O-based metal oxide; an Al—Zn—O-based metal oxide; an In—O-based metal oxide; a Sn—O-based metal oxide; and a Zn—O-based metal oxide. Silicon oxide may be contained in the oxide semiconductor layer formed using the above metal oxide. In the case where silicon oxide ($SiO_x$ (x>0)) which hinders crystallization is contained in the oxide semiconductor layer, crystallization of the oxide semiconductor layer can be suppressed when heat treatment is performed after the formation of the oxide semiconductor layer in the manufacturing process. Note that the oxide semiconductor layer is preferably amorphous and may be partly crystallized.

The oxide semiconductor is preferably an oxide semiconductor containing In, more preferably an oxide semiconductor containing In and Ga. In order to make an oxide semiconductor layer i-type (intrinsic), dehydration or dehydrogenation are effective.

It is preferred first to change the oxide semiconductor layer into an oxygen-deficient oxide semiconductor layer by the heat treatment of the oxide semiconductor layer in the atmosphere of an inert gas such as nitrogen or a rare gas (e.g., argon or helium) or under reduced pressure so that the oxide semiconductor layer becomes a low-resistant oxide semiconductor layer (i.e., an n-type (e.g., $n^-$-type) oxide semiconductor layer) and then to make the oxide semiconductor layer to be in an oxygen excess state by the formation of an oxide insulating film which is in contact with the oxide semiconductor layer. Thus, the oxide semiconductor layer is changed into a high-resistant oxide semiconductor layer; that is, the oxide semiconductor layer is made to be i-type. Accordingly, it is possible to form and provide a semiconductor device including a highly reliable thin film transistor having favorable electrical characteristics.

As heat treatment for dehydration or dehydrogenation, for example, heat treatment is performed at a temperature which is higher than or equal to 350° C., preferably higher than or equal to 400° C., and lower than the strain point of a substrate in an atmosphere of an inert gas such as nitrogen or a rare gas (e.g., argon or helium) or under reduced pressure. The oxide semiconductor layer is dehydrated or dehydrogenated by this heat treatment, so that impurity including a hydrogen such as moisture contained in the oxide semiconductor layer is reduced.

The condition of heat treatment for dehydration or dehydrogenation performed on the oxide semiconductor layer subjected to dehydration or dehydrogenation is preferably set such that two peaks of water or at least one peak of water at around 300° C. is not detected even if thermal desorption spectroscopy (TDS) is performed on the oxide semiconductor layer subjected to dehydration or dehydrogenation at a temperature up to 450° C. Thus, even if TDS is performed on a thin film transistor using an oxide semiconductor layer subjected to dehydration or dehydrogenation at a temperature up to 450° C., at least the peak of water at around 300° C. is not detected.

Cooling after the heating treatment is carried out so that the oxide semiconductor layer does not contact with water and hydrogen, which is achieved by performing the cooling in a furnace used for heat treatment for dehydration or dehydrogenation without exposure of the oxide semiconductor layer to the air. When a thin film transistor is formed using an oxide semiconductor layer obtained by changing an oxide semiconductor layer into a low-resistance oxide semiconductor layer, i.e., an n-type (e.g., $N^-$-type) oxide semiconductor layer by heat treatment for dehydration or dehydrogenation and by changing the low-resistance oxide semiconductor layer into a high-resistance oxide semiconductor layer so that the oxide semiconductor layer becomes an i-type oxide semiconductor layer, the threshold voltage of the thin film transistor can be positive voltage, so that a so-called normally-off switching element can be realized. It is preferable for a display device that a channel be formed with positive threshold voltage that is as close to 0 V as possible in a thin film transistor. Note that if the threshold voltage of the thin film transistor is negative, the thin film transistor tends to be normally on; in other words, current flows between a source electrode and a drain electrode even when gate voltage is 0 V. In an active matrix display device, the electrical characteristics of a thin film transistor included in a circuit are important and influence the performance of the display device. Among the electrical characteristics of the thin film transistor, the threshold voltage ($V_{th}$) is particularly important. When the threshold voltage is high or negative even if field effect mobility is high, it is difficult to control the circuit. In the case where a thin film transistor has high threshold voltage and a large absolute value of its threshold voltage, the thin film transistor cannot perform a switching function as the TFT and might be a load when the TFT is driven at low voltage. In the case of an n-channel thin film transistor, it is preferable that a channel be formed and drain current flows after positive voltage is applied as gate voltage. A transistor in which a channel is not formed unless driving voltage is raised and a transistor in which a channel is formed and drain current flows even when negative voltage is applied are unsuitable for a thin film transistor used in a circuit.

Cooling after the heating treatment may be carried out after switching the gas used in heating may be switched to a different gas. For example, cooling may be performed in the furnace where heat treatment for dehydration or dehydrogenation are performed while the furnace is filled with a high-purity oxygen gas, a high-purity $N_2O$ gas, or ultra-dry air (having a dew point of −40° C. or lower, preferably −60° C. or lower) without exposure to the air.

By using an oxide semiconductor film cooled slowly (or cooled) in an atmosphere which does not contain moisture (having a dew point of −40° C. or lower, preferably −60° C. or lower) after an impurity including a hydrogen atom, such as moisture, which is contained in the film is reduced by heat treatment for dehydration or dehydrogenation, the electrical characteristics of a thin film transistor are improved and mass-produced high-performance thin film transistors are realized.

In this specification, heat treatment in an atmosphere of an inert gas such as nitrogen or a rare gas (e.g., argon or helium) or under reduced pressure is referred to as heat treatment for dehydration or dehydrogenation. In this specification, for convenience, dehydration or dehydrogenation refer not only to elimination of $H_2$ but also to elimination of H, OH, or the like.

In the case where heat treatment is performed in an atmosphere of an inert gas such as nitrogen or a rare gas (e.g., argon or helium) or under reduced pressure, an oxide semiconductor layer is changed into an oxygen-deficient oxide semiconductor layer by the heat treatment. Thus, the resistance of the oxide semiconductor layer is reduced; that is, the oxide semiconductor layer is made to be n-type (n$^-$-type). As a result, a high-resistance drain region (also referred to as an HRD region) which is oxygen-deficient is formed in a region overlapping with a drain electrode layer.

Specifically, the carrier concentration of the high-resistance drain region is higher than or equal to $1 \times 10^{17}/cm^3$ and is at least higher than the carrier concentration of a channel formation region (lower than $1 \times 10^{17}/cm^3$). Note that the carrier concentration in this specification is obtained by Hall effect measurement at room temperature.

Further, a low-resistance drain region (also referred to as an LRN region) may be formed between the oxide semiconductor layer and the drain electrode layer formed using a metal material. Specifically, the carrier concentration of the low-resistance drain region is higher than that of the high-resistance drain region (HRD region) and is, for example, within the range of $1 \times 10^{20}/cm^3$ to $1 \times 10^{21}/cm^3$.

Then, a channel formation region is formed by bringing at least part of the oxide semiconductor layer subjected to heat treatment for dehydration or dehydrogenation into an oxygen-excess state so as to have high resistance, i.e., be made to be i-type. Note that as the treatment for bringing part of the oxide semiconductor layer subjected to heat treatment for dehydration or dehydrogenation into an oxygen-excess state, formation of an oxide insulating film which is in contact with the oxide semiconductor layer subjected to heat treatment for dehydration or dehydrogenation with sputtering, heat treatment after the formation of the oxide insulating film in contact with the oxide semiconductor layer subjected to heat treatment for dehydration or dehydrogenation, heat treatment in an atmosphere containing oxygen to the oxide semiconductor layer subjected to heat treatment for dehydration or dehydrogenation, cooling treatment in an oxygen atmosphere after heat treatment in an inert gas atmosphere to the oxide semiconductor layer subjected to heat treatment for dehydration or dehydrogenation, cooling treatment in ultra-dry air (having a dew point of −40° C. or lower, preferably −60° C. or lower) after heat treatment in an inert gas atmosphere to the oxide semiconductor layer subjected to heat treatment for dehydration or dehydrogenation, or the like can be given.

Further, in order that at least part of the oxide semiconductor layer subjected to heat treatment for dehydration or dehydrogenation (a portion overlapping with a gate electrode (also referred to as a gate electrode layer)) may be the channel formation region, the oxide semiconductor layer is selectively brought into an oxygen-excess state so that at least part of the oxide semiconductor layer can have higher resistance, i.e., can be made to be i-type. The channel formation region can be formed in such a manner that a source electrode layer and a drain electrode layer including metal electrodes of Ti or the like are formed on and in contact with the oxide semiconductor layer subjected to heat treatment for dehydration or dehydrogenation and a region which does not overlap with the source electrode layer and the drain electrode layer is selectively brought into an oxygen-excess state. In the case where the region is selectively brought into an oxygen-excess state, a first high-resistance drain region overlapping with the source electrode layer and a second high-resistance drain region overlapping with the drain electrode layer are formed, and the channel formation region is formed between the first high-resistance drain region and the second high-resistance drain region. That is, the channel formation region is formed between the source electrode layer and the drain electrode layer in a self-aligned manner.

Thus, it is possible to form and provide a semiconductor device including a highly reliable thin film transistor having favorable electrical characteristics.

Note that by forming the high-resistance drain region in the oxide semiconductor layer overlapping with the drain electrode layer (and the source electrode layer), reliability in the case where a driver circuit is formed can be improved. Specifically, by forming the high-resistance drain region, the structure can be obtained in which conductivities of the drain electrode layer, the high-resistance drain region, and the channel formation region vary. Therefore, in the case where operation is performed with the drain electrode layer connected to a wiring for supplying a high power supply potential VDD, the high-resistance drain region serves as a buffer and a high electric field is not applied locally even if the high electric field is applied between the gate electrode layer and the drain electrode layer; thus, withstand voltage of the transistor can be increased.

The low-resistance drain region (also referred to as the LRN region) may be formed between the drain electrode layer (and the source electrode layer) formed using a metal material and the oxide semiconductor layer. Formation of the low-resistance drain region can increase withstand voltage of a transistor.

In addition, by forming the high-resistance drain region in part of the oxide semiconductor layer, which overlaps with the drain electrode layer (and the source electrode layer), the amount of leakage current in the channel formation region when the driver circuit is formed can be reduced. Specifically, by forming the high-resistance drain region, the leakage current of the transistor, which flows between the drain electrode layer and the source electrode layer, flows sequentially from the drain electrode layer, the high-resistance drain region on the drain electrode layer side, the channel formation region, the high-resistance drain region on the source electrode layer side, and the source electrode layer. In this case, in the channel formation region, leakage current flowing from the high-resistance drain region on the drain electrode layer side to the channel formation region can be concentrated on the vicinity of an interface between the channel formation region and a gate insulating layer which has high resistance when the transistor is off. Thus, the amount of leakage current in a back channel portion (part of a surface of the channel formation region, which is apart from the gate electrode layer) can be reduced.

Further, the first high-resistance drain region overlapping with the source electrode layer and the second high-resistance drain region overlapping with the drain electrode layer may overlap with part of the gate electrode layer with the gate insulating layer interposed therebetween, and then the intensity of an electric field near an end portion of the drain electrode layer can be reduced more effectively.

When the low-resistance drain region is provided between the source and drain electrode layers and the oxide semiconductor layer, thermally stable operation can be performed as compared with a Schottky junction. For the low-resistance drain region, an oxide conductive layer which has lower resistance than the oxide semiconductor layer and higher resistance than the source and drain electrode layers; therefore, contact resistance between the oxide semiconductor layer and the source and drain electrode layers can be reduced.

One embodiment of a structure of the invention disclosed in this specification is a semiconductor device including a pixel portion including a first thin film transistor and a driver circuit including a second thin film transistor over one substrate. The first thin film transistor includes a gate electrode layer over the substrate, a gate insulating layer over the gate electrode layer, an oxide semiconductor layer having an end region with a small thickness over the gate insulating layer, an oxide insulating layer in contact with part of the oxide semiconductor layer, a source electrode layer and a drain electrode layer over the oxide insulating layer and the oxide semiconductor layer, and a pixel electrode layer electrically connected to the source electrode layer or the drain electrode layer. The gate electrode layer, the gate insulating layer, the oxide semiconductor layer, the source electrode layer, the drain electrode layer, the oxide insulating layer, and the pixel electrode layer of the first thin film transistor each have a light-transmitting property. A source electrode layer and a drain electrode layer of the second thin film transistor are covered with a protective insulating layer. The material of the source electrode layer and the drain electrode layer of the second thin film transistor is different from the material of the source electrode layer and the drain electrode layer of the first thin film transistor and has lower resistance than the material of the source electrode layer and the drain electrode layer of the first thin film transistor.

In the above semiconductor device, low-resistance drain regions formed using the same material as the source and drain electrode layers of the first thin film transistor may be provided between the oxide semiconductor layer and the source and drain electrode layers of the second thin film transistor.

In the above semiconductor device, low-resistance drain regions may be provided between the oxide semiconductor layer and the source and drain electrode layers of the second thin film transistor, and end portions of the oxide semiconductor layer may be on the outer side than end faces of the low-resistance drain region and may have a thickness equal to the thickness of a channel formation region of the second thin film transistor.

In the above semiconductor device, at least one of the oxide semiconductor layers of the first and second thin film transistors may have a high-resistance drain region which has lower resistance than the channel formation region, in a portion overlapping with the source or drain electrode layer.

In the above semiconductor device, the source electrode layer and the drain electrode layer of the second thin film transistor are preferably formed using a film containing an element selected from Al, Cr, Cu, Ta, Ti, Mo, or W as a main component or a stack of any of the above elements.

In the above semiconductor device, the source electrode layer, the drain electrode layer, and the pixel electrode layer of the first thin film transistor are preferably formed using indium oxide, an alloy of indium oxide and tin oxide, an alloy of indium oxide and zinc oxide, or zinc oxide.

In the above semiconductor device, a capacitor portion may be further provided over the same substrate, the capacitor portion may have a capacitor wiring and a capacitor electrode overlapping with the capacitor wiring, and the capacitor wiring and the capacitor electrode may each have a light-transmitting property.

In the above semiconductor device, the oxide semiconductor layer of the second thin film transistor includes a channel formation region having a smaller thickness than a region overlapping with the source or drain electrode layer, and a conductive layer may be provided over the channel formation region with the protective insulating layer interposed therebetween.

One embodiment of a structure of the invention disclosed in this specification is a method for manufacturing a semiconductor device including the steps of forming a first gate electrode layer and a second gate electrode layer over one substrate; forming a gate insulating layer over the first gate electrode layer and the second gate electrode layer; forming an oxide semiconductor layer over the gate insulating layer; performing a heat treatment for dehydration or dehydrogenation on the oxide semiconductor film; forming first and second oxide semiconductor layers, first and second low-resistance drain regions over the second oxide semiconductor layer without exposure to the air in order to prevent the oxide semiconductor film from being brought into contact with water and hydrogen; forming second source and drain electrode layers over the first and second low-resistance drain regions, respectively; forming a second oxide insulating layer which is in contact with part of the second oxide semiconductor layer and upper surfaces and side surfaces of the second source electrode layer and the second drain electrode layer and a first oxide insulating layer over a region of the first oxide semiconductor layer, which overlaps with the first gate electrode layer; forming a first source electrode layer and a first drain electrode layer over the first oxide semiconductor layer and the first oxide insulating layer; forming a protective insulating layer over the first oxide insulating layer, the first source electrode layer, the first drain electrode layer, and the second oxide insulating layer; and forming a pixel electrode layer which is electrically connected to the first drain electrode layer or the first source electrode layer and a conductive layer which overlaps with the second oxide semiconductor layer over the protective insulating layer.

In the above structure, the oxide semiconductor layer of a second thin film transistor may include a region having a smaller thickness than a region overlapping with the source or drain electrode layer. Further, the oxide semiconductor layer of the second thin film transistor may include a channel formation region having a smaller thickness than a region overlapping with the source or drain electrode layer, and a conductive layer may be provided over the channel formation region with the second oxide insulating layer interposed therebetween.

Since the first oxide insulating layer and the second oxide insulating layer can be formed in the same step, one light-transmitting insulating material can be used.

Note that ordinal numbers such as "first" and "second" in this specification are used for convenience and do not denote the order of steps and the stacking order of layers. In addition, the ordinal numbers in this specification do not denote particular names which specify the present invention.

Further, as a display device including a driver circuit, there are a light-emitting display device including a light-emitting element and a display device including an electrophoretic display element, which is also referred to as electronic paper, in addition to a liquid crystal display device.

In a light-emitting display device including a light-emitting element, a plurality of thin film transistors are included in a pixel portion. The pixel portion includes a region where a gate electrode of a thin film transistor is connected to a source wiring (also referred to as a source wiring layer) or a drain wiring (also referred to as a drain wiring layer) of another transistor. In addition, a driver circuit of the light-emitting display device including a light-emitting element includes a region where a gate electrode of a thin film transistor is connected to a source wiring or a drain wiring of the thin film transistor.

With one embodiment of the present invention, a thin film transistor having stable electric characteristics can be formed and provided. Therefore, a semiconductor device which includes a highly reliable thin film transistor having favorable electric characteristics can be provided.

BRIEF DESCRIPTION OF DRAWINGS

FIGS. 7A and 7B each illustrate a semiconductor device.
FIGS. 8A and 8B each illustrate a semiconductor device.
FIGS. 10A-1, 10A-2, and 10B each illustrate a semiconductor device.

BEST MODE FOR CARRYING OUT THE INVENTION

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. In addition, the present invention is not construed as being limited to description of the embodiments below.

Embodiment 1

A semiconductor device and a method for manufacturing a semiconductor device are described with reference to FIGS. 1A-1, 1A-2, 1B, and 1C, FIGS. 2A to 2E, and FIGS. 3A to 3E. FIGS. 1B and 1C illustrate examples of cross-sectional structures of two thin film transistors having different structures formed over one substrate. In FIGS. 1A-1, 1A-2, 1B, and 1C, a thin film transistor 460 is a channel-etched thin film transistor which is one of bottom-gate thin film transistors, and a thin film transistor 470 is a channel protective thin film transistor (also referred to as a channel-stop thin film transistor) which is one of bottom-gate thin film transistors. The thin film transistor 460 and the thin film transistor 470 are also referred to as inverted staggered thin film transistors.

Figures 1, 1A:
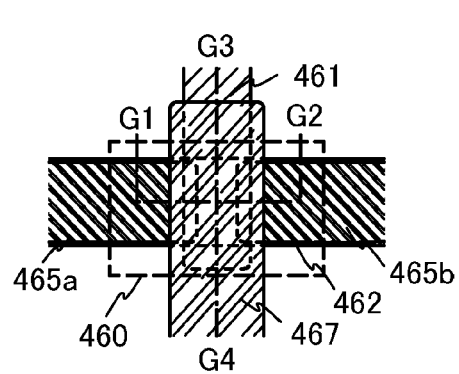
FIGS. 1A-1, 1A-2, 1B, and 1C illustrate a semiconductor device.
Figures 1, 1A, 2:
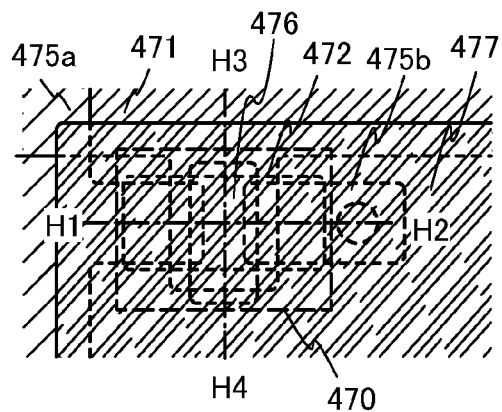
Figure 1B:
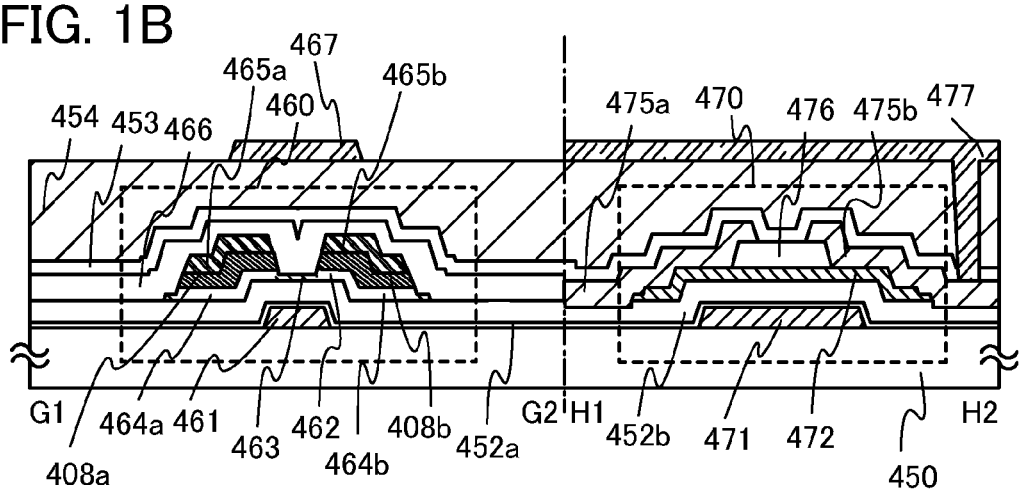
Figure 1C:
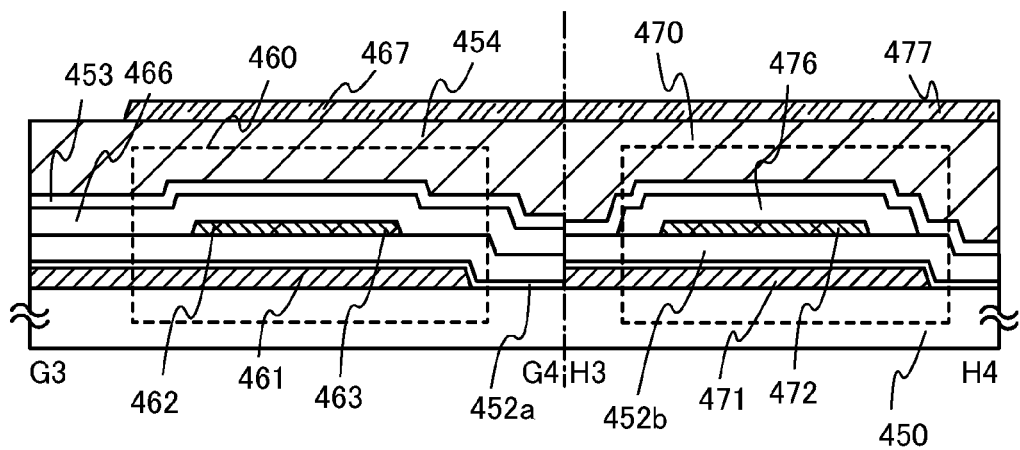

FIG. 1A-1 is a plan view of the thin film transistor 460 provided in a driver circuit. FIG. 1A-2 is a plan view of the thin film transistor 470 provided in a pixel portion. Further, FIG. 1B is a cross-sectional view taken along G1-G2 in FIG. 1A-1 and H1-H2 in FIG. 1A-2. Further, FIG. 1C is a cross-sectional view taken along G3-G4 in FIG. 1A-1 and H3-H4 in FIG. 1A-2.

The thin film transistor 460 provided in the driver circuit is a channel-etched thin film transistor and includes, over a substrate 450 having an insulating surface, a gate electrode layer 461, a first gate insulating layer 452a, a second gate insulating layer 452b, an oxide semiconductor layer 462 including at least a channel formation region 463, a first high-resistance drain region 464a, and a second high-resistance drain region 464b, a first low-resistance drain region 408a, a second low-resistance drain region 408b, a source electrode layer 465a, and a drain electrode layer 465b. In addition, an oxide insulating layer 466 is provided so as to cover the thin film transistor 460 and be in contact with the channel formation region 463.

The first high-resistance drain region 464a is formed in a self-aligned manner in contact with a bottom surface of the first low-resistance drain region 408a. Further, the second high-resistance drain region 464b is formed in a self-aligned manner in contact with a bottom surface of the second low-resistance drain region 408b. The channel formation region 463 is in contact with the oxide insulating layer 466, has a smaller thickness than the first high-resistance drain region 464a and the second high-resistance drain region 464b, and is a region (i-type region) having higher resistance than the first high-resistance drain region 464a and the second high-resistance drain region 464b.

In addition, in order to reduce the resistance of a wiring of the thin film transistor 460, a metal material is preferably used for the source electrode layer 465a and the drain electrode layer 465b.

In addition, when a pixel portion and a driver circuit are formed over one substrate in a liquid crystal display device, in the driver circuit, only one of voltage of positive polarity or voltage of negative polarity is applied between the source and drain electrodes of a thin film transistor for constituting a logic gate such as an inverter circuit, a NAND circuit, a NOR circuit, or a latch circuit or a thin film transistor for constituting an analog circuit such as a sense amplifier, a constant voltage generating circuit, or a voltage controlled oscillator (VCO). Therefore, the width of the second high-resistance drain region 464b required to withstand voltage may be larger than the width of the first high-resistance drain region 464a. The width of portions of the first high-resistance drain region 464a and the second high-resistance drain region 464b which overlap with the gate electrode layer 461 may be increased.

Although description is given using a single-gate thin film transistor as the thin film transistor 460 provided in the driver circuit, a multi-gate thin film transistor including a plurality of channel formation regions may be formed as needed.

A conductive layer 467 is provided so as to overlap with the channel formation region 463. The conductive layer 467 and the gate electrode layer 461 are electrically connected to each other and at the same potential, whereby gate voltage can be applied to the oxide semiconductor layer 462 provided between the gate electrode layer 461 and the conductive layer 467 from above and below. In the case where the gate electrode layer 461 and the conductive layer 467 are at different potentials, for example, a fixed potential, GND, and 0V, electric characteristics of a TFT, such as threshold voltage, can be controlled. That is, the gate electrode layer 461 and the conductive layer 467 are made to function as a first gate electrode layer and a second gate electrode layer, respectively, whereby the thin film transistor 460 can be used as a thin film transistor having four terminals.

A protective insulating layer 453 and a planarization insulating layer 454 are provided to be stacked between the conductive layer 467 and the oxide insulating layer 466.

Further, the protective insulating layer 453 is preferably in contact with the first gate insulating layer 452a provided below the protective insulating layer 453 or an insulating film serving as a base and blocks entry of impurities such as moisture, a hydrogen ion, and OH⁻ from a side surface of the substrate. In particular, it is effective to use a silicon nitride film for the first gate insulating layer 452a or the insulating film serving as a base, which is in contact with the protective insulating layer 453.

The thin film transistor 470 provided in the pixel is a channel-stop thin film transistor and includes, over the substrate 450 having an insulating surface, a gate electrode layer 471, the first gate insulating layer 452a, the second gate insulating layer 452b, an oxide semiconductor layer 472 including a channel formation region, a source electrode layer 475a, and a drain electrode layer 475b. In addition, a stack of the protective insulating layer 453 and the planarization insulating layer 454 is provided in contact with the channel protective layer 476, the source electrode layer 475a, and the drain electrode layer 475b so as to cover the thin film transistor 470. A pixel electrode layer 477 in contact with the drain electrode layer 475b is provided over the planarization insulating layer 454 and electrically connected to the thin film transistor 470. Note that the source electrode layer 475a and the drain electrode layer 475b of the thin film transistor for the pixel are preferably formed using the same material as the first low-resistance drain region 408a and the second low-resistance drain region 408b of the thin film transistor 460 for the driver circuit.

It is to be noted that AC drive is performed in a liquid crystal display device in order to prevent deterioration of liquid crystal. Through the AC drive, the polarity of a signal potential applied to the pixel electrode layer is inverted to be negative or positive at regular intervals. In a TFT connected to the pixel electrode layer, a pair of electrodes function alternately as a source electrode layer and a drain electrode layer, respectively. In this specification, one of the electrodes of the thin film transistor in the pixel is referred to as a source electrode layer and the other is referred to as a drain electrode layer in convenience; however, in fact, one electrode functions as a source electrode layer and a drain electrode layer alternately in the AC drive. In order to reduce leakage current, the width of the gate electrode layer 471 of the thin film transistor 470 provided in the pixel may be smaller than the width of the gate electrode layer 461 of the thin film transistor 460 in the driver circuit. Further, in order to reduce leakage current, the gate electrode layer 471 of the thin film transistor 470 provided in the pixel may be designed so as not to overlap with the source electrode layer 475a or the drain electrode layer 475b.

Although description is given using a single-gate thin film transistor as the thin film transistor 470 provided in the pixel, a multi-gate thin film transistor including a plurality of channel formation regions may be formed as needed.

After formation of an oxide semiconductor film, heat treatment for reducing moisture which is an impurity (heat treatment for dehydration or dehydrogenation) is performed. After heat treatment for dehydration or dehydrogenation and slow cooling, an oxide insulating film is formed in contact with the oxide semiconductor layer, for example, to reduce carrier concentration of the oxide semiconductor layer, which leads to improvement in electric characteristics and reliability of the thin film transistor 470.

The oxide semiconductor layer 472 is formed below the source electrode layer 475a and the drain electrode layer 475b and overlaps with the source electrode layer 475a and the drain electrode layer 475b. Further, the oxide semiconductor layer 472 overlaps with the gate electrode layer 471 with the first gate insulating layer 452a and the second gate insulating layer 452b interposed therebetween. The channel formation region of the thin film transistor 470 provided in the pixel is a region of the oxide semiconductor layer 472, which is between a side surface of the source electrode layer 475a and a side surface of the drain electrode layer 475b, which faces the side surface of the source electrode layer 475a, that is, a region which is in contact with the second gate insulating layer 452b and overlaps with the gate electrode layer 471.

In order to realize a display device having a high aperture ratio using a light-transmitting thin film transistor as the thin film transistor 470, the source electrode layer 475a and the drain electrode layer 475b are formed using a light-transmitting conductive film.

Further, the gate electrode layer 471 of the thin film transistor 470 is also formed using a light-transmitting conductive film.

In the pixel provided with the thin film transistor 470, a conductive film which transmits visible light is used for the pixel electrode layer 477, another electrode layer (such as a capacitor electrode), or a wiring layer (such as a capacitor wiring layer), whereby a display device having a high aperture ratio is realized. It is needless to say that the first gate insulating layer 452a, the second gate insulating layer 452b, and the channel protective layer 476 are also preferably formed using a film which transmits visible light.

In this specification, a light-transmitting film refers to a film with a visible light transmittance of 75% to 100% and in the case where the film has a conductive property, it is also referred to as a transparent conductive film. Further, a conductive film which is semi-transparent to visible light may be used for a metal oxide used for the gate electrode layer, the source electrode layer, the drain electrode layer, the pixel electrode layer, any other electrode layer, or a wiring layer. Being semi-transparent to visible light means that a transmittance of visible light is 50% to 75%.

A process of forming the thin film transistor 460 and the thin film transistor 470 over one substrate will be described with reference to FIGS. 2A to 2E and 3A to 3E.

First, a light-transmitting conductive film is formed over the substrate 450 having an insulating surface, and then, the gate electrode layers 461 and 471 are formed through a first photolithography process. In addition, a capacitor wiring is formed in the pixel portion with the same material and through the same first photolithography process as the gate electrode layers 461 and 471. When a capacitor is needed not only in the pixel portion but also in the driver circuit, a capacitor wiring (also referred to as a capacitor wiring layer) is also formed in the driver circuit. Note that a resist mask may be formed with an ink-jet method. When the resist mask is formed with an ink-jet method, a photomask is not used; therefore, manufacturing costs can be reduced.

Although there is no particular limitation on a glass substrate which can be used for the substrate 450 having an insulating surface, it is necessary that the glass substrate have at least heat resistance enough to heat treatment to be performed later. As the substrate 450 having an insulating surface, a glass substrate formed of barium borosilicate glass, alumino-borosilicate glass, or the like can be used.

When a glass substrate is used as the substrate 450, if the temperature of the heat treatment performed later is high, the one having the strain point of 730° C. or higher is preferably used. Further, in the case where a glass substrate is used as the glass substrate 450, for example, a glass material such as aluminosilicate glass, aluminoborosilicate glass, or barium borosilicate glass is used. Note that by containing barium oxide (BaO) and boric acid so that the amount of barium oxide is larger than that of boric acid, a glass substrate is heat-resistant and of more practical use. Therefore, a glass substrate containing BaO and $B_2O_3$ so that the amount of BaO is larger than that of $B_2O_3$ is preferably used.

Note that a substrate formed of an insulator such as a ceramic substrate, a quartz substrate, or a sapphire substrate may be used instead of the above glass substrate, as the substrate 450. Alternatively, crystallized glass or the like may be used.

An insulating film serving as a base film may be provided between the substrate 450 and the gate electrode layers 461 and 471. The base film has a function of preventing diffusion of an impurity element from the substrate 450, and can be formed with a single layer or a stack using one or more of a silicon nitride film, a silicon oxide film, a silicon nitride oxide film, and a silicon oxynitride film.

As a material of the gate electrode layers 461 and 471, any of the following conductive materials which transmit visible light can be used: for example, an In—Sn—Zn—O-based metal oxide, an In—Al—Zn—O-based metal oxide, a Sn—Ga—Zn—O-based metal oxide, an Al—Ga—Zn—O-based metal oxide, a Sn—Al—Zn—O-based metal oxide, an In—Zn—O-based metal oxide, a Sn—Zn—O-based metal oxide, an Al—Zn—O-based metal oxide, an In—O-based metal oxide, a Sn—O-based metal oxide, or a Zn—O-based metal oxide. The thickness of the gate electrode layers 461 and 471 is set as appropriate to be from 50 nm to 300 nm. As a deposition method of the metal oxide used for the gate electrode layers 461 and 471, a sputtering method, a vacuum evaporation method (such as an electron beam evaporation method), an arc discharge ion plating method, or a spray method is used. When a sputtering method is used, it is preferable that a target containing $SiO_2$ at from 2 wt % to 10 wt % is used for deposition and the light-transmitting conductive film is made to contain $SiO_x$ (x>0) which suppresses crystallization, so that crystallization in heat treatment for dehydration or dehydrogenation performed in a later step is suppressed.

Next, a gate insulating layer is formed over the gate electrode layers 461 and 471.

The gate insulating layer can be formed with a single layer or a stack using any of a silicon oxide layer, a silicon nitride layer, a silicon oxynitride layer, and a silicon nitride oxide layer with a plasma CVD method or a sputtering method. For example, a silicon oxynitride layer may be formed using $SiH_4$, oxygen, and nitrogen as a deposition gas with a plasma CVD method.

In this embodiment, the first gate insulating layer 452a having a thickness of from 50 nm to 200 nm and the second gate insulating layer 452b having a thickness of from 50 nm to 300 nm are stacked to form the gate insulating layer. A silicon nitride film or a silicon nitride oxide film having a thickness of 100 nm is used as the first gate insulating layer 452a. A silicon oxide film having a thickness of 100 nm is used as the second gate insulating layer 452b.

Figure 2A:
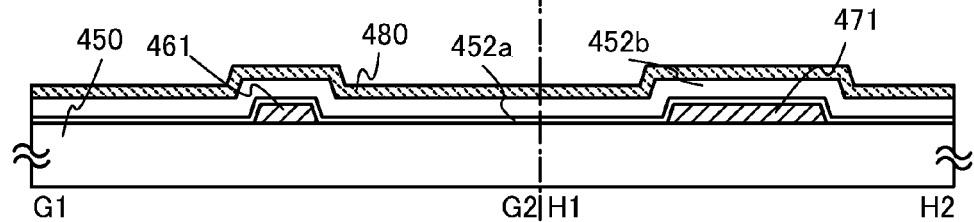
FIGS. 2A to 2E illustrate a method for manufacturing a semiconductor device.

Next, an oxide semiconductor film 480 is formed over the second gate insulating layer 452b to have a thickness of from 2 nm to 200 nm (FIG. 2A). In order that an oxide semiconductor layer may be amorphous even if heat treatment for dehydration or dehydrogenation is performed after formation of the oxide semiconductor film, the oxide semiconductor layer preferably has a small thickness of 50 nm or less. When the thickness of the oxide semiconductor layer is small, crystallization can be suppressed in the case where heat treatment is performed after the oxide semiconductor layer is formed.

Note that before the oxide semiconductor film is formed with a sputtering method, dust on a surface of the second gate insulating layer 452b is preferably removed by performing reverse sputtering in which an argon gas is introduced and plasma is generated. The reverse sputtering refers to a method in which, without application of voltage to a target side, an RF power source is used for application of voltage to a substrate side in an argon atmosphere so that plasma is generated around the substrate to modify a surface. Note that instead of an argon atmosphere, a nitrogen atmosphere, a helium atmosphere, an oxygen atmosphere, or the like may be used.

As the oxide semiconductor film, any of the following is used: a Sn—Ga—Zn—O-based oxide semiconductor film, an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Zn—O-based oxide semiconductor film, a Sn—Zn—O-based oxide semiconductor film, an Al—Zn—O-based oxide semiconductor film, an In—O-based oxide semiconductor film, a Sn—O-based oxide semiconductor film, and a Zn—O-based oxide semiconductor film. In this embodiment, the oxide semiconductor film is formed using an In—Ga—

Zn—O based oxide semiconductor target with a sputtering method. Alternatively, the oxide semiconductor film can be formed with a sputtering method in a rare gas (typically argon) atmosphere, an oxygen atmosphere, or an atmosphere containing a rare gas (typically argon) and oxygen. When a sputtering method is used, it is preferable that a target containing $SiO_2$ at from 2 wt % to 10 wt % is used for deposition and the oxide semiconductor film is made to contain $SiO_x$ (x>0) which suppresses crystallization, so that crystallization in heat treatment for dehydration or dehydrogenation performed in a later step is suppressed.

Figure 2B:
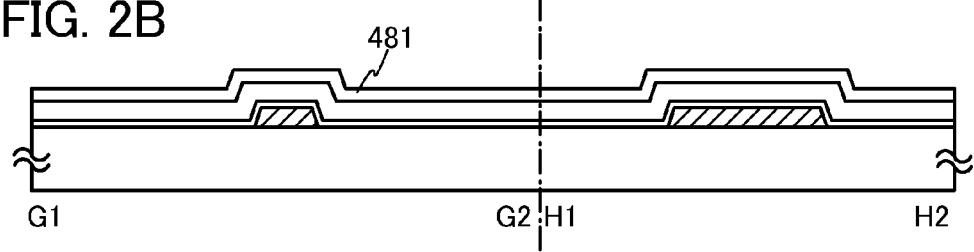

Next, the oxide semiconductor film 480 is subjected to dehydration or dehydrogenation. The temperature of the first heat treatment for dehydration or dehydrogenation is higher than or equal to 350° C. and lower than the strain point of the substrate, preferably higher than or equal to 400° C. and lower than the strain point of the substrate. Here, the substrate is introduced into an electric furnace which is one of heat treatment apparatuses, heat treatment is performed on the oxide semiconductor layer in a nitrogen atmosphere, and then, the oxide semiconductor film is cooled without exposure to the air so that entry of water and hydrogen into oxide semiconductor film is prevented. Thus, an oxide semiconductor layer 481 is obtained (FIG. 2B). In this embodiment, the same furnace is used from a heating temperature T for dehydration or dehydrogenation of the oxide semiconductor layer to a temperature low enough that water cannot enter the oxide semiconductor layer, and specifically, the oxide semiconductor layer is cooled in a nitrogen atmosphere to the temperature 100° C. or more lower than the heating temperature T. The atmosphere for the heat treatment for dehydration or dehydrogenation is not limited to a nitrogen atmosphere, and dehydration or dehydrogenation may be performed in a rare gas atmosphere such as a helium atmosphere, a neon atmosphere, or an argon atmosphere, or under a reduced pressure.

Note that in the first heat treatment, water, hydrogen, and the like are not preferably contained in nitrogen or a rare gas such as helium, neon, or argon. The purity of nitrogen or a rare gas such as helium, neon, or argon introduced into the heat treatment apparatus is preferably 6N (99.9999%) or more, more preferably 7N (99.99999%) or more (that is, the impurity concentration is 1 ppm or less, preferably 0.1 ppm or less).

Depending on the condition of the first heat treatment or the material of the oxide semiconductor film, the oxide semiconductor film may be crystallized to be a microcrystalline film or a polycrystalline film.

Note that the first heat treatment of the oxide semiconductor film 480 may be performed after the oxide semiconductor film is processed into an island-shaped oxide semiconductor layer.

Before the deposition of the oxide semiconductor film, heat treatment (higher than or equal to 400° C. and lower than the strain point of the substrate) may be performed in an inert gas atmosphere (such as a nitrogen atmosphere, a helium atmosphere, a neon atmosphere, or an argon atmosphere) or an oxygen atmosphere, or under a reduced pressure to remove impurities such as hydrogen and water contained in the gate insulating layer.

Next, an oxide conductive layer used for a low-resistance drain region and a conductive layer are formed over the oxide semiconductor layer 481.

As a deposition method of the oxide conductive layer, a sputtering method, a vacuum evaporation method (such as an electron beam evaporation method), an arc discharge ion plating method, or a spray method is used. As a material of the low-resistance drain region, for example, any of the following oxide conductive materials can be used: an In—Sn—Zn—O-based metal oxide, an In—Al—Zn—O-based metal oxide, a Sn—Ga—Zn—O-based metal oxide, an Al—Ga—Zn—O-based metal oxide, a Sn—Al—Zn—O-based metal oxide, an In—Zn—O-based metal oxide, a Sn—Zn—O-based metal oxide, an Al—Zn—O-based metal oxide, an In—O-based metal oxide, a Sn—O-based metal oxide, and a Zn—O-based metal oxide. Note that as an oxide conductive material used for the low-resistance drain region, a material having lower resistance than an oxide semiconductor layer 483 and higher resistance than the conductive layer 484 is selected as appropriate. When a sputtering method is used, it is preferable that a target containing $SiO_2$ at from 2 wt % to 10 wt % is used for deposition and the light-transmitting conductive film is made to contain $SiO_x$ (x>0) which suppresses crystallization, so that crystallization in heat treatment for dehydration or dehydrogenation performed in a later step is suppressed.

As the material of the conductive layer, there are an element selected from Al, Cr, Cu, Ta, Ti, Mo, and W, an alloy containing any of the above elements as a component, an alloy containing any of the above elements in combination, and the like.

As the conductive layer, a three-layer structure in which an aluminum layer is stacked over a titanium layer and a titanium layer is stacked over the aluminum layer, or a three-layer structure in which an aluminum layer is stacked over a molybdenum layer and a molybdenum layer is stacked over the aluminum layer is preferable. It is needless to say that the conductive layer may have a single-layer structure, a two-layer structure, or a layered structure of four or more layers.

After the oxide conductive layer and the conductive layer are formed, resist masks 482a and 482b used for a second photolithography process are formed. Note that the resist masks 482a and 482b may be formed with an ink-jet method. When the resist mask is formed with an ink-jet method, a photomask is not used; therefore, manufacturing costs can be reduced.

The resist mask 482a in this embodiment is a resist mask having a recessed portion or a projected portion. In other words, the resist mask 482a can be referred to as a resist mask having a plurality of regions (here, two regions) with different thicknesses. A region of the resist mask 482a, which has a larger thickness, is referred to as a projected portion of the resist mask 482a. A region of the resist mask 482a, which has a smaller thickness, is referred to as a recessed portion of the resist mask 482a.

In the resist mask 482a, the projected portion is formed in each of regions under which the source electrode layer and the drain electrode layer are formed later, and the recessed portion is formed in a region which is between the source electrode layer and the drain electrode layer and under which a channel formation region is formed later.

The resist mask 482a can be formed using a multi-tone mask. A multi-tone mask is a mask capable of light exposure with multi-level light quantity, typically, light exposure with three levels of light quantity to provide an exposed region, a half-exposed region, and an unexposed region. When the multi-tone mask is used, one-time light exposure and development process allows a resist mask with plural thicknesses (typically, two kinds of thicknesses) to be formed. Therefore, with the use of a multi-tone mask, the number of photomasks can be reduced.

By light exposure using the multi-tone mask and development, a resist mask 482a which includes regions having different thicknesses can be formed. It is to be noted that without limitation thereto, the resist mask 482a may be formed without a multi-tone mask.

Figure 2C:
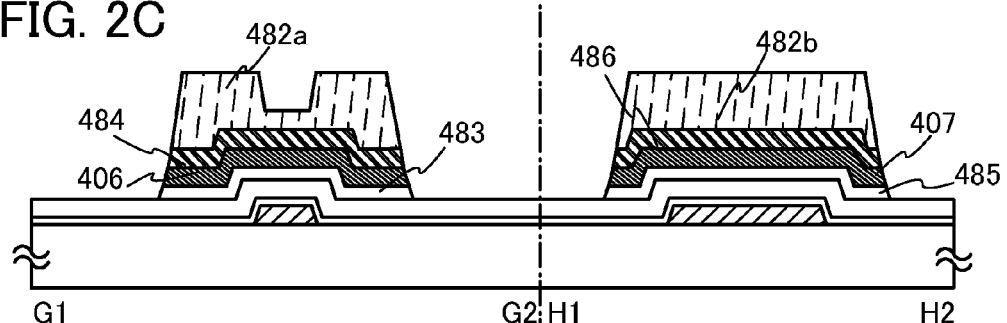

Then, the conductive layer, the low-resistance drain region, and the oxide semiconductor layer 481 are selectively etched simultaneously using the resist mask 482a and the resist mask 482b to form the oxide semiconductor layer 483 and an oxide semiconductor layer 485 which are island-shaped oxide semiconductor layers, low-resistance drain regions 406 and 407, and the conductive layer 484 and a conductive layer 486 (FIG. 2C). In the case where a stacked conductive film including a titanium film, an aluminum film, and a titanium film is used as the conductive layer, etching can be performed with a dry etching method using a chlorine gas.

Then, the resist masks 482a and 482b are reduced in size to form resist masks 487a, 487b, and 487c. In order to reduce the resist masks in size, ashing using oxygen plasma, or the like, may be performed. By reducing the resist masks in size, a portion of the conductive layer 484, which is between the resist masks 487a and 487b, is exposed.

Figure 2D:
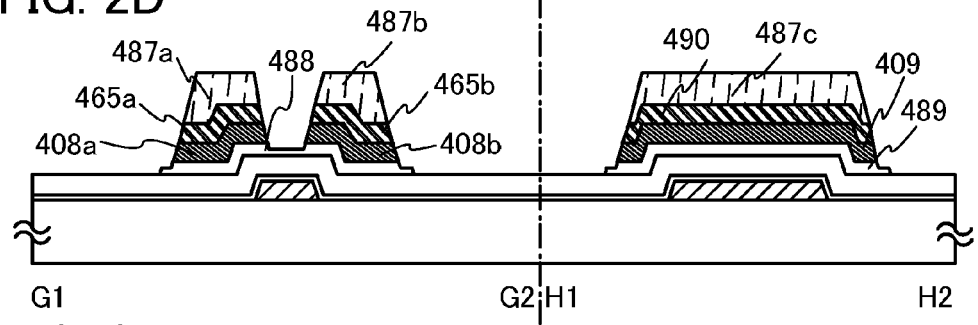

Next, the portion of the conductive layer 484, which is between the resist masks 487a and 487b, and a portion of the low-resistance drain region 406, which is in contact with the portion of the conductive layer 484, are selectively etched using the resist masks 487a and 487b to form the source electrode layer 465a, the drain electrode layer 465b, the first low-resistance drain region 408a, and the second low-resistance drain region 408b (FIG. 2D). Note that only part of an oxide semiconductor layer is etched at that time, so that the oxide semiconductor layer 488 having a groove (recessed portion) is formed.

As illustrated in FIG. 2D, by performing etching with the use of the resist masks 487a and 487b which are formed by reducing the resist masks 482a and 482b in size, end regions of the oxide semiconductor layers 483 and 485 are reduced in thickness. That is, end portions of the oxide semiconductor layer 488 are on the outer side than end portions of the first and second low-resistance drain regions 408a and 408b, and end portions of the oxide semiconductor layer 489 are on the outer side than end portions of the low-resistance drain region 409. The thickness of the end portion of the oxide semiconductor layer 483 is equal to the thickness of the groove (recessed portion) of the oxide semiconductor layer 488.

Figure 2E:
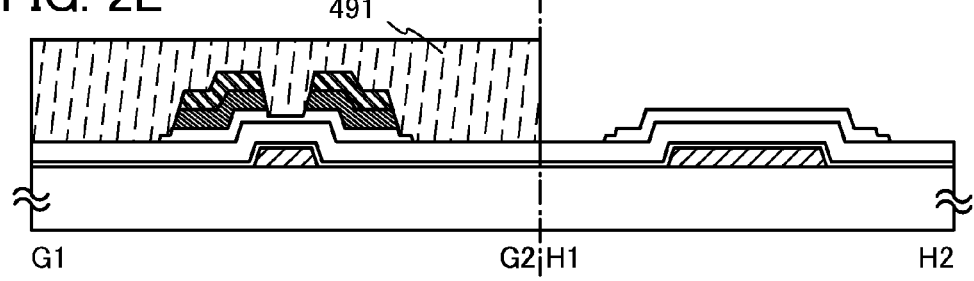

Next, the resist masks 487a, 487b, and 487c are removed, and through a third photolithography process, a resist mask 491 is formed and etching is selectively performed to remove the low-resistance drain region 409 and a conductive layer 490 which are formed over an oxide semiconductor layer 489 of the pixel portion (FIG. 2E).

In order to selectively remove the low-resistance drain region 409 and the conductive layer 490 which overlap with the oxide semiconductor layer 489 through a third photolithography process, the materials of the low-resistance drain region 409, the conductive layer 490, and the oxide semiconductor layer 489 and the etching conditions are adjusted as appropriate so that the oxide semiconductor layer 489 is not removed in the etching. A resist mask 491 may be formed with an ink-jet method. When the resist mask is formed with an ink-jet method, a photomask is not used; therefore, manufacturing costs can be reduced.

Next, the resist mask 491 is removed, and an oxide insulating film 492 serving as a protective insulating film is formed in contact with the groove (recessed portion) of the oxide semiconductor layer 488 and an upper surface and side surfaces of the oxide semiconductor layer 489.

The oxide insulating film 492 can be formed to a thickness of at least 1 nm with a method in which impurities such as water and hydrogen do not enter the oxide insulating film 492, such as a sputtering method. In this embodiment, a silicon oxide film is formed to a thickness of 300 nm as the oxide insulating film 492 with a sputtering method. The substrate temperature in deposition may be from a room temperature to 300° C. and is 100° C. in this embodiment. The silicon oxide film can be formed with a sputtering method in a rare gas (typically argon) atmosphere, an oxygen atmosphere, or an atmosphere including a rare gas (typically argon) and oxygen. As a target, a silicon oxide target or a silicon target can be used. For example, the silicon oxide film can be formed using a silicon target with a sputtering method under an atmosphere containing oxygen and nitrogen. For the oxide insulating film 492 formed in contact with an oxide semiconductor layer reduced in resistance, an inorganic insulating film that does not contain impurities such as moisture, a hydrogen ion, and $OH^-$ and blocks entry of such impurities from the outside is used. Typically, a silicon oxide film, a silicon nitride oxide film, an aluminum oxide film, an aluminum oxynitride film, or the like is used.

Figure 3A:
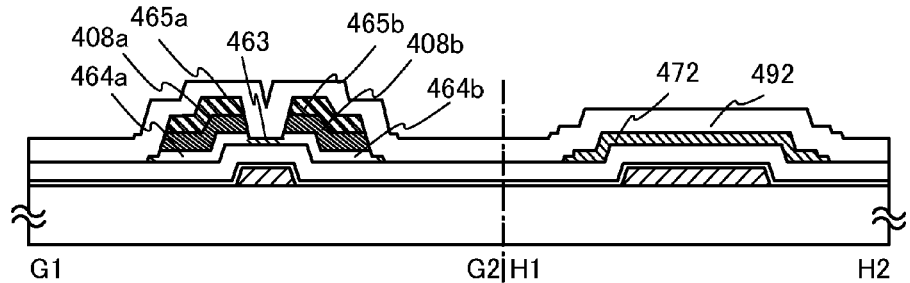
FIGS. 3A to 3E illustrate a method for manufacturing a semiconductor device.

Next, second heat treatment (preferably from 200° C. to 400° C., for example, from 250° C. to 350° C.) is performed in an inert gas atmosphere or an oxygen atmosphere (FIG. 3A). For example, the second heat treatment is performed at 250° C. for one hour in a nitrogen atmosphere. By performing the second heat treatment, heating is performed while the groove of the oxide semiconductor layer 488 and the upper surface and the side surfaces of the oxide semiconductor layer 489 are in contact with the oxide insulating film 492.

Through the above steps, after heat treatment for dehydration or dehydrogenation is performed on the deposited oxide semiconductor film to reduce the resistance of the oxide semiconductor film, part of the oxide semiconductor film is selectively in an oxygen excess state. As a result, the channel formation region 463 which overlaps with the gate electrode layer 461 becomes i-type and the first high-resistance drain region 464a which overlaps with the source electrode layer 465a and the second high-resistance drain region 464b which overlaps with the drain electrode layer 465b are formed in a self-aligned manner. The oxide semiconductor layer 472 which overlaps with the gate electrode layer 471 becomes i-type entirely.

By forming the second high-resistance drain region 464b (or the first high-resistance drain region 464a) in the oxide semiconductor layer overlapping with the drain electrode layer 465b (and the source electrode layer 465a), reliability of the formed driver circuit can be improved. Specifically, by forming the second high-resistance drain region 464b, the structure can be obtained in which conductivities of the drain electrode layer 465b, the second high-resistance drain region 464b, and the channel formation region vary. Therefore, in the case where operation is performed with the drain electrode layer 465b connected to a wiring for supplying a high power potential VDD, the high-resistance drain region serves as a buffer and a high electric field is not applied locally even if the high electric field is applied between the gate electrode layer 461 and the drain electrode layer 465b; thus, withstand voltage of the transistor can be increased.

Further, by forming the second high-resistance drain region 464b (or the first high-resistance drain region 464a) in the oxide semiconductor layer overlapping with the drain electrode layer 465b (and the source electrode layer 465a), leakage current in the channel formation region 463 of the formed driver circuit can be reduced.

The second low-resistance drain region 408b (and the first low-resistance drain region 408a) is provided between the drain electrode layer 465b (and the source electrode layer 465a) and the oxide semiconductor layer, whereby thermally stable operation can be performed as compared with a Schottky junction. The first low-resistance drain region 408a and the second low-resistance drain region 408b have lower resistance than the oxide semiconductor layer and higher resistance than the drain electrode layer 465b (and the source electrode layer 465a); therefore, contact resistance between the oxide semiconductor layer and the source and drain electrode layers can be reduced.

Figure 3B:
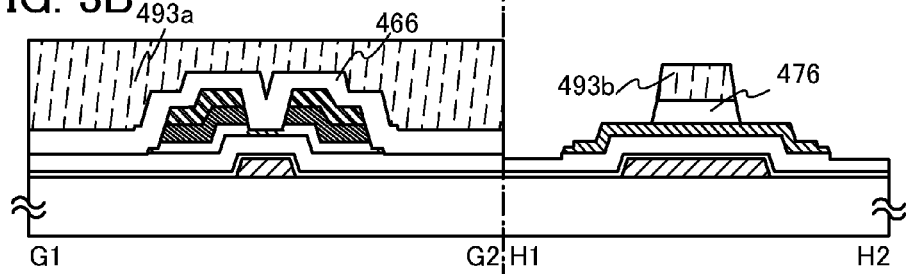

Next, through a fourth photolithography process, resist masks 493a and 493b are formed and the oxide insulating film 492 is selectively etched to form the oxide insulating layer (channel protective layer) 476 over the channel formation region of the oxide semiconductor layer 472 in the pixel portion (see FIG. 3B). By providing the channel protective layer 476, damage to the channel formation region of the oxide semiconductor layer 472 (e.g., reduction in thickness due to plasma or an etchant in etching) can be prevented in the manufacturing process. Therefore, reliability of the thin film transistor can be improved. Note that when an oxide insulating layer is used as the gate insulating layer 452b as in this embodiment, part of the gate insulating layer 452b is also etched in the etching step of the oxide insulating film 492, so that the part of the gate insulating layer 452b is reduced in thickness in some cases. When a nitride insulating film whose selectivity ratio with respect to the oxide insulating film 492 is high is used as the gate insulating layer 452b, the gate insulating layer 452b can be prevented from being partly etched.

Following dehydration or dehydrogenation, the channel protective layer 476 may be formed without being exposed to the air. Successive processings without exposure to the air makes it possible to obtain each interface between stacked layers, which is not contaminated by atmospheric components or impurity elements floating in the air, such as water and hydrocarbon. Therefore, variation in characteristics of the thin film transistor can be reduced.

Note that the resist masks 493a and 493b may be formed with an ink-jet method. When the resist mask is formed with an ink-jet method, a photomask is not used; therefore, manufacturing costs can be reduced.

Figure 3C:
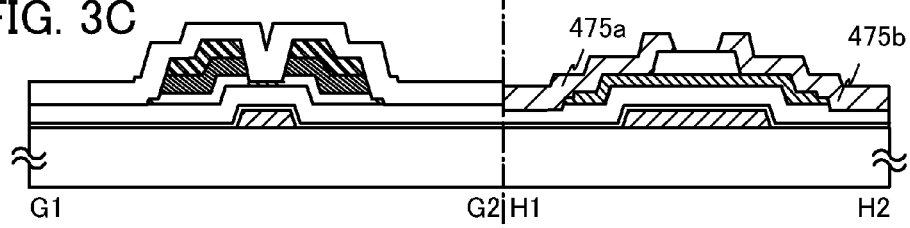

Next, after a light-transmitting conductive film is formed over a second gate insulating layer 452b, the oxide semiconductor layer 472, and the channel protective layer 476, the source electrode layer 475a and the drain electrode layer 475b are formed through a fifth photolithography process (FIG. 3C). The light-transmitting conductive film is deposited with a sputtering method, a vacuum evaporation method (e.g., an electron beam evaporation method), an arc discharge ion plating method, or a spray method. As a material for the conductive film, a conductive material that transmits visible light, for example, any of the following metal oxides can be used: an In—Sn—Zn—O-based metal oxide, an In—Al—Zn—O-based metal oxide, a Sn—Ga—Zn—O-based metal oxide, an Al—Ga—Zn—O-based metal oxide, a Sn—Al—Zn—O-based metal oxide, an In—Zn—O-based metal oxide, a Sn—Zn—O-based metal oxide, an Al—Zn—O-based metal oxide, an In—O-based metal oxide, a Sn—O-based metal oxide, and a Zn—O-based metal oxide. The thickness of the light-transmitting conductive film is set as appropriate within the range of 50 nm to 300 nm. When a sputtering method is employed, it is preferable that deposition be performed using a target containing $SiO_2$ of 2 to 10 wt % and $SiO_x$ (x>0) which suppresses crystallization be contained in the light-transmitting conductive film.

Note that a resist mask for forming the source electrode layer 475a and the drain electrode layer 475b may be formed with an ink-jet method. When the resist mask is formed with an ink-jet method, a photomask is not used; therefore, manufacturing costs can be reduced.

Figure 3D:
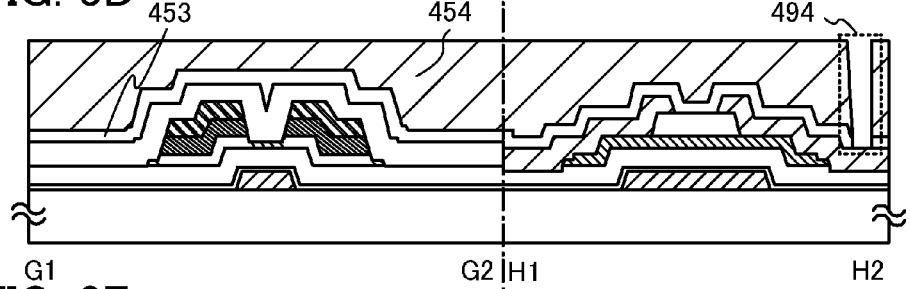

Then, the protective insulating layer 453 is formed over the oxide insulating layer 466, the channel protective layer 476, the source electrode layer 475a, and the drain electrode layer 475b (FIG. 3D). In this embodiment, a silicon nitride film is formed with an RF sputtering method. Since an RF sputtering method has high productivity, it is preferably used for depositing the protective insulating layer 453. The protective insulating layer 453 is formed using an inorganic insulating film that does not contain impurities such as moisture, a hydrogen ion, and $OH^-$ and blocks entry of such impurities from the outside, typically a silicon nitride film, an aluminum nitride film, a silicon nitride oxide film, or an aluminum oxynitride film. Needless to say, the protective insulating layer 453 is a light-transmitting insulating film.

The protective insulating layer 453 is preferably in contact with the first gate insulating layer 452a provided below the protective insulating layer 453 or an insulating film serving as a base, and blocks entry of impurities such as moisture, a hydrogen ion, and $OH^-$ from the vicinity of a side surface of the substrate. It is particularly effective to use a silicon nitride film as the first gate insulating layer 452a or the insulating film serving as the base, which is in contact with the protective insulating layer 453. That is, silicon nitride films are provided so as to surround a bottom surface, a top surface, and side surfaces of the oxide semiconductor layer, whereby the reliability of a display device is increased.

Next, the planarization insulating layer 454 is formed over the protective insulating layer 453. The planarization insulating layer 454 can be formed using an organic material having heat resistance, such as an acrylic resin, polyimide, a benzocyclobutene resin, polyamide, or an epoxy resin. Other than such organic materials, it is also possible to use a low-dielectric constant material (a low-k material), a siloxane-based resin, PSG (phosphosilicate glass), BPSG (borophosphosilicate glass), or the like. Note that the planarization insulating layer 454 may be formed by stacking a plurality of insulating films formed using any of the above materials.

Note that a siloxane-based resin corresponds to a resin including a Si—O—Si bond formed using a siloxane-based material as a starting material. The siloxane-based resin may include an organic group (e.g., an alkyl group or an aryl group) or a fluoro group as a substituent. Moreover, the organic group may include a fluoro group.

There is no particular limitation on the method for forming the planarization insulating layer 454. The planarization insulating layer 454 can be formed, depending on the material, with a method such as a sputtering method, an SOG method, a spin coating method, a dipping method, a spray coating method, or a droplet discharge method (e.g., an ink-jet method, screen printing, or offset printing), or a tool such as a doctor knife, a roll coater, a curtain coater, or a knife coater.

Then, through a sixth photolithography process, a resist mask is formed and a contact hole 494 that reaches the drain electrode layer 475b is formed by etching of the planarization insulating layer 454 and the protective insulating layer 453. Moreover, contact holes that reach the gate electrode layers 461 and 471 are also formed with that etching. Alternatively, a resist mask for forming the contact hole that reaches the drain electrode layer 475b may be formed with an ink-jet method. When the resist mask is formed with an ink-jet method, a photomask is not used; therefore, manufacturing costs can be reduced.

Next, the resist mask is removed and then a light-transmitting conductive film is formed. The light-transmitting conductive film can be formed using indium oxide ($In_2O_3$), an alloy of indium oxide and tin oxide ($In_2O_3$—$SnO_2$, abbreviated as ITO), or the like with a sputtering method, a vacuum evaporation method, or the like. Alternatively, an Al—Zn—O-based non-single-crystal film containing nitrogen (i.e., an Al—Zn—O—N-based non-single-crystal film), a Zn—O-based non-single-crystal film containing nitrogen (i.e., Zn—O—N-based non-single-crystal film), or a Sn—Zn—O-based non-single-crystal film containing nitrogen (i.e., Sn—Zn—O—N-based non-single-crystal film) may be used. Note that the percentage (atomic %) of zinc in the Al—Zn—O—N-based non-single-crystal film is 47 atomic % or less and is higher than that of aluminum in the non-single-crystal film; the percentage (atomic %) of aluminum in the non-single-crystal film is higher than that of nitrogen in the non-single-crystal film. Such a material is etched with a hydrochloric acid-based solution. However, since a residue is easily generated particularly in etching ITO, an alloy of indium oxide and zinc oxide ($In_2O_3$—ZnO) may be used to improve etching processability.

Note that the unit of the percentage of components in the light-transmitting conductive film is atomic percent (atomic %), and the percentage of components is evaluated by analysis using an electron probe X-ray microanalyzer (EPMA).

Figure 3E:
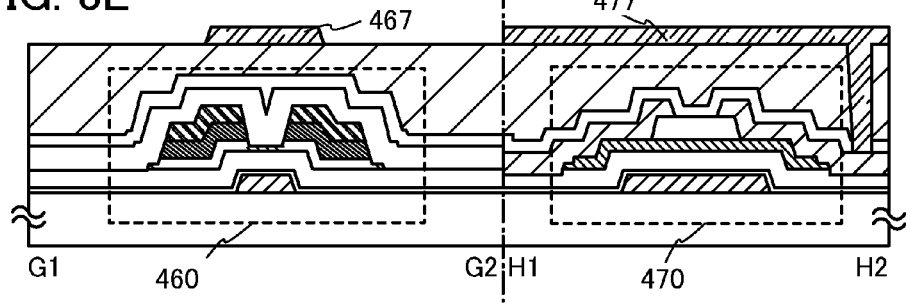

Next, through a seventh photolithography process, a resist mask is formed and unnecessary portions are removed by etching, so that the pixel electrode layer 477 and the conductive layer 467 are formed (see FIG. 3E).

Through the above-described steps, the thin film transistor 460 and the thin film transistor 470 can be separately formed in the driver circuit and the pixel portion, respectively, over one substrate with the use of seven masks. The thin film transistor 460 for the driver circuit is a channel-etched thin film transistor including the oxide semiconductor layer including the first high-resistance drain region 464a, the second high-resistance drain region 464b, and the channel formation region 463. The thin film transistor 470 for the pixel is a channel protective (channel-stop) thin film transistor including the oxide semiconductor layer 472 which is entirely i-type.

In addition, a storage capacitor that is constituted by the first gate insulating layer 452a and the second gate insulating layer 452b serving as dielectrics, a capacitor wiring, and a capacitor electrode can be formed over the same substrate. The thin film transistors 470 and storage capacitors are arranged in matrix to correspond to individual pixels so that a pixel portion is formed and a driver circuit including the thin film transistor 460 is provided on the periphery of the pixel portion, whereby one of the substrates for manufacturing an active matrix display device can be obtained. In this specification, such a substrate is referred to as an active matrix substrate for convenience.

The pixel electrode layer 477 is electrically connected to the capacitor electrode through the contact hole formed in the planarization insulating layer 454 and the protective insulating layer 453. Note that the capacitor electrode can be formed using the same light-transmitting material in the same step as the source electrode layer 475a and the drain electrode layer 475b.

The conductive layer 467 is provided so as to overlap with the channel formation region 463 in the oxide semiconductor layer, whereby in a bias-temperature stress test (hereinafter also referred to as a BT test) for examining the reliability of a thin film transistor, the amount of change in threshold voltage of the thin film transistor 460 between before and after the BT test can be reduced. A potential of the conductive layer 467 may be the same or different from that of the gate electrode layer 461. The conductive layer 467 can also function as a second gate electrode layer. Alternatively, the potential of the conductive layer 467 may be GND or 0 V, or the conductive layer 467 may be in a floating state.

Note that the resist mask for forming the pixel electrode layer 477 may be formed with an ink-jet method. When the resist mask is formed with an ink-jet method, a photomask is not used; therefore, manufacturing costs can be reduced.

This embodiment can be freely combined with any of the other embodiment modes.

Embodiment 2

In this embodiment, a semiconductor device and a method for manufacturing a semiconductor device which are different from those of Embodiment 1 will be described with reference to FIGS. 4A to 4E. Specifically, a semiconductor device will be described which is different from the semiconductor device illustrated in FIGS. 1A-1, 1A-2, 1B, and 1C in that in each of a thin film transistor provided in a driver circuit and a thin film transistor provided in a pixel portion, an oxide semiconductor layer including at least a channel formation region, a first high-resistance drain region, and a second high-resistance drain region serves as an active layer. Note that in this embodiment, the thin film transistor provided in the driver circuit has a structure similar to that of the thin film transistor 460 described in Embodiment 1 and can be manufactured through steps similar to those used for the thin film transistor 460 described in Embodiment 1. In this embodiment, the same portions as those in Embodiment 1 and portions having functions similar to those in Embodiment 1 can be treated as in Embodiment 1, and the same or similar steps as or to those in Embodiment 1 can be performed as in Embodiment 1. Thus, repeated description is omitted.

Figure 4A:
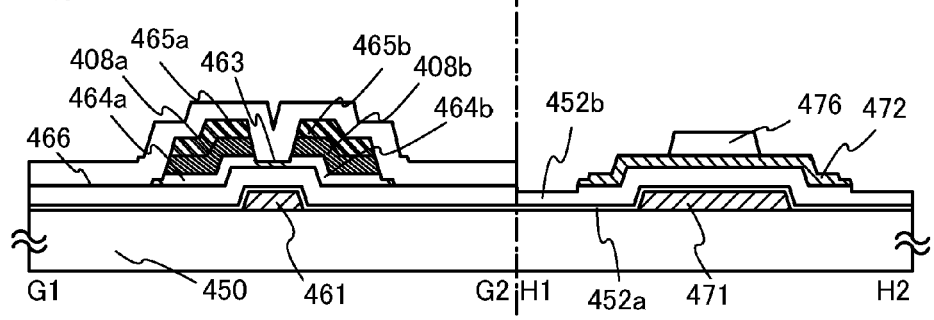
FIGS. 4A to 4E illustrate a method for manufacturing a semiconductor device.
Figure 4B:
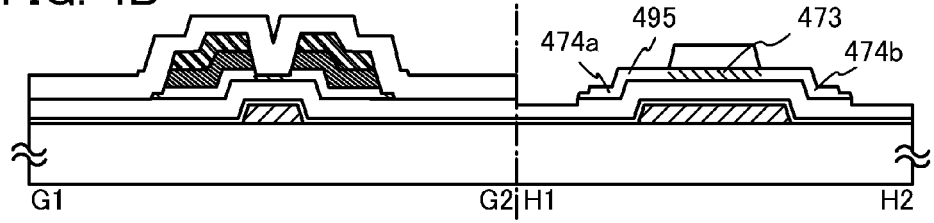

The gate electrode layers 461 and 471, the first gate insulating layer 452a, and the second gate electrode layer 452b are formed over the substrate 450 having an insulating surface. In the driver circuit portion, the oxide semiconductor layer including the channel formation region 463, the first high-resistance drain region 464a, and the second high-resistance drain region 464b; the first low-resistance drain region 408a; the second low-resistance drain region 408b; the source electrode layer 465a; the drain electrode layer 465b; and the oxide insulating layer 466 are formed. In the pixel portion, the oxide semiconductor layer 472 and the channel protective layer 476 are formed (FIG. 4A). The oxide semiconductor layer 472 is an i-type semiconductor layer whose resistance is increased.

End regions of the oxide semiconductor layer of the thin film transistor 460 provided in the driver circuit portion and the oxide semiconductor layer 472 are reduced in thickness. That is, end portions of the oxide semiconductor layer of the thin film transistor 460 are on the outer side than end portions of the first and second low-resistance drain regions 408a and 408b. The thickness of the end portion of the oxide semiconductor layer of the thin film transistor 460 is equal to the thickness of the groove (recessed portion) of the oxide semiconductor layer provided in the driver circuit portion, which is to be a channel formation region later.

In this embodiment, heat treatment is performed in an inert gas atmosphere such as a nitrogen atmosphere or under a reduced pressure while at least part of the oxide semiconductor layer 472 is exposed. When heat treatment is performed in an inert gas atmosphere such as a nitrogen atmosphere or under a reduced pressure while a part of the oxide semiconductor layer 472 whose resistance is increased (which is made to be i-type) is exposed, the resistance of the high-resistance (i-type) exposed regions of the oxide semiconductor layer 472 can be reduced, so that the regions can each be a high-resistance drain region having lower resistance.

Heat treatment for reducing the resistance of the high-resistance (i-type) region of the oxide semiconductor layer 472 is preferably performed at from 200° C. to 400° C., for example, from 250° C. to 350° C. For example, heat treatment is performed at 250° C. for one hour in a nitrogen atmosphere.

In this embodiment, the substrate is put in an electric furnace which is a kind of heat treatment apparatus and heat treatment is performed on the oxide semiconductor layer 472 in a nitrogen atmosphere, and then slow cooling is performed in a nitrogen atmosphere so that the temperature drops by 100° C. or more from the heat temperature T, with the oxide semiconductor layer 472 not exposed to the air. Moreover, without limitation on a nitrogen atmosphere, dehydration or dehydrogenation may be performed in a helium atmosphere, a neon atmosphere, an argon atmosphere, or the like, or under a reduced pressure. Note that in the heat treatment, it is preferable that moisture, hydrogen, and the like be not contained in nitrogen or a rare gas such as helium, neon, or argon. Alternatively, the purity of nitrogen or a rare gas such as helium, neon, or argon which is introduced into the heat treatment apparatus is preferably 6 N (99.9999%) or more, more preferably 7 N (99.99999%) or more (i.e., the impurity concentration is preferably 1 ppm or lower, more preferably 0.1 ppm or lower).

By performing heat treatment on the oxide semiconductor layer 472 in an inert gas atmosphere such as a nitrogen atmosphere or under a reduced pressure, the resistance of exposed regions of the oxide semiconductor layer 472 are reduced, so that the first high-resistance drain region 474a and the second high-resistance drain region 474b are formed. A region of the oxide semiconductor layer 472, which is covered with the channel protective layer 476, remains a region which has high resistance and becomes an i-type channel formation region 473. Thus, an oxide semiconductor layer 495 including the first high-resistance drain region 474a, the second high-resistance drain region 474b, and the channel formation region 473 is formed (see FIG. 4B).

Figure 4C:
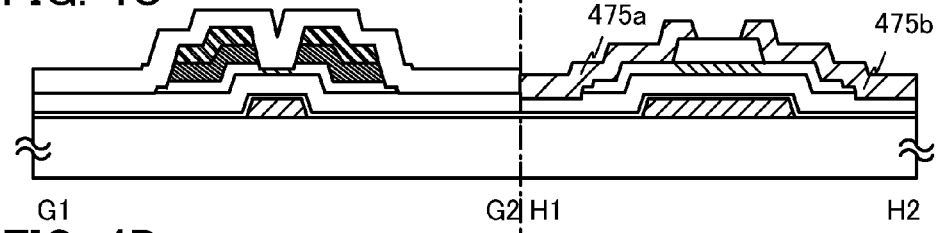

Next, after a light-transmitting conductive film is formed over the oxide semiconductor layer 495 and the channel protective layer 476, the source electrode layer 475a and the drain electrode layer 475b are formed through a fifth photolithography process (FIG. 4C).

Then, the protective insulating layer 453 and the planarization insulating layer 454 are stacked over the oxide insulating layers 466, the source electrode layer 475a, the drain electrode layer 475b, and the channel protective layer 476.

Figure 4D:
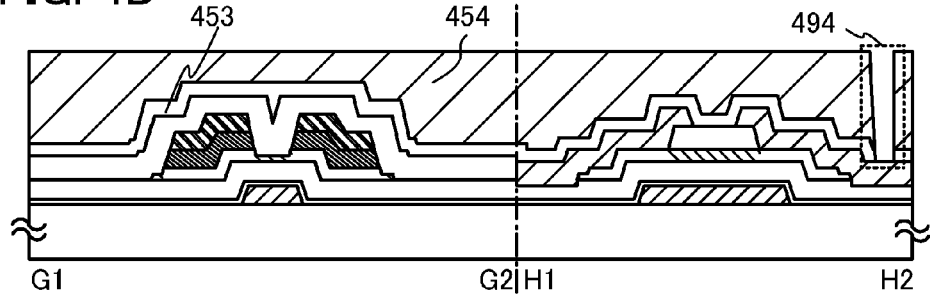

Then, through a sixth photolithography process, a resist mask is formed and the contact hole 494 that reaches the drain electrode layer 475b is formed by etching of the planarization insulating layer 454 and the protective insulating layer 453 (FIG. 4D).

Next, the resist mask is removed and then a light-transmitting conductive film is formed.

Figure 4E:
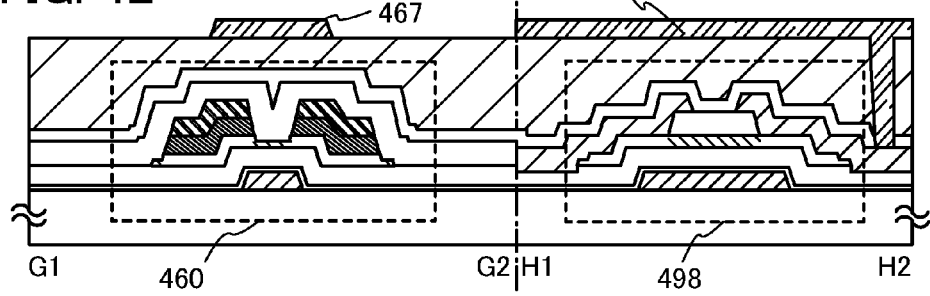

Next, through a seventh photolithography process, a resist mask is formed and unnecessary portions are removed by etching, so that the pixel electrode layer 477 and the conductive layer 467 are formed (FIG. 4E).

Through the above-described steps, the thin film transistor 460 and a thin film transistor 498 can be separately formed in the driver circuit and the pixel portion, respectively, over one substrate with the use of seven masks. The thin film transistor 460 provided in the driver circuit is a channel-etched thin film transistor including the oxide semiconductor layer including the first high-resistance drain region 464a, the second high-resistance drain region 464b, and the channel formation region 463. The thin film transistor 498 provided in the pixel portion is a channel protective thin film transistor including the oxide semiconductor layer 495 including a first high-resistance drain region 474a, a second high-resistance drain region 474b, and a channel formation region 473. Thus, the thin film transistors 460 and 498 have high withstand voltage since the high-resistance drain region serves as a buffer even when a high electric field is applied to the thin film transistors 460 and 498, so that a localized high electric field is not applied.

In the thin film transistor 460, the second low-resistance drain region 408b (and the first low-resistance drain region 408a) is provided between the drain electrode layer 465b (and the source electrode layer 465a) and the oxide semiconductor layer, whereby thermally stable operation can be performed as compared with a Schottky junction. The first low-resistance drain region 408a and the second low-resistance drain region 408b have lower resistance than the oxide semiconductor layer and higher resistance than the drain electrode layer 465b (and the source electrode layer 465a); therefore, contact resistance between the oxide semiconductor layer and the source and drain electrode layers can be reduced.

In addition, a storage capacitor that is constituted by the first gate insulating layer 452a and the second gate insulating layer 452b serving as dielectrics, a capacitor wiring layer and a capacitor electrode can be formed over the same substrate. The thin film transistors 498 and storage capacitors are arranged in matrix to correspond to individual pixels so that a pixel portion is formed and a driver circuit including the thin film transistor 460 is provided on the periphery of the pixel portion, whereby one of the substrates for manufacturing an active matrix display device can be obtained.

The conductive layer 467 is provided so as to overlap with the channel formation region 463 in the oxide semiconductor layer, whereby in a bias-temperature stress test (also referred to as a BT test) for examining the reliability of a thin film transistor, the amount of change in threshold voltage of the thin film transistor 460 between before and after the BT test can be reduced. A potential of the conductive layer 467 may be the same or different from that of the gate electrode layer 461. The conductive layer 467 can also function as a second gate electrode layer. Alternatively, the potential of the conductive layer 467 may be GND or 0 V, or the conductive layer 467 may be in a floating state.

Note that this embodiment can be freely combined with any of the other embodiments.

Embodiment 3

In this embodiment, a semiconductor device and a method for manufacturing a semiconductor device which are different from those of Embodiments 1 and 2 will be described with reference to FIGS. 5A to 5C. Specifically, a semiconductor device will be described which is different from the semiconductor device illustrated in FIGS. 1A-1, 1A-2, 1B, and 1C in that in each of a thin film transistor provided in a driver circuit and a thin film transistor provided in a pixel portion, an oxide semiconductor layer where an entire region of a channel formation region overlapping with a gate electrode layer is i-type is an active layer. Note that in this embodiment, the same portions as those in Embodiment 1 and portions having functions similar to those in Embodiment 1 can be treated as in Embodiment 1, and the same or similar steps as or to those in Embodiment 1 can be performed as in Embodiment 1. Thus, repeated description is omitted.

Figure 5A:
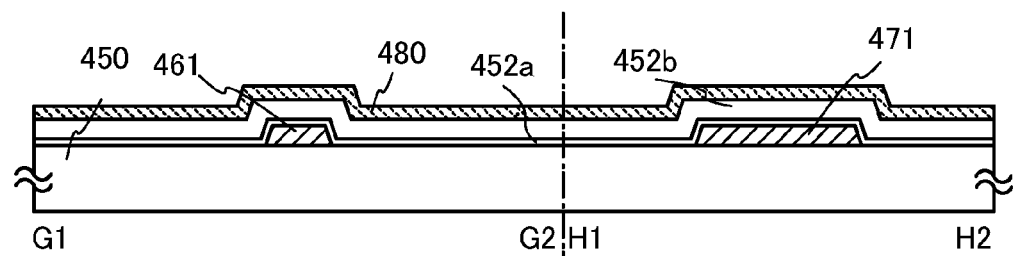
FIGS. 5A to 5C illustrate a method for manufacturing a semiconductor device.
Figure 5B:
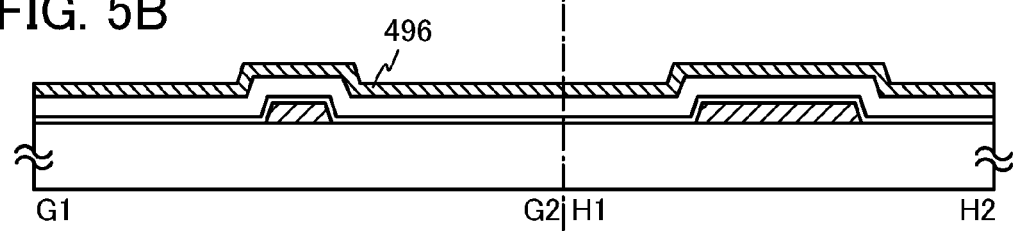
Figure 5C:
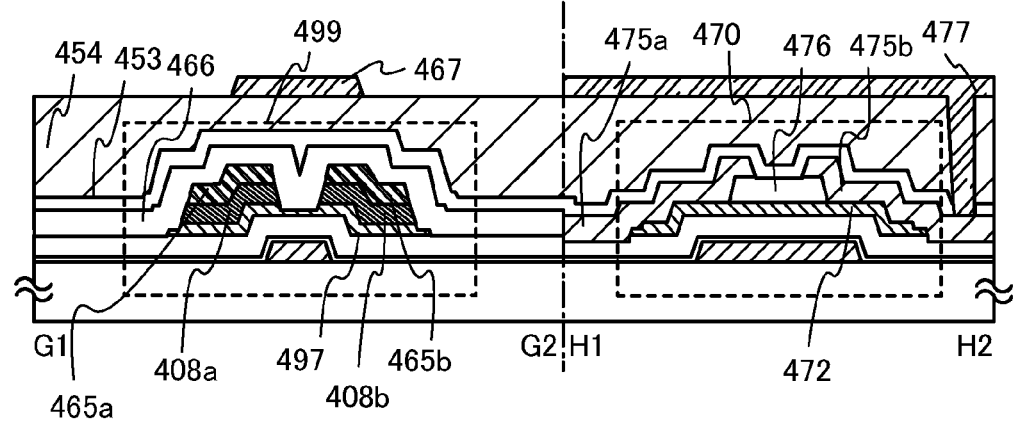

FIGS. 5A to 5C illustrate cross-sectional views of manufacturing steps of the thin film transistor 498. First, according to Embodiment 1, a light-transmitting conductive film is formed over the substrate 450 having an insulating surface, and then, the gate electrode layers 461 and 471 are formed through a first photolithography process.

Next, a stack of the first gate insulating layer 452a and the second gate insulating layer 452b is formed over the gate electrode layers 461 and 471. Then, the oxide semiconductor film 480 with a thickness of from 2 nm to 200 nm is formed over the second gate insulating layer 452b (see FIG. 5A). Note that the steps up to here are the same as the steps in Embodiment 1, and FIG. 5A corresponds to FIG. 2A.

Next, the oxide semiconductor film 480 is subjected to dehydration or dehydrogenation in an inert gas atmosphere or under a reduced pressure. The temperature of first heat treatment for dehydration or dehydrogenation is higher than or equal to 350° C. and lower than the strain point of the substrate, preferably higher than or equal to 400° C. Here, the substrate is introduced into an electric furnace which is one of heat treatment apparatuses, heat treatment is performed on the oxide semiconductor film 480 in a nitrogen atmosphere, and then, entry of water or hydrogen into the oxide semiconductor film 480 is prevented with the oxide semiconductor film 480 not exposed to the air. Accordingly, the oxide semiconductor film 480 is changed into an oxygen-deficient semiconductor film. Thus, the resistance of the oxide semiconductor film 480 is reduced, that is, the oxide semiconductor film 480 becomes an n-type semiconductor film (e.g., an n⁻ semiconductor film). After that, a high-purity oxygen gas, a high-purity $N_2O$ gas, or an ultra-dry air (with a dew point of −40° C. or less, preferably −60° C. or less) is introduced into the same furnace and cooling is performed. It is preferable that moisture, hydrogen, and the like be not contained in an oxygen gas or a $N_2O$ gas. Alternatively, the purity of an oxygen gas or a $N_2O$ gas which is introduced into the heat treatment apparatus is preferably 6 N (99.9999%) or more, more preferably 7 N (99.99999%) or more (i.e., the impurity concentration of the oxygen gas or the $N_2O$ gas is preferably 1 ppm or lower, more preferably 0.1 ppm or lower).

Moreover, after the first heat treatment for dehydration or dehydrogenation, heat treatment may be performed at from 200° C. to 400° C., preferably from 200° C. to 300° C., in an oxygen gas atmosphere, an $N_2O$ gas atmosphere, or an ultra-dry air (the dew point is −40° C. or less, preferably −60° C. or less).

An oxide semiconductor film 496 is entirely brought into an oxygen-excess state through the above steps, whereby the resistance of the oxide semiconductor film 496 is increased, that is, the oxide semiconductor film 496 is made to be i-type (FIG. 5B).

Consequently, the reliability of a thin film transistor to be formed later can be increased.

Next, through a photolithography process, the oxide semiconductor film is processed into an oxide semiconductor layer 497 and the oxide semiconductor layer 472 that are island-shaped oxide semiconductor layers.

Alternatively, the following process may be employed: after being subjected to dehydration or dehydrogenation in an inert gas atmosphere or under a reduced pressure and cooled in an inert gas atmosphere, the oxide semiconductor film is processed into the oxide semiconductor layers 497 and 472 that are island-shaped oxide semiconductor layers through a photolithography process. After that, heat treatment is performed at a temperature of from 200° C. to 400° C., preferably, at a temperature of from 200° C. to 300° C. in an oxygen gas atmosphere, an $N_2O$ gas atmosphere, or an ultra-dry air (the dew point is −40° C. or less, preferably −60° C. or less).

Before the formation of the oxide semiconductor film, heat treatment (higher than or equal to 400° C. and lower than the strain point of the substrate) may be performed in an inert gas atmosphere (such as a nitrogen atmosphere, a helium atmosphere, a neon atmosphere, or an argon atmosphere) or an oxygen atmosphere, or under a reduced pressure to remove impurities such as hydrogen and water contained in the gate insulating layer.

However, when heat treatment is performed in nitrogen or a rare gas atmosphere or under a reduced pressure while the oxide semiconductor layers 497 and 472 whose resistance is increased (which are made to be i-type) are exposed, the resistance of the oxide semiconductor layers 497 and 472 whose resistance is increased (which are made to be i-type) is reduced, so that each of the oxide semiconductor layers 497 and 472 becomes a high-resistance drain region having lower resistance. For that reason, heat treatment performed when the oxide semiconductor layers 497 and 472 are exposed is carried out in an oxygen gas or a $N_2O$ gas atmosphere or an ultra-dry air (with a dew point of −40° C. or less, preferably −60° C. or less).

Note that in this embodiment, an example is described in which dehydration or dehydrogenation are performed after deposition of the oxide semiconductor film; however, one embodiment of the present invention is not particularly limited thereto, and the first heat treatment for the oxide semiconductor layer may be performed on the oxide semiconductor film which has been processed into the island-shaped oxide semiconductor layers.

Then, as in FIGS. 2C to 2E and FIGS. 3A to 3E in Embodiment 1, in a peripheral driver circuit portion, only part of the oxide semiconductor layer 497 is etched to form the oxide semiconductor layer 497 having a groove (a recessed portion); and the oxide insulating layer 466 is formed in contact with the first low-resistance drain region 408a, the second low-resistance drain region 408b, the source electrode layer 465a and the drain electrode layer 465b, each of which is the conductive layer, and the oxide semiconductor layer 497; thus, a thin film transistor 499 for the driver circuit is formed. On the other hand, in a pixel portion, the channel protective layer 476 is formed over a channel formation region in the oxide semiconductor layer 472, and the source electrode layer 475a and the drain electrode layer 475b, each of which is a light-transmitting conductive layer, are formed; thus, the thin film transistor 470 for the pixel is formed.

End regions of the oxide semiconductor layers 497 and 472 are reduced in thickness. That is, end portions of the oxide semiconductor layer 483 are on the outer side than end portions of the first and second low-resistance drain regions 408a and 408b. The thickness of the end portion of the oxide semiconductor layer 483 is equal to the thickness of the groove (recessed portion) of the oxide semiconductor layer 483, which is to be a channel formation region later.

Next, second heat treatment (preferably from 200° C. to 400° C., for example, from 250° C. to 350° C.) is performed in an inert gas atmosphere or an oxygen gas atmosphere. For example, the second heat treatment is performed in a nitrogen atmosphere at 250° C. for one hour.

Then, the protective insulating layer 453 and the planarization insulating layer 454 are stacked so as to cover the thin film transistors 499 and 470 and to be in contact with the oxide insulating layer 466 and the channel protective layer 476, the source electrode layer 475a, and the drain electrode layer 475b. A contact hole that reaches the drain electrode layer 475b is formed in the protective insulating layer 453 and the planarization insulating layer 454, and a light-transmitting conductive film is formed in the contact hole and over the planarization insulating layer 454. The light-transmitting conductive film is selectively etched to form the conductive layer 467 and the pixel electrode layer 477 that is electrically connected to the thin film transistor 470 (FIG. 5C).

Through the above-described steps, the thin film transistor 499 and the thin film transistor 470 can be separately formed in the driver circuit and the pixel portion, respectively, over one substrate with the use of seven masks. The thin film transistor 499 for the driver circuit is a channel-etched thin film transistor including the oxide semiconductor layer 497 which is entirely i-type. The thin film transistor 470 for the pixel is the channel protective thin film transistor including the oxide semiconductor layer 472 which is entirely i-type.

In the thin film transistor 499, the second low-resistance drain region 408b (and the first low-resistance drain region 408a) is provided between the drain electrode layer 465b (and the source electrode layer 465a) and the oxide semiconductor layer, whereby thermally stable operation can be performed as compared with a Schottky junction. The first low-resistance drain region 408a and the second low-resistance drain region 408b have lower resistance than the oxide semiconductor layer and higher resistance than the drain electrode layer 465b (and the source electrode layer 465a); therefore, contact resistance between the oxide semiconductor layer and the source and drain electrode layers can be reduced.

In addition, a storage capacitor that is constituted by the first gate insulating layer 452a and the second gate insulating layer 452b serving as dielectrics, a capacitor wiring layer, and a capacitor electrode can be formed over the same substrate. The thin film transistors 470 and storage capacitors are arranged in matrix so as to correspond to individual pixels so that a pixel portion is formed and a driver circuit including the thin film transistor 499 is provided on the periphery of the pixel portion, whereby one of the substrates for manufacturing an active matrix display device can be obtained.

The conductive layer 467 is provided so as to overlap with a channel formation region in the oxide semiconductor layer 497, whereby in a bias-temperature stress test (also referred to as a BT test) for examining the reliability of a thin film transistor, the amount of change in threshold voltage of the thin film transistor 499 between before and after the BT test can be reduced. A potential of the conductive layer 467 may be the same or different from that of the gate electrode layer 461. The conductive layer 467 can also function as a second gate electrode layer. Alternatively, the potential of the conductive layer 467 may be GND or 0 V, or the conductive layer 467 may be in a floating state.

Note that this embodiment can be freely combined with any of the other embodiments.

Embodiment 4

In this embodiment, a semiconductor device and a method for manufacturing a semiconductor device which are different from those of Embodiments 1 to 3 will be described with reference to FIGS. 6A to 6D. Specifically, a semiconductor device will be described which is different from the semiconductor device illustrated in FIGS. 1A-1, 1A-2, 1B, and 1C in that an oxide semiconductor layer where a channel formation region overlapping with a gate electrode layer is entirely i-type is an active layer in a thin film transistor provided in a driver circuit, and an oxide semiconductor layer including at least a channel formation region, a first high-resistance drain region, and a second high-resistance drain region is an active layer in a thin film transistor provided in a pixel portion. Note that in this embodiment, the same portions as those in Embodiment 1 and portions having functions similar to those in Embodiment 1 can be treated as in Embodiment 1, and the same or similar steps as or to those in Embodiment 1 can be performed as in Embodiment 1. Thus, repeated description is omitted.

FIGS. 6A to 6D are cross-sectional views illustrating steps of manufacturing the thin film transistors 499 and 498.

First, according to Embodiment 3, the steps up to and including the step in FIG. 5B in Embodiment 3 are performed. The step in FIG. 6A is the same as the step in FIG. 5B.

Figure 6A:
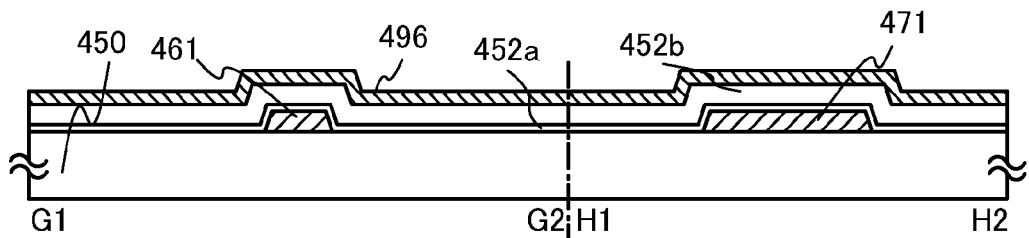
FIGS. 6A to 6D illustrate a method for manufacturing a semiconductor device.

The gate electrode layers 461 and 471, the first gate insulating layer 452a, and the second gate electrode layer 452b are formed over the substrate 450 having an insulating surface; the oxide semiconductor film 496 is formed over the second gate insulating layer 452b (FIG. 6A). The oxide semiconductor film 496 is an i-type semiconductor layer whose resistance is increased.

Next, through a photolithography process, the oxide semiconductor film 496 is processed into the oxide semiconductor layers 497 and 472 that are island-shaped oxide semiconductor layers.

Figure 6B:
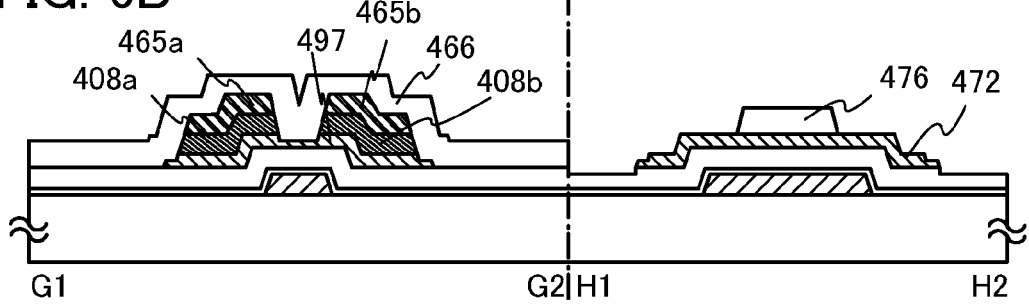
Figure 6C:
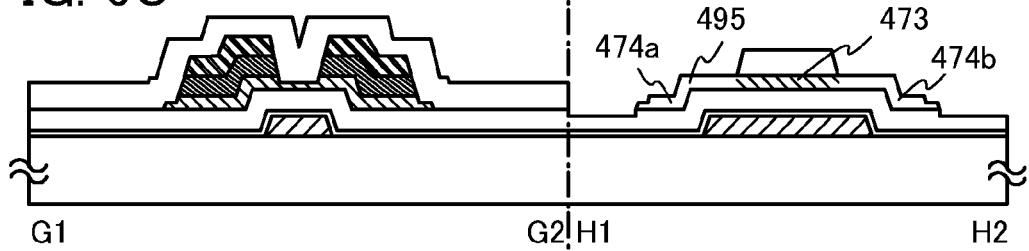

Then, as in FIGS. 2C to 2E and FIGS. 3A to 3E in Embodiment 1, in a peripheral driver circuit portion, only part of the oxide semiconductor layer 497 is etched to form the oxide semiconductor layer 497 having a groove (a recessed portion); and the oxide insulating layer 466 is formed in contact with the first low-resistance drain region 408a, the second low-resistance drain region 408b, the source electrode layer 465a and the drain electrode layer 465b, each of which is the metal conductive layer, and the oxide semiconductor layer 497; thus, a thin film transistor 499 for the driver circuit is formed. On the other hand, in a pixel portion, the channel protective layer 476 is formed over a channel formation region in the oxide semiconductor layer 472 (FIG. 6B).

End regions of the oxide semiconductor layers 497 and 472 are reduced in thickness. That is, end portions of the oxide semiconductor layer 497 are on the outer side than end portions of the first and second low-resistance drain regions 408a and 408b. The thickness of the end portion of the oxide semiconductor layer 497 is equal to the thickness of the groove (recessed portion) of the oxide semiconductor layer 497.

In this embodiment, heat treatment is performed in an inert gas atmosphere such as a nitrogen atmosphere or under a reduced pressure while at least part of the oxide semiconductor layer 472 is exposed, as in Embodiment 2. When heat treatment is performed in an inert gas atmosphere such as a nitrogen atmosphere or under a reduced pressure while at least part of the oxide semiconductor layer 472 whose resistance is increased (which is made to be i-type) is exposed, the resistance of the high-resistance (i-type) exposed regions in the oxide semiconductor layer 472 can be reduced, so that the regions can be high-resistance drain regions having lower resistance.

Heat treatment for reducing the resistance of the high-resistance (i-type) regions in the oxide semiconductor layer 472 is preferably performed at from 200° C. to 400° C., for example, 250° C. to 350° C. For example, heat treatment is performed at from 250° C. for one hour in a nitrogen atmosphere.

In this embodiment, the substrate is put in an electric furnace which is a kind of heat treatment apparatus and heat treatment is performed on the oxide semiconductor layer 472 in a nitrogen atmosphere, and then slow cooling is performed in a nitrogen atmosphere so that the temperature drops by 100° C. or more from the heat temperature T, with the oxide semiconductor layer 472 not exposed to the air. Moreover, without limitation on a nitrogen atmosphere, dehydration or dehydrogenation may be performed in a helium atmosphere, a neon atmosphere, an argon atmosphere, or the like, or under a reduced pressure. Note that in the heat treatment, it is preferable that moisture, hydrogen, and the like be not contained in nitrogen or a rare gas such as helium, neon, or argon. Alternatively, the purity of nitrogen or a rare gas such as helium, neon, or argon which is introduced into the heat treatment apparatus is preferably 6 N (99.9999%) or more, more preferably 7 N (99.99999%) or more (i.e., the impurity concentration is preferably 1 ppm or lower, more preferably 0.1 ppm or lower).

By performing heat treatment on the oxide semiconductor layer 472 in an inert gas atmosphere such as a nitrogen atmosphere or under a reduced pressure, the resistance of the exposed regions of the oxide semiconductor layer 472 is reduced, so that the first high-resistance drain region 474a and the second high-resistance drain region 474b are formed. A region of the oxide semiconductor layer 472, which is covered with the channel protective layer 476, remains a region which has high resistance and becomes an i-type channel formation region 473. Thus, an oxide semiconductor layer 495 including the first high-resistance drain region 474a, the second high-resistance drain region 474b, and the channel formation region 473 is formed (see FIG. 6C).

Next, after a light-transmitting conductive film is formed over the oxide semiconductor layer 495 and the channel protective layer 476, the source electrode layer 475a and the drain electrode layer 475b are formed through a fifth photolithography process.

Then, the protective insulating layer 453 and the planarization insulating layer 454 are stacked over the oxide insulating layers 466, the source electrode layer 475a, the drain electrode layer 475b, and the channel protective layer 476.

Then, through a sixth photolithography process, a resist mask is formed, and the planarization insulating layer 454 and the protective insulating layer 453 are etched so that the contact hole 494 that reaches the drain electrode layer 475b is formed.

Then, after the resist mask is removed, a light-transmitting conductive film is deposited.

Figure 6D:
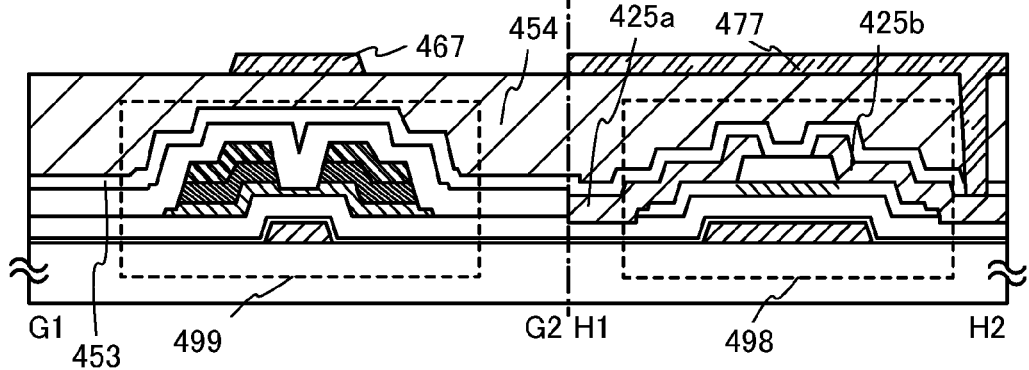

Next, through a seventh photolithography process, a resist mask is formed and unnecessary portions are removed by etching, so that the pixel electrode layer 477 and the conductive layer 467 are formed (FIG. 6D).

Through the above-described steps, the thin film transistor 499 and the thin film transistor 498 can be separately formed in the driver circuit and the pixel portion, respectively, over one substrate with the use of seven masks. The thin film transistor 499 for the driver circuit is the channel-etched thin film transistor including the oxide semiconductor layer 497 which is entirely i-type. The thin film transistor 498 for the pixel is the channel protective thin film transistor including the oxide semiconductor layer 495 including the first high-resistance drain region 474a, the second high-resistance drain region 474b, and the channel formation region 473. Thus, the thin film transistor 498 has high withstand voltage since the high-resistance drain region serves as a buffer even when a high electric field is applied to the thin film transistors 460 and 498, so that a localized high electric field is not applied.

In the thin film transistor 499, the second low-resistance drain region 408b (and the first low-resistance drain region 408a) is interposed between the drain electrode layer 465b (and the source electrode layer 465a) and the oxide semiconductor layer, whereby thermally stable operation can be performed as compared with a Schottky junction. The first low-resistance drain region 408a and the second low-resistance drain region 408b have lower resistance than the oxide semiconductor layer and higher resistance than the drain electrode layer 465b (and the source electrode layer 465a); therefore, contact resistance between the oxide semiconductor layer and the source and drain electrode layers can be reduced.

In addition, a storage capacitor that is constituted by the first gate insulating layer 452a and the second gate insulating layer 452b serving as dielectrics, a capacitor wiring layer, and a capacitor electrode can be formed over the same substrate. The thin film transistors 498 and storage capacitors are arranged in matrix to correspond to individual pixels so that a pixel portion is formed and a driver circuit including the thin film transistor 499 is provided on the periphery of the pixel portion, whereby one of the substrates for manufacturing an active matrix display device can be obtained.

The conductive layer 467 is provided so as to overlap with a channel formation region in the oxide semiconductor layer 497, whereby in a bias-temperature stress test (also referred to as a BT test) for examining the reliability of a thin film transistor, the amount of change in threshold voltage of the thin film transistor 499 between before and after the BT test can be reduced. A potential of the conductive layer 467 may be the same or different from that of the gate electrode layer 461. The conductive layer 467 can also function as a second gate electrode layer. Alternatively, the potential of the conductive layer 467 may be GND or 0 V, or the conductive layer 467 may be in a floating state.

Note that this embodiment can be freely combined with any of the other embodiments.

Embodiment 5

This embodiment will describe an example where an active matrix liquid crystal display device is manufactured with the active matrix substrate described in Embodiment 1. Note that this embodiment can also be applied to any of the active matrix substrates described in Embodiments 2 to 4.

FIG. 7A illustrates an example of a cross-sectional structure of an active matrix substrate.

The thin film transistor in a driver circuit and the thin film transistor in a pixel portion over one substrate are shown in Embodiment 1; in this embodiment, a storage capacitor, a gate wiring, and a terminal portion of a source wiring are shown in addition to these thin film transistors for description. The capacitor, the gate wiring, and the terminal portion of the source wiring can be formed in the same manufacturing steps as in Embodiment 1 and can be manufactured without increase in the number of photomasks and increase in the number of steps. Moreover, in a portion to serve as a display region in a pixel portion, the gate wiring, the source wiring, and a capacitor wiring layer are all formed using a light-transmitting conductive film, resulting in high aperture ratio. Furthermore, a metal wiring can be used for the source wiring layer in a portion that is not the display region in order to reduce the wiring resistance.

In FIG. 7A, a thin film transistor 210 is a channel-etched thin film transistor provided in a driver circuit. A thin film transistor 220 that is electrically connected to a pixel electrode layer 227 is a channel protective thin film transistor provided in a pixel portion.

In this embodiment, the thin film transistor 220 formed over a substrate 200 has the same structure as the thin film transistor 470 in Embodiment 1.

A capacitor wiring layer 230 which is formed using the same light-transmitting material in the same step as a gate electrode layer of the thin film transistor 220 overlaps with a capacitor electrode 231, with a first gate insulating layer 202a and a second gate insulating layer 202b serving as dielectrics therebetween; thus, a storage capacitor is formed. The capacitor electrode 231 is formed using the same light-transmitting material in the same step as a source electrode layer or a drain electrode layer of the thin film transistor 220. Since the storage capacitor has a light transmitting property as well as the thin film transistor 220, the aperture ratio can be increased.

The light transmitting property of the storage capacitor is important in increasing the aperture ratio. For small liquid crystal display panels of 10 inches or smaller in particular, high aperture ratio can be achieved even when the size of pixels is decreased in order to realize higher resolution of display images by increasing the number of gate wirings, for example. Moreover, wide viewing angle is realized by using a light-transmitting film for components in the thin film transistor 220 and the storage capacitor, so that high aperture ratio can be achieved even when one pixel is divided into a plurality of subpixels. That is, high aperture ratio can be maintained even when a group of high-density thin film transistors is provided, and the display region can have a sufficient area. For example, when one pixel includes two to four subpixels and storage capacitors, the storage capacitors have light transmitting properties as well as the thin film transistors, so that the aperture ratio can be increased.

Note that the storage capacitor is provided below the pixel electrode layer 227, and the capacitor electrode 231 is electrically connected to the pixel electrode layer 227.

This embodiment describes the example in which the storage capacitor is constituted by the capacitor electrode 231 and the capacitor wiring layer 230; however, there is no particular limitation on the structure of the storage capacitor. For example, a storage capacitor may be formed without providing a capacitor wiring layer in such a manner that a pixel electrode layer overlaps with a gate wiring in an adjacent pixel with a planarization insulating layer, a protective insulating layer, a first gate insulating layer, and a second gate insulating layer placed therebetween.

A plurality of gate wirings, source wirings, and capacitor wiring layers are provided in accordance with the pixel density. In the terminal portion, a plurality of first terminal electrodes at the same potential as the gate wiring, a plurality of second terminal electrodes at the same potential as the source wiring, a plurality of third terminal electrodes at the same potential as the capacitor wiring layer, and the like are arranged. There is no particular limitation on the number of each of the terminal electrodes, and the number of the terminal electrodes can be determined by a practitioner as appropriate.

In the terminal portion, the first terminal electrode which has the same potential as the gate wiring can be formed using the same light-transmitting material as the pixel electrode layer 227. The first terminal electrode is electrically connected to the gate wiring through a contact hole that reaches the gate wiring. The contact hole that reaches the gate wiring is formed by selective etching of a planarization insulating layer 204, a protective insulating layer 203, an oxide insulating layer 216, the second gate insulating layer 202b, and the first gate insulating layer 202a with the use of a photomask used for forming a contact hole for electrically connecting the drain electrode layer and the pixel electrode layer 227 of the thin film transistor 220.

A gate electrode layer of the thin film transistor 210 in the driver circuit may be electrically connected to a conductive layer 217 provided above an oxide semiconductor layer. In that case, a contact hole is formed by selective etching of the planarization insulating layer 204, the protective insulating layer 203, the oxide insulating layer 216, the second gate insulating layer 202b, and the first gate insulating layer 202a with the use of the photomask used for forming the contact hole for electrically connecting the drain electrode layer and the pixel electrode layer 227 of the thin film transistor 220. The conductive layer 217 and the gate electrode layer of the thin film transistor 210 in the driver circuit are electrically connected through the contact hole.

A second terminal electrode 235 which has the same potential as a source wiring 234c in the driver circuit can be formed using the same light-transmitting material as the pixel electrode layer 227. The source wiring 234c can be formed in the same step as the source and drain electrode layers of the thin film transistor 210, and the oxide semiconductor layer 234a and the low-resistance drain region 234b are stacked between the source wiring 234c and the substrate. The second terminal electrode 235 is electrically connected to the source wiring 234c through a contact hole that reaches the source wiring 234c. The source wiring is a metal wiring, is formed using the same material in the same step as a source electrode layer of the thin film transistor 210, and has the same potential as the source electrode layer of the thin film transistor 210.

The third terminal electrode which has the same potential as the capacitor wiring layer 230 can be formed using the same light-transmitting material as the pixel electrode layer 227. Moreover, a contact hole that reaches the capacitor wiring layer 230 can be formed in the same step using the same photomask as those for forming a contact hole for electrically connecting the capacitor electrode 231 to the pixel electrode layer 227.

In the case of manufacturing an active matrix liquid crystal display device, a liquid crystal layer is provided between an active matrix substrate and a counter substrate provided with a counter electrode (also referred to as a counter electrode layer), and the active matrix substrate and the counter substrate are fixed to each other. A common electrode electrically connected to the counter electrode on the counter substrate is provided over the active matrix substrate, and a fourth terminal electrode electrically connected to the common electrode is provided in the terminal portion. The fourth terminal electrode is used for setting the common electrode to a fixed potential such as GND or 0 V. The fourth terminal electrode can be formed using the same light-transmitting material as the pixel electrode layer 227.

There is no particular limitation on the structure where the source electrode layer of the thin film transistor 220 and the source electrode layer of the thin film transistor 210 are electrically connected to each other; for example, a connection electrode for connecting the source electrode layer of the thin film transistor 220 and the source electrode layer of the thin film transistor 210 may be formed in the same step as the pixel electrode layer 227. Furthermore, in the portion that is not the display region, the source electrode layer of the thin film transistor 220 and the source electrode layer of the thin film transistor 210 may be in contact with each other to overlap with each other.

Note that FIG. 7A illustrates a cross-sectional structure of the gate wiring layer 232 in the driver circuit. Since this embodiment describes an example of a small liquid crystal display panel of 10 inches or smaller, the gate wiring layer 232 in the driver circuit is formed using the same light-transmitting material as the gate electrode layer of the thin film transistor 220.

When the same material is used for the gate electrode layer, the source electrode layer, the drain electrode layer, the pixel electrode layer, another electrode layer, and another wiring layer, a common sputtering target and a common manufacturing device can be used and the material costs and costs of an etchant (or an etching gas) used for etching can be reduced; thus, manufacturing costs can be reduced.

When a photosensitive resin material is used for the planarization insulating layer 204 in the structure in FIG. 7A, the step for forming a resist mask can be omitted.

FIG. 7B illustrates a cross-sectional structure, part of which is different from the structure in FIG. 7A. FIG. 7B is the same as FIG. 7A except that the planarization insulating layer 204 is not provided; therefore, the same portions are denoted by the same reference numerals and detailed description of the same portions is omitted. In FIG. 7B, the pixel electrode layer 227, the conductive layer 217, and the second terminal electrode 235 are formed on and in contact with the protective insulating layer 203.

With the structure in FIG. 7B, the step for forming the planarization insulating layer 204 can be omitted.

This embodiment can be freely combined with any of the other embodiments.

Embodiment 6

This embodiment will describe an example where part of a gate wiring is made from a metal wiring so that the wiring resistance is reduced, because there is a possibility that the resistance of a light-transmitting wiring might become a problem in the case where the size of a liquid crystal display panel exceeds 10 inches and reach 60 inches and even 120 inches.

Note that in FIG. 8A, the same portions as those in FIG. 7A are denoted by the same reference numerals and detailed description of the same portions is omitted.

FIG. 8A illustrates an example where part of a gate wiring in a driver circuit is formed using a metal wiring and formed in contact with a light-transmitting wiring which is the same as the gate electrode layer of the thin film transistor 210. Note that the number of photomasks is larger than that in Embodiment 1 since the metal wiring is formed.

First, a heat-resistant conductive material film (with a thickness of 100 nm to 500 nm) that can withstand first heat treatment for dehydration or dehydrogenation is formed over the substrate 200.

In this embodiment, a 370-nm-thick tungsten film and a 50-nm-thick tantalum nitride film are formed. Although a stack of the tantalum nitride film and the tungsten film is used as the conductive film here, there is no particular limitation and the conductive film may be formed using an element selected from Ta, W, Ti, Mo, Al, or Cu; an alloy containing any of these elements as its component, an alloy containing a combination of any of these elements, or a nitride containing any of these elements as its component. The heat-resistant conductive material film is not limited to a single layer containing the above-described element and may be a stack of two or more layers.

Through a first photolithography process, metal wirings are formed, so that a first metal wiring layer 236 and a second metal wiring layer 237 are formed. An ICP (inductively coupled plasma) etching method is preferably used for etching of the tungsten film and the tantalum nitride film. The films can be etched to have a desired tapered shape with an ICP etching method with appropriate adjustment of etching conditions (e.g., the amount of electric power applied to a coiled electrode, the amount of electric power applied to a substrate-side electrode, and the temperature of the substrate-side electrode). The first metal wiring layer 236 and the second metal wiring layer 237 are tapered; thus, defects in formation of a light-transmitting conductive film to be formed thereover can be reduced.

Then, after the light-transmitting conductive film is formed, a gate wiring layer 238, a gate electrode layer of the thin film transistor 210, and a gate electrode layer of the thin film transistor 220 are formed in a second photolithography process. The light-transmitting conductive film is formed using any of the conductive materials that transmit visible light described in Embodiment 1.

Note that for example, it is possible that, depending on the material of the light-transmitting conductive film, an oxide film is formed with later heat treatment or the like at an interface where the gate wiring layer 238 is in contact with the first metal wiring layer 236 or the second metal wiring layer 237, so that contact resistance is increased. Consequently, the second metal wiring layer 237 is preferably formed using a metal nitride film that prevents oxidation of the first metal wiring layer 236.

Next, a gate insulating layer, an oxide semiconductor layer, and the like are formed in the same steps as in Embodiment 1. The following steps for forming an active matrix substrate follow Embodiment 1.

This embodiment describes an example in which after the formation of the planarization insulating layer 204, the planarization insulating layer in a terminal portion is selectively removed using a photomask. It is preferable that the planarization insulating layer be not placed in the terminal portion so that the terminal portion can be connected to an FPC in a favorable manner.

In FIG. 8A, the second terminal electrode 235 is formed over the protective insulating layer 203. FIG. 8A illustrates the gate wiring layer 238 which overlaps with part of the second metal wiring layer 237; alternatively, the gate wiring layer may cover the first metal wiring layer 236 and the second metal wiring layer 237 entirely. In other words, the first metal wiring layer 236 and the second metal wiring layer 237 can be referred to as auxiliary wirings for reducing the resistance of the gate wiring layer 238.

In the terminal portion, a first terminal electrode that has the same potential as the gate wiring is formed over the protective insulating layer 203 and electrically connected to the second metal wiring layer 237. A wiring led from the terminal portion is also formed using a metal wiring.

Furthermore, in order to reduce the wiring resistance, the metal wirings, that is, the first metal wiring layer 236 and the second metal wiring layer 237 can be used as the auxiliary wirings for the gate wiring layer and a capacitor wiring layer in a portion that does not serve as a display region.

FIG. 8B illustrates a cross-sectional structure, part of which is different from the structure in FIG. 8A. FIG. 8B is the same as FIG. 8A except a material of the gate electrode layer in the thin film transistor in the driver circuit; therefore, the same portions are denoted by the same reference numerals and detailed description of the same portions is omitted.

FIG. 8B illustrates an example in which the gate electrode layer in the thin film transistor in the driver circuit is formed using a metal wiring. In the driver circuit, a material of the gate electrode layer is not limited to a light-transmitting material.

In FIG. 8B, a thin film transistor 240 in the driver circuit includes a gate electrode layer in which a second metal wiring layer 241 is stacked over a first metal wiring layer 242. Note that the first metal wiring layer 242 can be formed using the same material in the same step as the first metal wiring layer 236. Moreover, the second metal wiring layer 241 can be formed using the same material in the same step as the second metal wiring layer 237.

In the case where the first metal wiring layer 242 is electrically connected to the conductive layer 217, it is preferable to use a metal nitride film for the second metal wiring layer 241 for preventing oxidation of the first metal wiring layer 242.

In this embodiment, metal wirings are used for some wirings so that the wiring resistance is reduced; high resolution of display images is achieved and high aperture ratio can be realized even when the size of a liquid crystal display panel exceeds 10 inches and reaches 60 inches and even 120 inches.

This embodiment can be freely combined with any of the other embodiments.

Embodiment 7

Figure 9A:
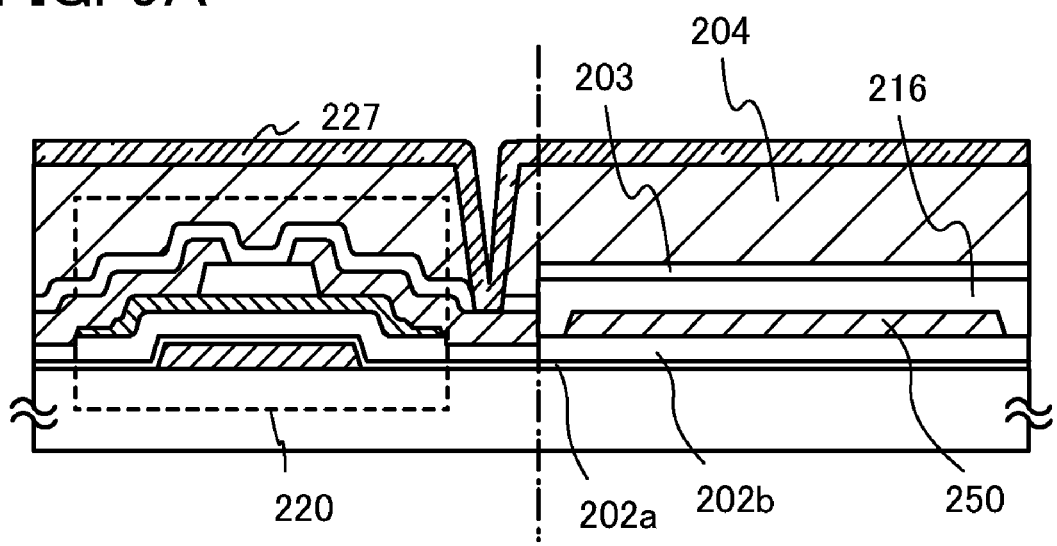
FIGS. 9A and 9B each illustrate a semiconductor device.
Figure 9B:
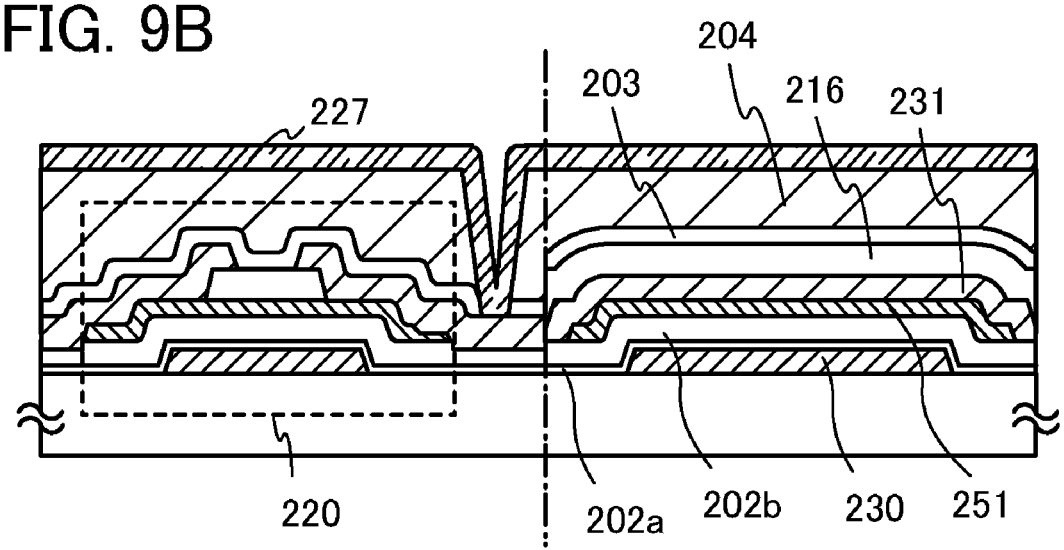

In this embodiment, an example of a structure of a storage capacitor, which is different from that in Embodiment 5, will be illustrated in FIGS. 9A and 9B. FIG. 9A is the same as FIG. 7A except the structure of the storage capacitor; therefore, the same portions are denoted by the same reference numerals and detailed description of the same portions is omitted. FIG. 9A illustrates a cross-sectional structure of the thin film transistor 220 provided in a pixel and a storage capacitor.

FIG. 9A illustrates an example in which the storage capacitor is constituted by the oxide insulating layer 216, the protective insulating layer 203, and the planarization insulating layer 204 serving as dielectrics, the pixel electrode layer 227, and a capacitor wiring layer 250 that overlaps with the pixel electrode layer 227. Since the capacitor wiring layer 250 is formed using the same light-transmitting material in the same steps as the source electrode layer of the thin film transistor 220 provided in the pixel, the capacitor wiring layer 250 is arranged so as not to overlap with a source wiring layer of the thin film transistor 220.

In the storage capacitor illustrated in FIG. 9A, a pair of electrodes and the dielectrics have light-transmitting properties, and thus the storage capacitor as a whole has a light-transmitting property.

FIG. 9B illustrates an example of a structure of the storage capacitor, which is different from that in FIG. 9A. FIG. 9B is the same as FIG. 7A except the structure of the storage capacitor; therefore, the same portions are denoted by the same reference numerals and detailed description of the same portions is omitted.

FIG. 9B illustrates an example in which the storage capacitor is constituted by the first gate insulating layer 202*a* and the second gate insulating layer 202*b* serving as dielectrics, the capacitor wiring layer 230 and a stack of an oxide semiconductor layer 251 and the capacitor electrode 231, which overlaps with the capacitor wiring layer 230. The capacitor electrode 231 is stacked on and in contact with the oxide semiconductor layer 251 and functions as one electrode of the storage capacitor. Note that the capacitor electrode 231 is formed using the same light-transmitting material in the same steps as the source and drain electrode layers of the thin film transistor 220. Moreover, since the capacitor wiring layer 230 is formed using the same light-transmitting material in the same steps as the gate electrode layer of the thin film transistor 220, the capacitor wiring layer 230 is arranged so as not to overlap with a gate wiring layer of the thin film transistor 220.

The capacitor electrode 231 is electrically connected to the pixel electrode layer 227.

Also in the storage capacitor illustrated in FIG. 9B, a pair of electrodes and the dielectrics have light-transmitting properties, and thus the storage capacitor as a whole has a light-transmitting property.

Each of the storage capacitors illustrated in FIGS. 9A and 9B has a light-transmitting property; thus, sufficient capacitance and high aperture ratio can be obtained even when the size of pixels is decreased in order to realize higher resolution of display images by increasing the number of gate wirings, for example.

This embodiment can be freely combined with any of the other embodiments.

Embodiment 8

In this embodiment, an example will be described below in which at least some of driver circuits and a thin film transistor placed in a pixel portion are formed over one substrate.

The thin film transistor placed in the pixel portion is formed according to any of Embodiments 1 to 4. Since the thin film transistor described in any of Embodiments 1 to 4 is an n-channel TFT, some of driver circuits that can be constituted by n-channel TFTs among the driver circuits are formed over a substrate where the thin film transistor in the pixel portion is formed.

Figure 14A:
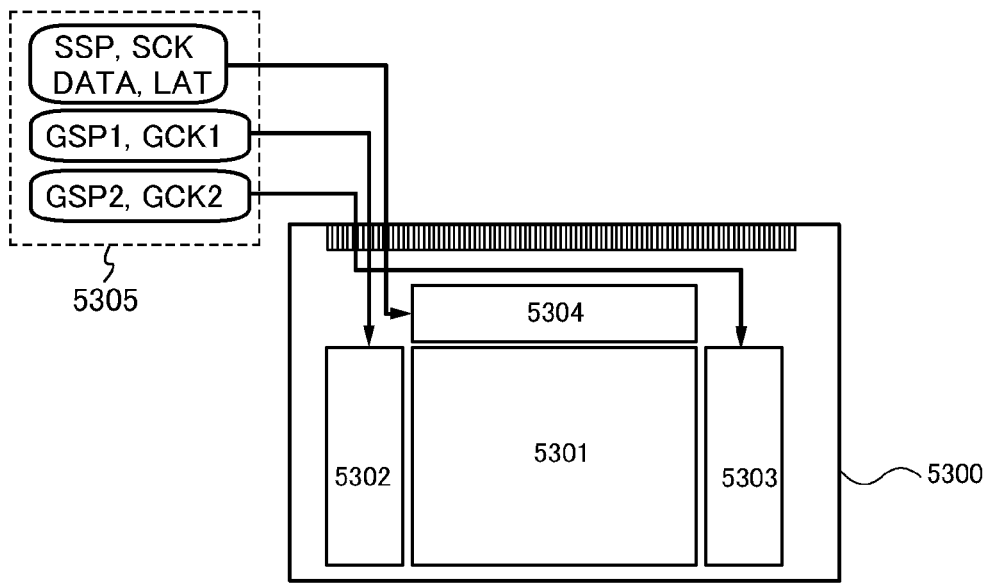
FIGS. 14A and 14B are block diagrams each illustrating a semiconductor device.

FIG. 14A illustrates an example of a block diagram of an active matrix display device. A pixel portion 5301, a first scan line driver circuit 5302, a second scan line driver circuit 5303, and a signal line driver circuit 5304 are provided over a substrate 5300 in the display device. In the pixel portion 5301, a plurality of signal lines extended from the signal line driver circuit 5304 are placed and a plurality of scan lines extended from the first scan line driver circuit 5302 and the second scan line driver circuit 5303 are placed. Note that pixels each including a display element are arranged in matrix in respective regions where the scan lines and the signal lines intersect with each other. The substrate 5300 of the display device is connected to a timing control circuit 5305 (also referred to as a controller or a control IC) through a connection portion such as an FPC (flexible printed circuit).

In FIG. 14A, the first scan line driver circuit 5302, the second scan line driver circuit 5303, and the signal line driver circuit 5304 are formed over the substrate 5300 where the pixel portion 5301 is formed. Consequently, the number of components of a driver circuit and the like that are externally provided is reduced, so that costs can be reduced. Moreover, the number of connections in the connection portion in the case where wirings are extended from a driver circuit provided outside the substrate 5300 can be reduced, and the reliability or yield can be increased.

Note that the timing control circuit 5305 supplies, for example, a first scan line driver circuit start signal (GSP1) (a start signal is also referred to as a start pulse) and a scan line driver circuit clock signal (GCK1) to the first scan line driver circuit 5302. Furthermore, the timing control circuit 5305 supplies, for example, a second scan line driver circuit start signal (GSP2) and a scan line driver circuit clock signal (GCK2) to the second scan line driver circuit 5303. Moreover, the timing control circuit 5305 supplies a signal line driver circuit start signal (SSP), a signal line driver circuit clock signal (SCK), video signal data (DATA, also simply referred to as a video signal), and a latch signal (LAT) to the signal line driver circuit 5304. Each clock signal may be a plurality of clock signals with shifted phases or may be supplied together with a signal (CKB) obtained by inverting the clock signal. Note that it is possible to omit one of the first scan line driver circuit 5302 and the second scan line driver circuit 5303.

Figure 14B:
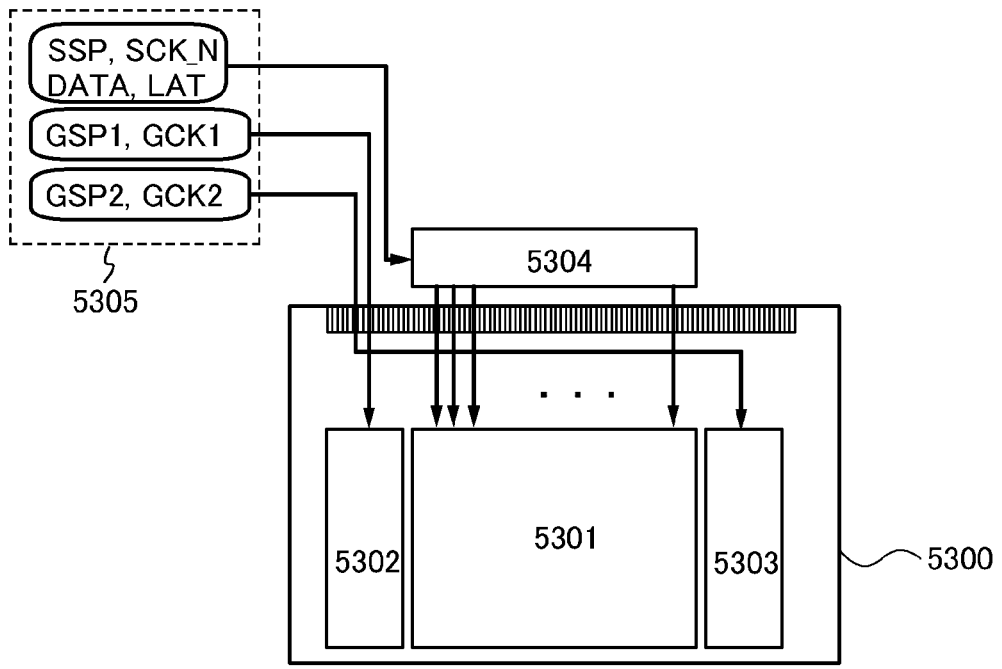

FIG. 14B illustrates a structure in which the first scan line driver circuit 5302 and the second scan line driver circuit 5303 are formed over the substrate 5300 where the pixel portion 5301 is formed, and the signal line driver circuit 5304 is formed over a substrate which is different from the substrate 5300 where the pixel portion 5301 is formed.

Figure 15A:
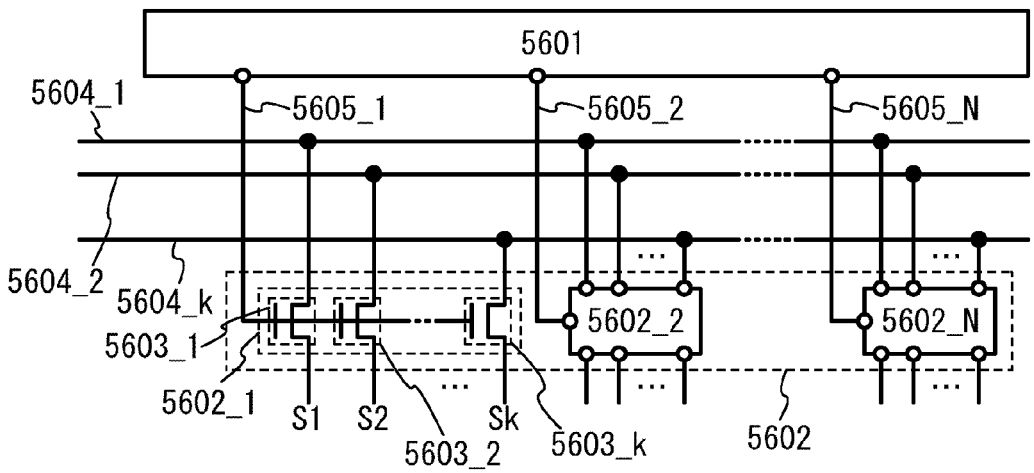
FIGS. 15A and 15B illustrate circuit diagram and a timing chart of a signal line driver circuit, respectively.
Figure 15B:
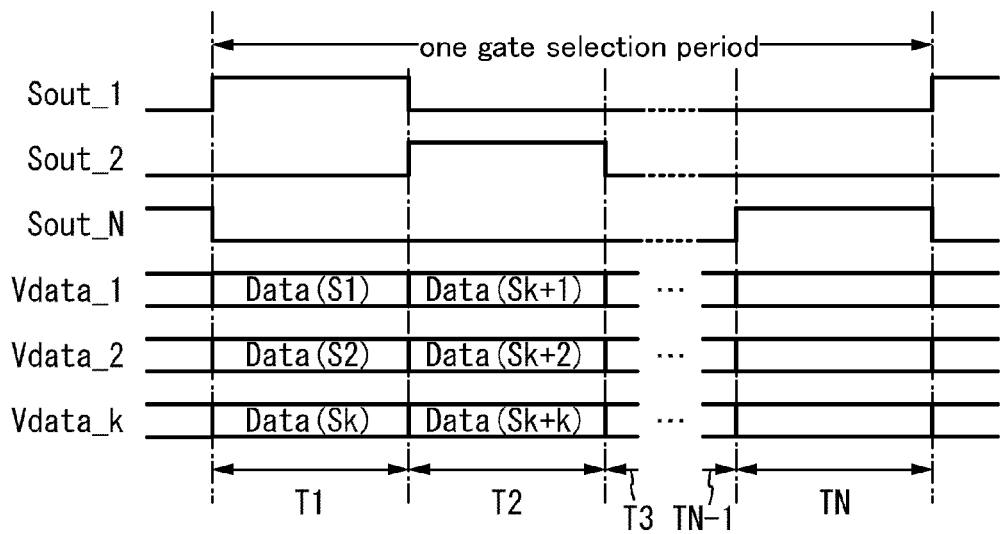

The thin film transistors in Embodiments 1 to 4 are n-channel TFTs. FIGS. 15A and 15B illustrate an example of a structure and operation of a signal line driver circuit constituted by n-channel TFTs.

The signal line driver circuit includes a shift register 5601 and a switching circuit 5602. The switching circuit 5602 includes a plurality of switching circuits 5602_1 to 5602_N (N is a natural number). The switching circuits 5602_1 to 5602_N each include a plurality of thin film transistors 5603_1 to 5603_$k$ ($k$ is a natural number). The example where the thin film transistors 5603_1 to 5603_$k$ are n-channel TFTs is described below.

A connection relation in the signal line driver circuit is described by using the switching circuit 5602_1 as an example. First terminals of the thin film transistors 5603_1 to 5603_$k$ are connected to wirings 5604_1 to 5604_$k$, respectively. Second terminals of the thin film transistors 5603_1 to 5603_$k$ are connected to signal lines S1 to Sk, respectively. Gates of the thin film transistors 5603_1 to 5603_$k$ are connected to a wiring 5605_1.

The shift register 5601 has a function of sequentially selecting the switching circuits 5602_1 to 5602_N by sequentially outputting H-level signals (also referred to as H signals or signals at high power supply potential level) to wirings 5605_1 to 5605_N.

The switching circuit 5602_1 has a function of controlling a conduction state between the wirings 5604_1 to 5604_$k$ and the signal lines S1 to Sk (electrical continuity between the first terminals and the second terminals), that is, a function of controlling whether potentials of the wirings 5604_1 to 5604_$k$ are supplied to the signal lines S1 to Sk. In this manner, the switching circuit 5602_1 functions as a selector. Moreover, the thin film transistors 5603_1 to 5603_$k$ have functions of controlling conduction states between the wirings 5604_1 to 5604_$k$ and the signal lines S1 to Sk, respectively, that is, a function of controlling whether potentials of the wirings 5604_1 to 5604_$k$ are supplied to the signal lines S1 to Sk, respectively. In this manner, each of the thin film transistors 5603_1 to 5603_$k$ functions as a switch.

The video signal data (DATA) is input to each of the wirings 5604_1 to 5604_$k$. The video signal data (DATA) is often an analog signal corresponding to image data or an image signal.

Next, the operation of the signal line driver circuit in FIG. 15A is described with reference to a timing chart in FIG. 15B. FIG. 15B illustrates examples of signals Sout_1 to Sout_N and signals Vdata_1 to Vdata_k. The signals Sout_1 to Sout_N are examples of output signals from the shift register 5601. The signals Vdata_1 to operation period of the signal line driver circuit corresponds to one gate selection period in a display device. For example, one gate selection period is divided into periods T1 to TN. Each of the periods T1 to TN is a period for writing the video signal data (DATA) into a pixel that belongs to a selected row.

Note that signal waveform distortion and the like in each structure illustrated in drawings or the like in this embodiment are exaggerated for simplicity in some cases. Therefore, this embodiment is not necessarily limited to the scale illustrated in the drawing or the like.

In the periods T1 to TN, the shift register 5601 outputs H-level signals sequentially to the wirings 5605_1 to 5605_N. For example, in the period T1, the shift register 5601 outputs a high-level signal to the wiring 5605_1. Then, the thin film transistors 5603_1 to 5603_$k$ are turned on, so that the wirings 5604_1 to 5604_$k$ and the signal lines S1 to Sk are brought into conduction. At this time, Data(S1) to Data(Sk) are input to the wirings 5604_1 to 5604_$k$, respectively.

The Data(S1) to Data(Sk) are written into pixels in a first to kth columns in a selected row through the thin film transistors 5603_1 to 5603_$k$, respectively. In such a manner, in the periods T1 to TN, the video signal data (DATA) are sequentially written into the pixels in the selected row by k columns.

The video signal data (DATA) are written into pixels by a plurality of columns as described above, whereby the number of video signal data (DATA) or the number of wirings can be reduced. Consequently, the number of connections with an external circuit can be reduced. Moreover, the time for writing can be extended when video signals are written into pixels by a plurality of columns; thus, insufficient writing of video signals can be prevented.

Note that any of the circuits constituted by the thin film transistors in Embodiments 1 to 4 can be used for the shift register 5601 and the switching circuit 5602.

One embodiment of a shift register which is used for part of the scan line driver circuit and/or the signal line driver circuit is described with reference to FIGS. 16A to 16C and FIGS. 17A and 17B.

The scan line driver circuit includes a shift register. Additionally, the scan line driver circuit may include a level shifter, a buffer, or the like in some cases. In the scan line driver circuit, a clock signal (CLK) and a start pulse signal (SP) are input to the shift register, so that a selection signal is generated. The selection signal generated is buffered and amplified by the buffer, and the resulting signal is supplied to a corresponding scan line. Gate electrodes of transistors in pixels of one line are connected to a scan line. Since the transistors in the pixels of one line have to be turned on all at once, a buffer that can supply large current is used.

Figure 16A:
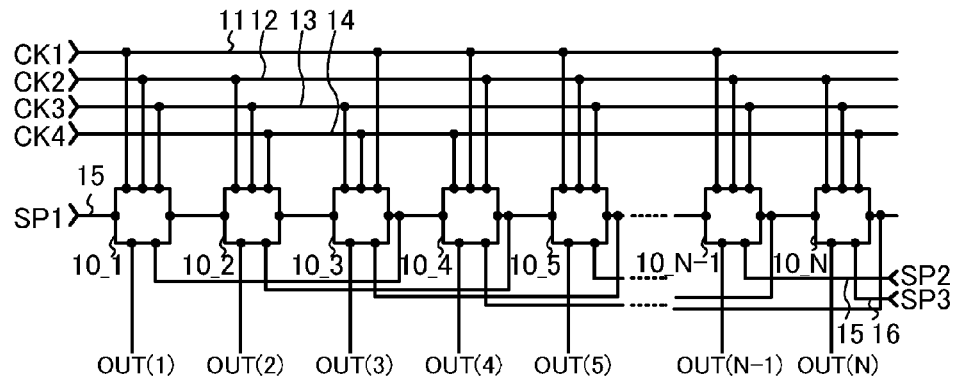
FIGS. 16A to 16C are circuit diagrams each illustrating a configuration of a shift register.

The shift register includes a first to Nth pulse output circuits 10_1 to 10_N (N is a natural number greater than or equal to 3) (see FIG. 16A). In the shift register illustrated in FIG. 16A, a first clock signal CK1, a second clock signal CK2, a third clock signal CK3, and a fourth clock signal CK4 are supplied from a first wiring 11, a second wiring 12, a third wiring 13, and a fourth wiring 14, respectively, to the first to Nth pulse output circuits 10_1 to 10_N. A start pulse SP1 (a first start pulse) is input from a fifth wiring 15 to the first pulse output circuit 10_1. To the nth pulse output circuit 10_$n$ of the second or subsequent stage (n is a natural number greater than or equal to 2 and less than or equal to N), a signal from the pulse output circuit of the previous stage (such a signal is referred to as a previous-stage signal OUT(n−1)) is input. To the first pulse output circuit 10_1, a signal from the third pulse output circuit 10_3 of the stage following the next stage is input. In a similar manner, to the nth pulse output circuit 10_$n$ of the second or subsequent stage, a signal from the (n+2)th pulse output circuit 10_(n+2) of the stage following the next stage (such a signal is referred to as a subsequent-stage signal OUT(n+2)) is input. Thus, the pulse output circuits of the respective stages output first output signals (OUT(1)(SR) to OUT(N)(SR)) to be input to the pulse output circuits of the subsequent stages and/or the pulse output circuits of the previous stages and second output signals (OUT(1) to OUT(N)) to be input to different circuits or the like. Note that since the subsequent-stage signal OUT(n+2) is not input to the last two stages of the shift register as illustrated in FIG. 16A, a second start pulse SP2 and a third start pulse SP3 may be additionally input to the stage before the last stage and the last stage, respectively, for example.

Note that a clock signal (CK) is a signal that alternates between an H-level and an L-level (also referred to as an L signal or a signal at low power supply potential level) at regular intervals. Here, the first clock signal (CK1) to the fourth clock signal (CK4) are delayed by ¼ cycle sequentially. In this embodiment, driving of the pulse output circuit is controlled with the first to fourth clock signals (CK1) to (CK4). Note that the clock signal is also referred to as GCK or SCK in some cases depending on a driver circuit to which the clock signal is input; the clock signal is referred to as CK in the following description.

Figure 16B:
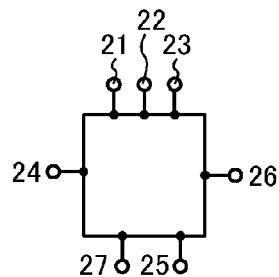

FIG. 16B is one of the pulse output circuits 10_N shown in FIG. 16A. A first input terminal 21, a second input terminal 22, and a third input terminal 23 are electrically connected to any of the first to fourth wirings 11 to 14. For example, in the first pulse output circuit 10_1 in FIG. 16A, the first input terminal 21 is electrically connected to the first wiring 11, the second input terminal 22 is electrically connected to the second wiring 12, and the third input terminal 23 is electrically connected to the third wiring 13. In the second pulse output circuit 10_2, the first input terminal 21 is electrically connected to the second wiring 12, the second input terminal 22 is electrically connected to the third wiring 13, and the third input terminal 23 is electrically connected to the fourth wiring 14.

Each of the first to Nth pulse output circuits 10_1 to 10_N is assumed to include the first input terminal 21, the second input terminal 22, the third input terminal 23, a fourth input terminal 24, a fifth input terminal 25, a first output terminal 26, and a second output terminal 27 (see FIG. 16B). In the first pulse output circuit 10_1, the first clock signal CK1 is input to the first input terminal 21; the second clock signal CK2 is input to the second input terminal 22; the third clock signal CK3 is input to the third input terminal 23; a start pulse is input to the fourth input terminal 24; a subsequent-stage signal OUT(3) is input to the fifth input terminal 25; the first output signal OUT(1)(SR) is output from the first output terminal 26; and the second output signal OUT(1) is output from the second output terminal 27.

In the first to Nth pulse output circuits 10_1 to 10_N, the thin film transistor (TFT) having four terminals described in the above embodiment can be used in addition to a thin film transistor having three terminals. Note that in this specification, when a thin film transistor has two gate electrodes with a semiconductor layer therebetween, the gate electrode below the semiconductor layer is called a lower gate electrode and the gate electrode above the semiconductor layer is called an upper gate electrode.

When an oxide semiconductor is used for a semiconductor layer including a channel formation region in a thin film transistor, the threshold voltage sometimes shifts in the positive or negative direction depending on a manufacturing process. For that reason, the thin film transistor in which an oxide semiconductor is used for a semiconductor layer including a channel formation region preferably has a structure with which the threshold voltage can be controlled. The threshold voltage of a thin film transistor with four terminals can be controlled to be a desired value by providing the gate electrodes over and under the channel formation region of the thin film transistor with gate insulating films therebetween and controlling a potential of the upper gate electrode and/or the lower gate electrode.

Next, an example of a specific circuit configuration of the pulse output circuit illustrated in FIG. 16B will be described with reference to FIG. 16C.

Figure 16C:
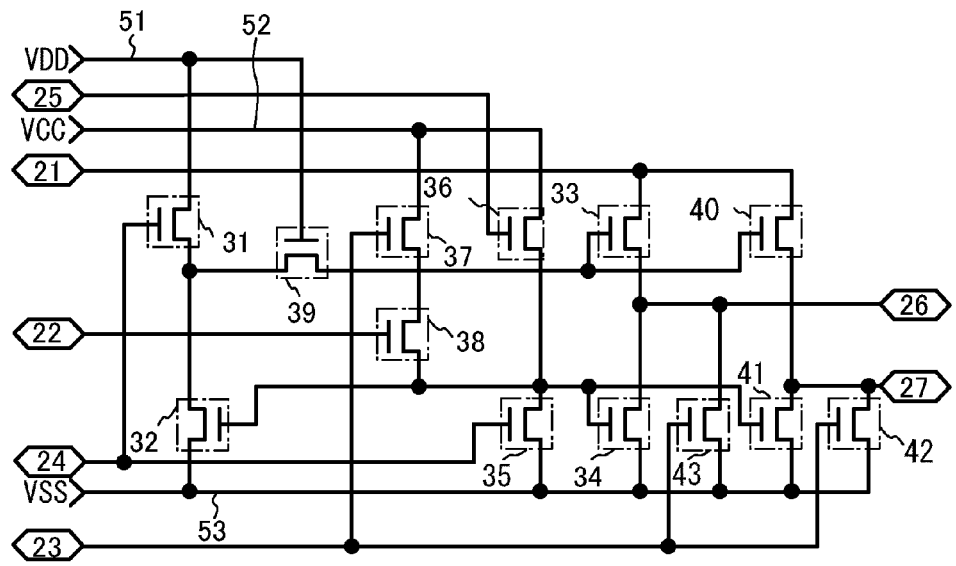

The pulse output circuit illustrated in FIG. 16B includes a first to thirteenth transistors 31 to 43 (see FIG. 16C). A signal or power supply potential is supplied to the first to thirteenth transistors 31 to 43 from a power supply line 51 to which a first high power supply potential VDD is supplied, a power supply line 52 to which a second high power supply potential VCC is supplied, and a power supply line 53 to which a low power supply potential VSS is supplied, in addition to the first to fifth input terminals 21 to 25, the first output terminal 26, and the second output terminal 27. The relation of the power supply potentials of the power supply lines in FIG. 16C is as follows: the first power supply potential VDD is higher than or equal to the second power supply potential VCC, and the second power supply potential VCC is higher than the third power supply potential VSS. Note that the first to fourth clock signals (CK1) to (CK4) each alternate between an H-level and an L-level at regular intervals; the clock signal at H level is VDD and the clock signal at L level is VSS. By making the potential VDD of the power supply line 51 higher than the potential VCC of the power supply line 52, a potential applied to the gate electrode of the transistor can be lowered, shift in threshold voltage of the transistor can be reduced, and degradation of the transistor can be suppressed without an adverse effect on the operation of the transistor. A thin film transistor with four terminals is preferably used as each of the first transistor 31 and the sixth to ninth transistors 36 to 39 among the first to thirteenth transistors 31 to 43. The first transistor 31 and the sixth to ninth transistors 36 to 39 each need to operate so that a potential of a node to which one electrode serving as a source or a drain is connected is switched with a control signal of a gate electrode, and can further reduce a malfunction of the pulse output circuit since response to the control signal input to the gate electrode is fast (the rise of on-state current is steep). Thus, by using the thin film transistor with four terminals, the threshold voltage can be controlled, and a malfunction of the pulse output circuit can be further reduced.

In FIG. 16C, a first terminal of the first transistor 31 is electrically connected to the power supply line 51, a second terminal of the first transistor 31 is electrically connected to a first terminal of the ninth transistor 39, and gate electrodes (a lower gate electrode and an upper gate electrode) of the first transistor 31 are electrically connected to the fourth input terminal 24. A first terminal of the second transistor 32 is electrically connected to the power supply line 53, a second terminal of the second transistor 32 is electrically connected to the first terminal of the ninth transistor 39, and a gate electrode of the second transistor 32 is electrically connected to a gate electrode of the fourth transistor 34. A first terminal of the third transistor 33 is electrically connected to the first input terminal 21, and a second terminal of the third transistor 33 is electrically connected to the first output terminal 26. A first terminal of the fourth transistor 34 is electrically connected to the power supply line 53, and a second terminal of the fourth transistor 34 is electrically connected to the first output terminal 26. A first terminal of the fifth transistor 35 is electrically connected to the power supply line 53, a second terminal of the fifth transistor 35 is electrically connected to the gate electrode of the second transistor 32 and the gate electrode of the fourth transistor 34, and a gate electrode of the fifth transistor 35 is electrically connected to the fourth input terminal 24. A first terminal of the sixth transistor 36 is electrically connected to the power supply line 52, a second terminal of the sixth transistor 36 is electrically connected to the gate electrode of the second transistor 32 and the gate electrode of the fourth transistor 34, and gate electrodes (a lower gate electrode and an upper gate electrode) of the sixth transistor 36 are electrically connected to the fifth input terminal 25. A first terminal of the seventh transistor 37 is electrically connected to the power supply line 52, a second terminal of the seventh transistor 37 is electrically connected to a second terminal of the eighth transistor 38, and gate electrodes (a lower gate electrode and an upper gate electrode) of the seventh transistor 37 are electrically connected to the third input terminal 23. A first terminal of the eighth transistor 38 is electrically connected to the gate electrode of the second transistor 32 and the gate electrode of the fourth transistor 34, and gate electrodes (a lower gate electrode and an upper gate electrode) of the eighth transistor 38 are electrically connected to the second input terminal 22. The first terminal of the ninth transistor 39 is electrically connected to the second terminal of the first transistor 31 and the second terminal of the second transistor 32, a second terminal of the ninth transistor 39 is electrically connected to a gate electrode of the third transistor 33 and a gate electrode of the tenth transistor 40, and gate electrodes (a lower gate electrode and an upper gate electrode) of the ninth transistor 39 are electrically connected to the power supply line 51. A first terminal of the tenth transistor 40 is electrically connected to the first input terminal 21, a second terminal of the tenth transistor 40 is electrically connected to the second output terminal 27, and the gate electrode of the tenth transistor 40 is electrically connected to the second terminal of the ninth transistor 39. A first terminal of the eleventh transistor 41 is electrically connected to the power supply line 53, a second terminal of the eleventh transistor 41 is electrically connected to the second output terminal 27, and a gate electrode of the eleventh transistor 41 is electrically connected to the gate electrode of the second transistor 32 and the gate electrode of the fourth transistor 34. A first terminal of the twelfth transistor 42 is electrically connected to the power supply line 53, a second terminal of the twelfth transistor 42 is electrically connected to the second output terminal 27, and a gate electrode of the twelfth transistor 42 is electrically connected to the gate electrodes (the lower gate electrode and the upper gate electrode) of the seventh transistor 37. A first terminal of the thirteenth transistor 43 is electrically connected to the power supply line 53, a second terminal of the thirteenth transistor 43 is electrically connected to the first output terminal 26, and a gate electrode of the thirteenth transistor 43 is electrically connected to the gate electrodes (the lower gate electrode and the upper gate electrode) of the seventh transistor 37.

In FIG. 16C, a portion where the gate electrode of the third transistor 33, the gate electrode of the tenth transistor 40, and the second terminal of the ninth transistor 39 are connected is referred to as a node A. Moreover, a portion where the gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 are connected is referred to as a node B.

Figure 17A:
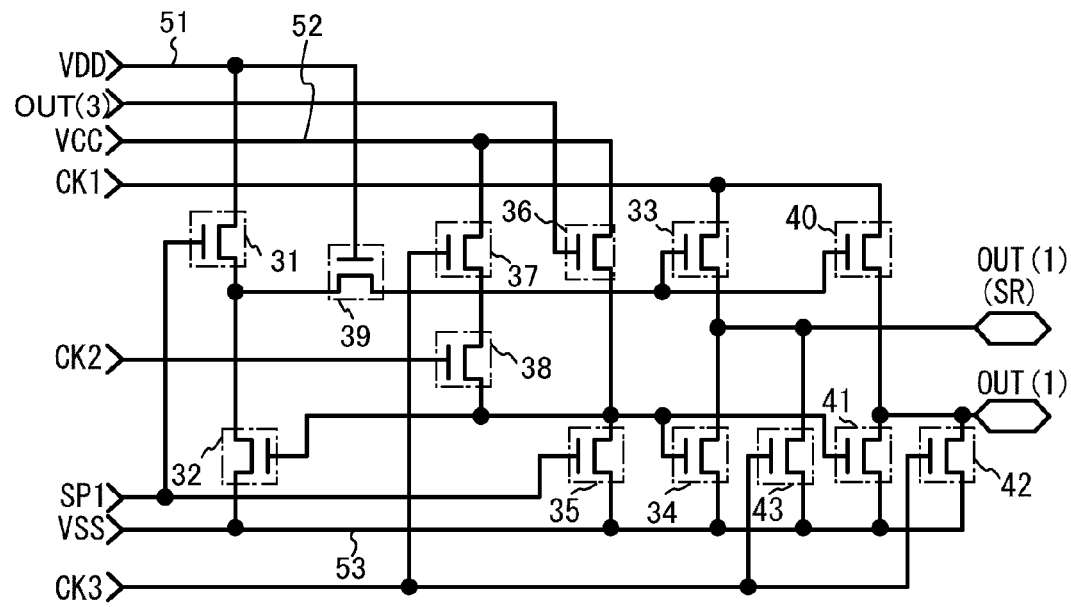
FIGS. 17A and 17B are a circuit diagram and a timing chart illustrating operations of a shift register, respectively.

FIG. 17A illustrates signals that are input to or output from the first to fifth input terminals 21 to 25 and the first and second output terminals 26 and 27 in the case where the pulse output circuit illustrated in FIG. 16C is applied to the first pulse output circuit 10_1.

Specifically, the first clock signal CK1 is input to the first input terminal 21; the second clock signal CK2 is input to the second input terminal 22; the third clock signal CK3 is input to the third input terminal 23; the start pulse (SP1) is input to the fourth input terminal 24; the subsequent-stage signal OUT(3) is input to the fifth input terminal 25; the first output signal OUT(1)(SR) is output from the first output terminal 26; and the second output signal OUT(1) is output from the second output terminal 27.

Note that a thin film transistor is an element having at least three terminals of a gate, a drain, and a source. The thin film transistor has a semiconductor including a channel region formed in a region overlapping with the gate. Current that flows between the drain and the source through the channel region can be controlled by controlling a potential of the gate.

Here, since the source and the drain of the thin film transistor may change depending on the structure, the operating condition, and the like of the thin film transistor, it is difficult to define which is a source or a drain. Therefore, a region functioning as the source or the drain is not called the source or the drain in some cases. In that case, for example, such regions may be referred to as a first terminal and a second terminal.

Note that in FIG. 16C and FIG. 17A, a capacitor for performing bootstrap operation by bringing the node A into a floating state may be additionally provided. Furthermore, a capacitor having one electrode electrically connected to the node B may be additionally provided in order to hold a potential of the node B.

Figure 17B:
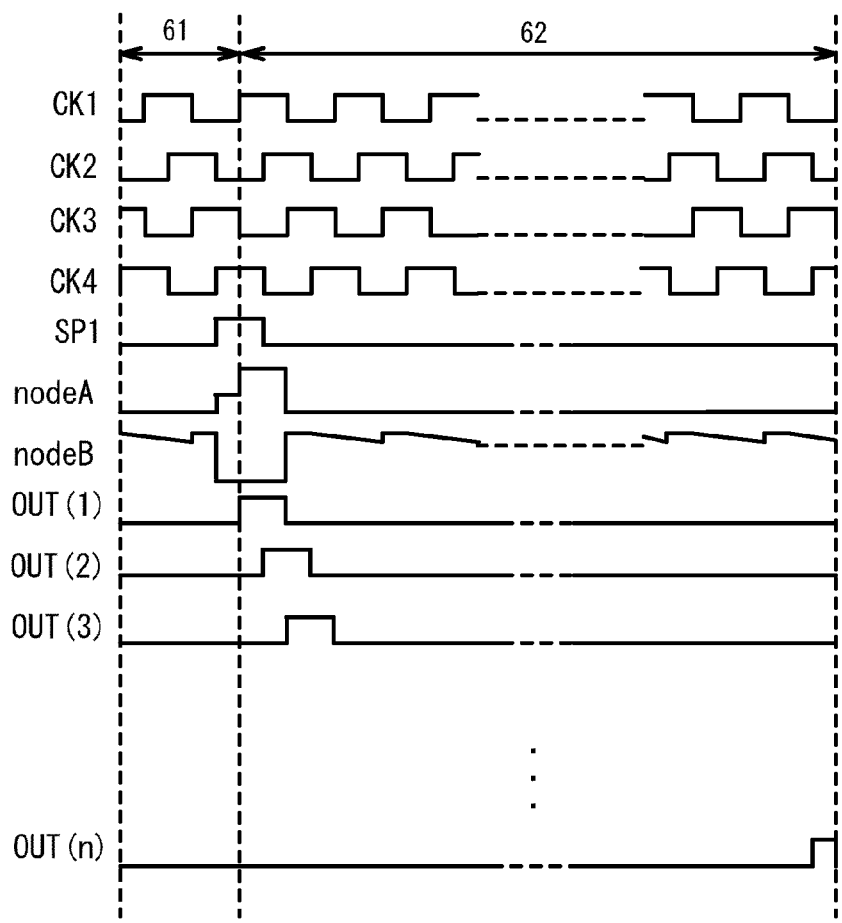

FIG. 17B illustrates a timing chart of a shift register including a plurality of pulse output circuits illustrated in FIG. 17A. Note that when the shift register is the one of a scan line driver circuit, a period 61 in FIG. 17B corresponds to a vertical retrace period and a period 62 corresponds to a gate selection period.

Note that the placement of the ninth transistor 39 in which the second power supply potential VCC is applied to the gate electrode as illustrated in FIG. 17A has the following advantages before and after bootstrap operation.

Without the ninth transistor 39 in which the second power supply potential VCC is applied to the gate electrode, if a potential of the node A is raised by bootstrap operation, a potential of the source which is the second terminal of the first transistor 31 rises to a value higher than the first power supply potential VDD. Then, the source of the first transistor 31 is switched to the first terminal, that is, the terminal on the power supply line 51 side. Consequently, in the first transistor 31, high bias voltage is applied and thus significant stress is applied between the gate and the source and between the gate and the drain, which might cause deterioration of the transistor. On the other hand, with the ninth transistor 39 in which the second power supply potential VCC is applied to the gate electrode, increase in the potential of the second terminal of the first transistor 31 can be prevented while the potential of the node A is raised by bootstrap operation. In other words, the placement of the ninth transistor 39 can lower the level of negative bias voltage applied between the gate and the source of the first transistor 31. Thus, the circuit configuration in this embodiment can reduce negative bias voltage applied between the gate and the source of the first transistor 31, so that deterioration of the first transistor 31 due to stress can be suppressed.

Note that the ninth transistor 39 can be provided anywhere as long as the first terminal and the second terminal of the ninth transistor 39 are connected between the second terminal of the first transistor 31 and the gate of the third transistor 33. Note that in the case of the shift register including a plurality of pulse output circuits in this embodiment in a signal line driver circuit having a larger number of stages than a scan line driver circuit, the ninth transistor 39 can be omitted, which is advantageous in that the number of transistors is reduced.

Note that an oxide semiconductor is used for a semiconductor layer of each of the first to thirteenth transistors 31 to 43, whereby the off-state current of the thin film transistors can be reduced, the on-state current and field effect mobility can be increased, and the degree of degradation of the transistors can be reduced. Thus, a malfunction in the circuit can be reduced. Moreover, the degree of deterioration of the transistor using an oxide semiconductor by application of a high potential to a gate electrode is smaller than that of a transistor using amorphous silicon. Consequently, similar operation can be obtained even when the first power supply potential VDD is supplied to the power supply line to which the second power supply potential VCC is supplied, and the number of power supply lines placed between circuits can be reduced; thus, the size of the circuit can be reduced.

Note that a similar function is obtained even when the connection relation is changed so that a clock signal that is supplied to the gate electrodes (the lower gate electrode and the upper gate electrode) of the seventh transistor 37 from the third input terminal 23 and a clock signal that is supplied to the gate electrodes (the lower gate electrode and the upper gate electrode) of the eighth transistor 38 from the second input terminal 22 are supplied from the second input terminal 22 and the third input terminal 23, respectively. In the shift register illustrated in FIG. 17A, a state of the seventh transistor 37 and the eighth transistor 38 is changed so that both the seventh transistor 37 and the eighth transistor 38 are on, then the seventh transistor 37 is off and the eighth transistor 38 is on, and then the seventh transistor 37 and the eighth transistor 38 are off; thus, the fall in potential of the node B due to fall in potentials of the second input terminal 22 and the third input terminal 23 is caused twice by fall in potential of the gate electrode of the seventh transistor 37 and fall in potential of the gate electrode of the eighth transistor 38. On the other hand, in the shift register illustrated in FIG. 17A, when a state of the seventh transistor 37 and the eighth transistor 38 is changed as in the period in FIG. 17B so that both the seventh transistor 37 and the eighth transistor 38 are on, then the seventh transistor 37 is on and the eighth transistor 38 is off, and then the seventh transistor 37 and the eighth transistor 38 are off, the fall in potential of the node B due to fall in potentials of the second input terminal 22 and the third input terminal 23 occurs only once, which is caused by fall in potential of the gate electrode of the eighth transistor 38. Consequently, the connection relation, in which the clock signal CK3 is supplied to the gate electrodes (the lower gate electrode and the upper gate electrode) of the seventh transistor 37 from the third input terminal 23 and the clock signal CK2 is supplied to the gate electrodes (the lower gate electrode and the upper gate electrode) of the eighth transistor 38 from the second input terminal 22, is preferable. That is because the number of times of the change in the potential of the node B can be reduced, whereby the noise can be reduced.

In such a manner, an H-level signal is regularly supplied to the node B in a period during which the potentials of the first output terminal 26 and the second output terminal 27 are held at L level; thus, a malfunction of the pulse output circuit can be suppressed.

Embodiment 9

According to one embodiment of the present invention, thin film transistors are manufactured, and a semiconductor device having a display function (also referred to as a display device) can be manufactured using the thin film transistors in a pixel portion and also in a driver circuit. Moreover, part of the driver circuit or the entire driver circuit, which includes a thin film transistor, can be formed over a substrate where a pixel portion is formed, whereby a system-on-panel can be obtained.

The display device includes a display element. As the display element, a liquid crystal element (also referred to as a liquid crystal display element) or a light-emitting element (also referred to as a light-emitting display element) can be used. The light-emitting element includes an element whose luminance is controlled by current or voltage in its category, and specifically includes an inorganic electroluminescent (EL) element, an organic EL element, and the like in its category. Furthermore, a display medium whose contrast is changed by an electric effect, such as electronic ink, can be used.

In addition, the display device includes a panel in which the display element is sealed, and a module in which an IC or the like including a controller is mounted on the panel. Furthermore, an element substrate, which corresponds to one embodiment before the display element is completed in a manufacturing process of the display device, is provided with a means for supplying current to the display element in each of a plurality of pixels. Specifically, the element substrate may be in a state in which only a pixel electrode (also referred to as a pixel electrode layer) of the display element is formed, a state after formation of a conductive film to be a pixel electrode and before etching of the conductive film to form the pixel electrode, or any other state.

Note that a display device in this specification refers to an image display device, a display device, or a light source (including a lighting device). Further, the display device includes the following modules in its category: a module including a connector such as a flexible printed circuit (FPC), a tape automated bonding (TAB) tape, or a tape carrier package (TCP); a module having a TAB tape or a TCP that is provided with a printed wiring board at the end thereof; and a module having an integrated circuit (IC) that is directly mounted on a display element with a chip on glass (COG) method.

Figures 1, 10A:
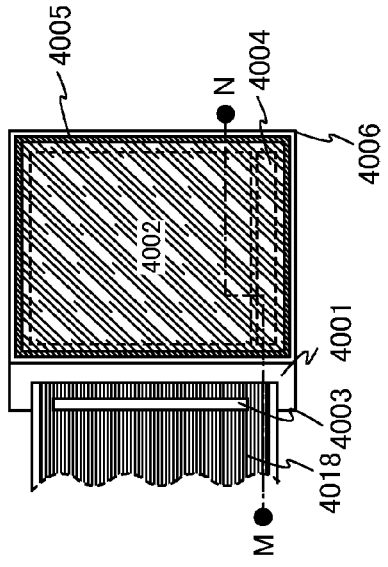
Figures 2, 10A:
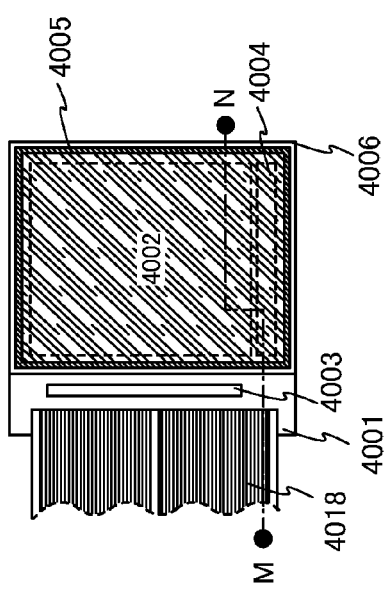
Figure 10B:
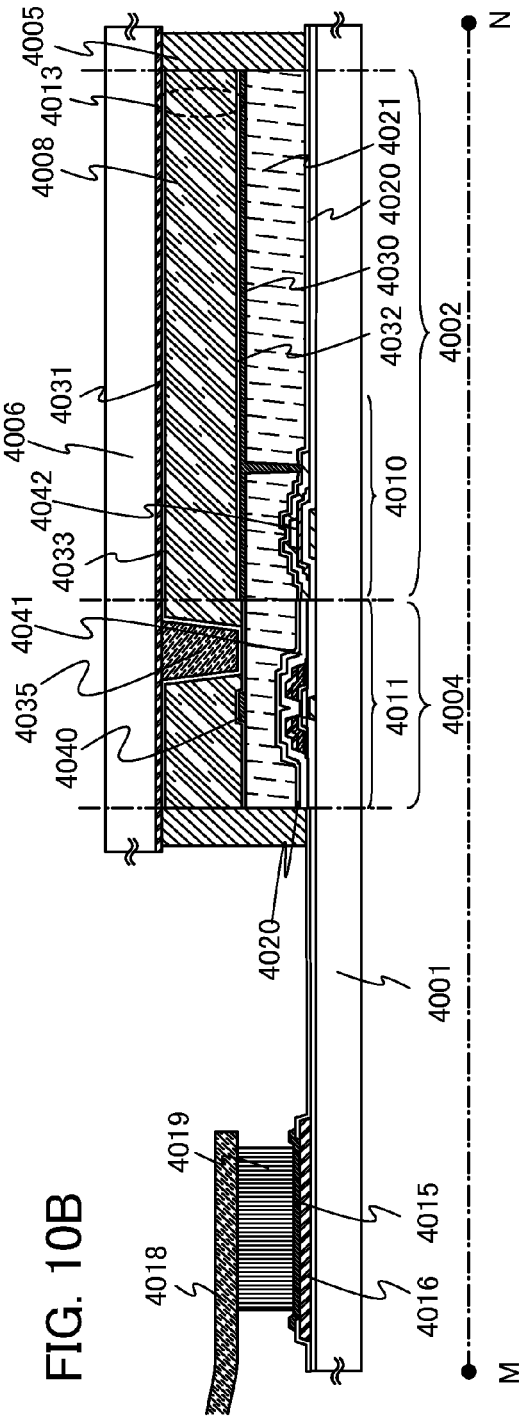

The appearance and a cross section of a liquid crystal display panel, which is one embodiment of a semiconductor device, will be described with reference to FIGS. 10A-1, 10A-2, and 10B. FIGS. 10A-1 and 10A-2 are plan views of panels in which thin film transistors 4010 and 4011 and a liquid crystal element 4013 are sealed between a first substrate 4001 and a second substrate 4006 with a sealant 4005. FIG. 10B is a cross-sectional view along M-N in FIGS. 10A-1 and 10A-2.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that there is no particular limitation on the connection method of the driver circuit which is separately formed, and a COG method, a wire bonding method, a TAB method, or the like can be used. FIG. 10A-1 illustrates an example in which the signal line driver circuit 4003 is mounted with a COG method. FIG. 10A-2 illustrates an example in which signal line driver circuit 4003 is mounted with a TAB method.

The pixel portion 4002 and the scan line driver circuit 4004 provided over the first substrate 4001 include a plurality of thin film transistors. FIG. 10B illustrates the thin film transistor 4010 included in the pixel portion 4002 and the thin film transistor 4011 included in the scan line driver circuit 4004, as an example. An insulating layer 4041, a protective insulating layer 4020, and an insulating layer 4021 are provided over the thin film transistors 4010 and 4011. The thin film transistor 4010 includes a channel protective layer 4042.

Any of the highly reliable thin film transistors including the oxide semiconductor layers which are described in Embodiments 1 to 4 can be used as the thin film transistors 4010 and 4011. The thin film transistor 460 or the thin film transistor 499 described in Embodiments 1 to 4 can be used as the thin film transistor 4011 for the driver circuit. The thin film transistor 470 or the thin film transistor 498 can be used in combination as the thin film transistor 4010 for a pixel. In this embodiment, the thin film transistors 4010 and 4011 are n-channel thin film transistors.

A conductive layer 4040 is provided over part of the insulating layer 4021, which overlaps with a channel formation region of an oxide semiconductor layer in the thin film transistor 4011 for the driver circuit. The conductive layer 4040 is provided at the position overlapping with the channel formation region of the oxide semiconductor layer, whereby the amount of change in threshold voltage of the thin film transistor 4011 before and after the BT test can be reduced. A potential of the conductive layer 4040 may be the same or different from that of a gate electrode layer of the thin film transistor 4011. The conductive layer 4040 can also function as a second gate electrode layer. Alternatively, the potential of the conductive layer 4040 may be GND or 0 V, or the conductive layer 4040 may be in a floating state.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 functioning as alignment films, respectively, and the liquid crystal layer 4008 is sandwiched between the pixel electrode layer 4030 and the counter electrode layer 4031 with the insulating layers 4032 and 4033 therebetween.

Note that a light-transmitting substrate can be used as the first substrate 4001 and the second substrate 4006; glass, ceramics, or plastics can be used. As plastics, a fiberglass-reinforced plastics (FRP) plate, a polyvinyl fluoride (PVF) film, a polyester film, or an acrylic resin film can be used.

A columnar spacer 4035 is obtained by selective etching of an insulating film and provided in order to control the distance (a cell gap) between the pixel electrode layer 4030 and the counter electrode layer 4031. Alternatively, a spherical spacer may be used. The counter electrode layer 4031 is electrically connected to a common potential line formed over the substrate where the thin film transistor 4010 is formed. The counter electrode layer 4031 and the common potential line can be electrically connected to each other through conductive particles arranged between a pair of substrates using the common connection portion. Note that the conductive particles are included in the sealant 4005.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase is only generated within a relatively narrow range of temperature, a liquid crystal composition containing a chiral agent at 5 wt % or more is used for the liquid crystal layer 4008 in order to improve the temperature range. The liquid crystal composition including liquid crystal exhibiting a blue phase and a chiral agent has a short response time of 1 msec or less and is optically isotropic; therefore, alignment treatment is not necessary and viewing angle dependence is small.

Note that this embodiment can also be applied to a transflective liquid crystal display device in addition to a transmissive liquid crystal display device.

In the example of the liquid crystal display device, a polarizing plate is provided on the outer surface of the substrate (on the viewer side) and a coloring layer (a color filter) and an electrode layer used for a display element are sequentially provided on the inner surface of the substrate; alternatively, the polarizing plate may be provided on the inner surface of the substrate. The layered structure of the polarizing plate and the coloring layer is not limited to that in this embodiment and may be set as appropriate depending on materials of the polarizing plate and the coloring layer or conditions of the manufacturing process. Further, a light-blocking film serving as a black matrix may be provided except in the display portion.

The protective insulating layer 4020 is formed over the thin film transistors 4010 and 4011. Here, a silicon nitride film is formed as the protective insulating layer 4020 with an RF sputtering method. Note that the protective insulating layer 4020 may be formed using a material and a method which are similar to those of the protective insulating layer 453 described in Embodiment 1.

The insulating layer 4021 is formed as a planarization insulating film. The insulating layer 4021 can be formed using a material and a method which are similar to those of the planarization insulating layer 454 described in Embodiment 1, and a heat-resistant organic material such as an acrylic resin, polyimide, a benzocyclobutene resin, polyamide, or an epoxy resin can be used. Other than such organic materials, it is also possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating films formed using any of these materials.

In this embodiment, a plurality of thin film transistors in the pixel portion may be surrounded together by a nitride insulating film. It is possible to use a nitride insulating film as the protective insulating layer 4020 and the gate insulating layer and to provide a region where the protective insulating layer 4020 is in contact with the gate insulating layer so as to surround at least the periphery of the pixel portion over the active matrix substrate as illustrated in FIGS. 10A-1, 10A-2, and 10B. In this manufacturing process, moisture can be prevented from entering from the outside. Moreover, entry of moisture from the outside can be prevented in the long term even after a device is completed as a semiconductor device, for example, as a display device; thus, the long-term reliability of the device can be achieved.

Note that a siloxane-based resin corresponds to a resin including a Si—O—Si bond formed using a siloxane-based material as a starting material. The siloxane-based resin may include an organic group (e.g., an alkyl group or an aryl group) or a fluoro group as a substituent. Moreover, the organic group may include a fluoro group.

There is no particular limitation on the method of forming the insulating layer 4021, and the following method or means can be employed depending on the material: a method such as a sputtering method, an SOG method, a spin coating method, a dipping method, a spray coating method, or a droplet discharge method (e.g., an ink-jet method, screen printing, or offset printing), or a tool such as a doctor knife, a roll coater, a curtain coater, or a knife coater. The baking step of the insulating layer 4021 also serves as annealing of the semiconductor layer, whereby a semiconductor device can be efficiently manufactured.

The pixel electrode layer 4030 and the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (ITO), indium zinc oxide, or indium tin oxide to which silicon oxide is added.

Alternatively, a conductive composition including a conductive high molecule (also referred to as a conductive polymer) can be used for the pixel electrode layer 4030 and the counter electrode layer 4031. The pixel electrode formed using the conductive composition preferably has a sheet resistance of less than or equal to 10000 ohms per square and a light transmittance of greater than or equal to 70% at a wavelength of 550 nm. Further, the resistivity of the conductive high molecule included in the conductive composition is preferably less than or equal to 0.1 Ω·cm.

As the conductive high molecule, a so-called π-electron conjugated conductive polymer can be used. Examples are polyaniline and a derivative thereof, polypyrrole and a derivative thereof, polythiophene and a derivative thereof, and a copolymer of two or more kinds of these materials.

Further, a variety of signals and potentials are supplied to the signal line driver circuit 4003 which is separately formed, the scan line driver circuit 4004, or the pixel portion 4002 from an FPC 4018.

A connection terminal electrode 4015 is formed using the same conductive film as the pixel electrode layer 4030 included in the liquid crystal element 4013. A terminal electrode 4016 is formed using the same conductive film as source and drain electrode layers of the thin film transistor 4011.

The connection terminal electrode 4015 is electrically connected to a terminal included in the FPC 4018 through an anisotropic conductive film 4019.

Note that FIGS. 10A-1, 10A-2, and 10B illustrate the example in which the signal line driver circuit 4003 is formed separately and mounted on the first substrate 4001; however, this embodiment is not limited to this structure. The scan line driver circuit may be separately formed and then mounted, or only part of the signal line driver circuit or part of the scan line driver circuit may be separately formed and then mounted.

Figure 19:
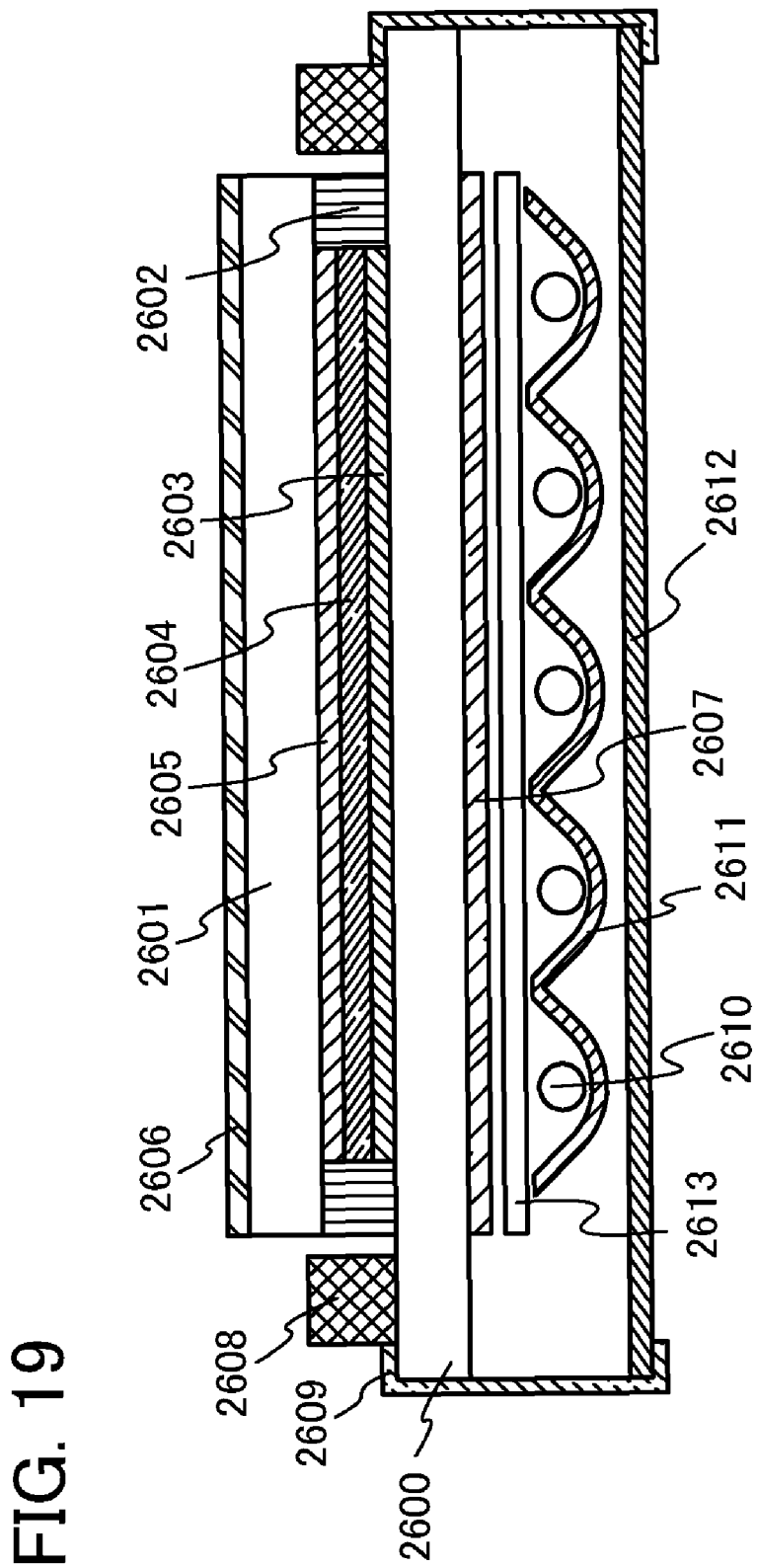
FIG. 19 illustrates a semiconductor device.

FIG. 19 illustrates an example of a liquid crystal display module which is formed as a semiconductor device by using a TFT substrate 2600 manufactured according to the manufacturing method disclosed in this specification.

FIG. 19 illustrates an example of the liquid crystal display module, in which the TFT substrate 2600 and a counter substrate 2601 are fixed to each other with a sealant 2602, and a pixel portion 2603 including a TFT and the like, a display element 2604 including a liquid crystal layer, and a coloring layer 2605 are provided between the substrates to form a display region. The coloring layer 2605 is necessary to perform color display. In the RGB system, coloring layers corresponding to colors of red, green, and blue are provided for pixels. Polarizing plates 2606 and 2607 and a diffusion plate 2613 are provided outside the TFT substrate 2600 and the counter substrate 2601. A light source includes a cold cathode tube 2610 and a reflective plate 2611. A circuit board 2612 is connected to a wiring circuit portion 2608 of the TFT substrate 2600 by a flexible wiring board 2609 and includes an external circuit such as a control circuit or a power source circuit. The polarizing plate and the liquid crystal layer may be stacked with a retardation plate therebetween.

For the liquid crystal display module, a twisted nematic (TN) mode, an in-plane-switching (IPS) mode, a fringe field switching (FFS) mode, a multi-domain vertical alignment (MVA) mode, a patterned vertical alignment (PVA) mode, an axially symmetric aligned micro-cell (ASM) mode, an optically compensated birefringence (OCB) mode, a ferroelectric liquid crystal (FLC) mode, an antiferroelectric liquid crystal (AFLC) mode, or the like can be used.

Through the above steps, a highly reliable liquid crystal display panel can be manufactured as a semiconductor device.

This embodiment can be implemented in appropriate combination with any of the structures described in the other embodiments.

Embodiment 10

In this embodiment, an example of electronic paper will be described as one embodiment of a semiconductor device.

The semiconductor device can be used for electronic paper in which electronic ink is driven by an element electrically connected to a switching element. The electronic paper is also referred to as an electrophoretic display device (an electrophoretic display) and has advantages in that it has the same level of readability as regular paper, it has lower power consumption than other display devices, and it can be made thin and lightweight.

Electrophoretic displays can have various modes. Electrophoretic displays contain a plurality of microcapsules dispersed in a solvent or a solute, each of which contains first particles that are positively charged and second particles that are negatively charged. By applying an electric field to the microcapsules, the particles in the microcapsules move in opposite directions to each other and only the color of the particles gathering on one side is displayed. Note that the first particles and the second particles contain a pigment and do not move without an electric field. Moreover, the first particles and the second particles have different colors (which may be colorless).

In this way, an electrophoretic display utilizes a so-called dielectrophoretic effect by which a substance having a high dielectric constant moves to a high-electric field region. An electrophoretic display device does not need to use a polarizing plate which is required in a liquid crystal display device.

A solution in which the above-described microcapsules are dispersed in a solvent is referred to as electronic ink. This electronic ink can be printed on a surface of glass, plastic, cloth, paper, or the like. Furthermore, color display can be achieved with a color filter or particles including a pigment.

When a plurality of the above-described microcapsules are arranged as appropriate over an active matrix substrate so as to be sandwiched between two electrodes, an active matrix display device can be completed, and display can be performed by application of an electric field to the microcapsules. For example, the active matrix substrate obtained with the use of the thin film transistor in any of Embodiments 1 to 4 can be used.

Note that the first particles and the second particles in the microcapsules may be formed using one of a conductive material, an insulating material, a semiconductor material, a magnetic material, a liquid crystal material, a ferroelectric material, an electroluminescent material, an electrochromic material, and a magnetophoretic material or a composite material of any of these materials.

Figure 18:
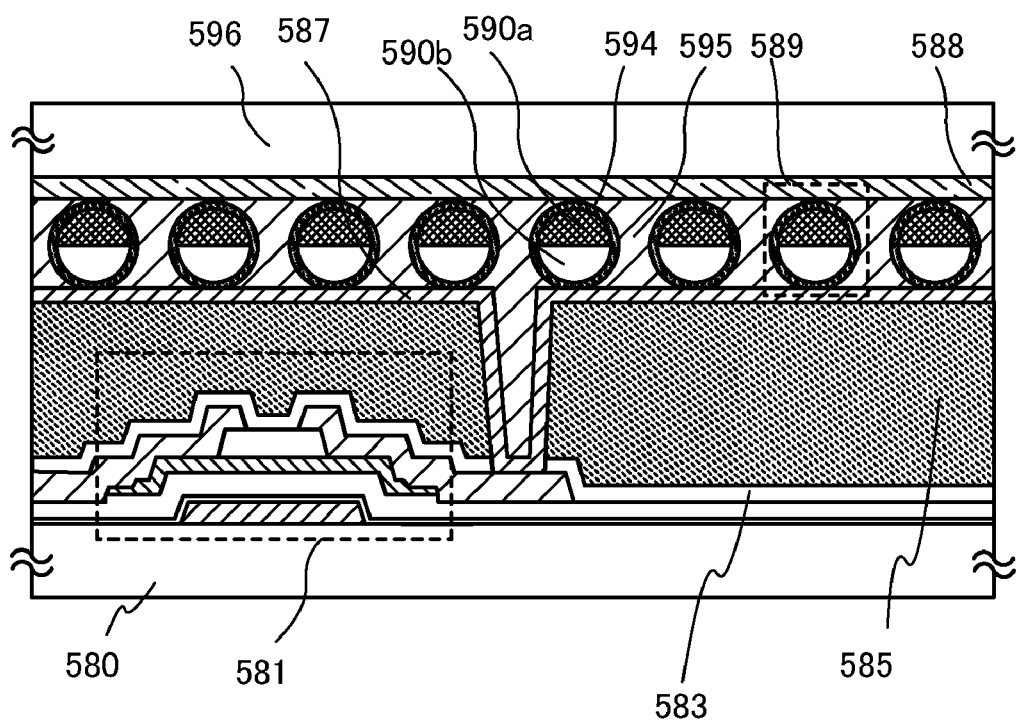
FIG. 18 illustrates a semiconductor device.

FIG. 18 illustrates an active matrix electronic paper as an example of a semiconductor device. A thin film transistor 581 used for the semiconductor device can be formed in a manner similar to that of the thin film transistor described in Embodiment 1 and is a highly reliable thin film transistor including an oxide semiconductor layer. Moreover, any of the thin film transistors described in Embodiments 2 to 4 can also be used as the thin film transistor 581 in this embodiment.

The electronic paper in FIG. 18 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 formed over a substrate 580 is a bottom-gate thin film transistor and covered with an insulating film 583 that is in contact with a semiconductor layer. A source electrode layer or a drain electrode layer of the thin film transistor 581 is in contact with a first electrode layer 587 at an opening formed in the insulating film 583 and an insulating layer 585, whereby the thin film transistor 581 is electrically connected to the first electrode layer 587. Spherical particles 589 are provided between the first electrode layer 587 and a second electrode layer 588 formed on a second substrate 596. Each of the spherical particles 589 includes a black region 590a, a white region 590b, and a cavity 594 filled with liquid around the black region 590a and the white region 590b. A space around the spherical particles 589 is filled with a filler 595 such as a resin. The first electrode layer 587 corresponds to a pixel electrode, and the second electrode layer 588 corresponds to a common electrode. The second electrode layer 588 is electrically connected to a common potential line provided over the substrate where the thin film transistor 581 is formed. With the use of a common connection portion, the second electrode layer 588 and the common potential line can be electrically connected to each other through conductive particles provided between the pair of substrates.

Alternatively, it is possible to use an electrophoretic element instead of the element using the twisting ball. A microcapsule having a diameter of approximately 10 μm to 200 μm, in which transparent liquid, positively charged white microparticles, and negatively charged black microparticles are encapsulated, is used. In the microcapsule provided between the first electrode layer and the second electrode layer, when an electric field is applied by the first electrode layer and the second electrode layer, the white microparticles and the black microparticles move in opposite directions, so that white or black can be displayed. A display element using this principle is an electrophoretic display element, and a device including the electrophoretic display element is called electronic paper in general. The electrophoretic display element has higher reflectance than a liquid crystal display element; thus, an auxiliary light is unnecessary, power consumption is low, and a display portion can be recognized in a dim place. In addition, even when power is not supplied to the display portion, an image which has been displayed once can be maintained. Consequently, a displayed image can be stored even if a semiconductor device having a display function (which may be referred to as a display device simply or a semiconductor device provided with a display device) is kept away from an electric wave source.

Through the above steps, a highly reliable electronic paper can be manufactured as a semiconductor device.

This embodiment can be implemented in appropriate combination with any of the structures described in the other embodiments.

Embodiment 11

An example of a light-emitting display device will be described as a semiconductor device. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to the light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

Inorganic EL elements are classified according to their element structures into a dispersion-type inorganic EL element and a thin-film inorganic EL element. A dispersion-type inorganic EL element includes a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that here, an organic EL element is described as a light-emitting element.

Figure 12:
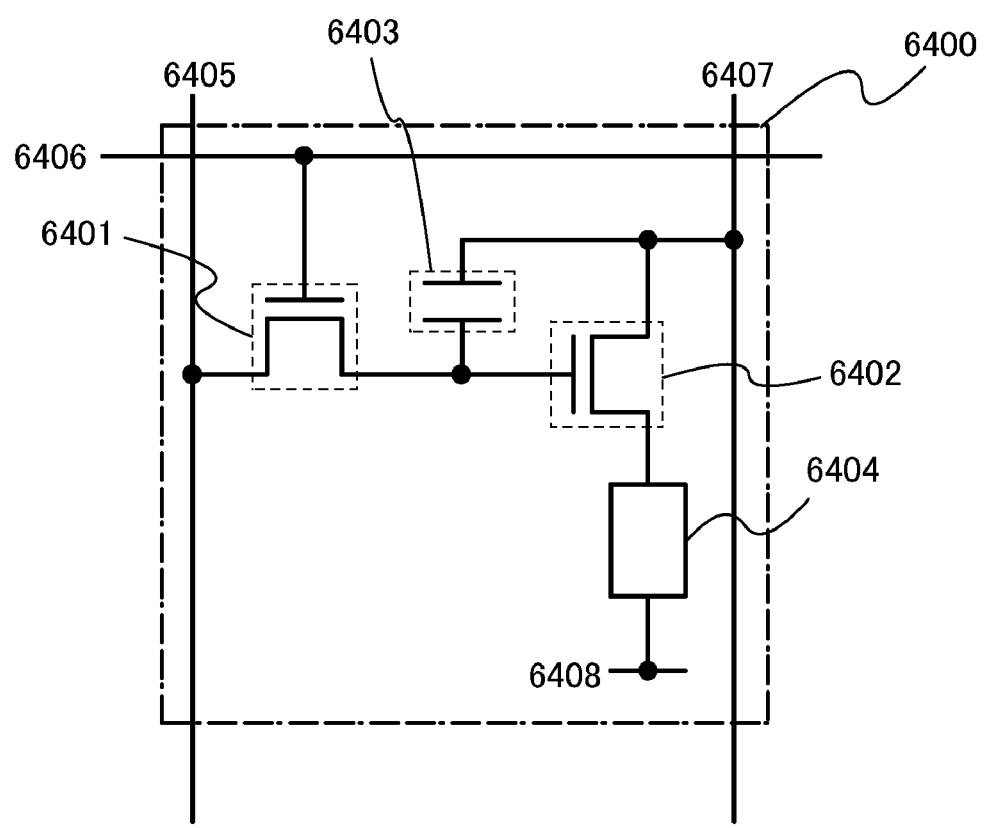
FIG. 12 illustrates an equivalent circuit of a pixel of a semiconductor device.

FIG. 12 illustrates an example of a pixel structure to which digital time grayscale driving can be applied, as an example of a semiconductor device.

A structure and operation of a pixel to which digital time grayscale driving can be applied are described. Here, one pixel includes two n-channel transistors each of which is formed using an oxide semiconductor layer for a channel formation region.

A pixel 6400 includes a switching transistor 6401, a light-emitting element driving transistor 6402, a light-emitting element 6404, and a capacitor 6403. A gate of the switching transistor 6401 is connected to a scan line 6406. A first electrode (one of a source electrode and a drain electrode) of the switching transistor 6401 is connected to a signal line 6405. A second electrode (the other of the source electrode and the drain electrode) of the switching transistor 6401 is connected to a gate of the light-emitting element driving transistor 6402. The gate of the light-emitting element driving transistor 6402 is connected to a power supply line 6407 through the capacitor 6403. A first electrode of the light-emitting element driving transistor 6402 is connected to the power supply line 6407. A second electrode of the light-emitting element driving transistor 6402 is connected to a first electrode (a pixel electrode) of the light-emitting element 6404. A second electrode of the light-emitting element 6404 corresponds to a common electrode 6408. The common electrode 6408 is electrically connected to a common potential line provided over the same substrate.

The second electrode (the common electrode 6408) of the light-emitting element 6404 is set to a low power supply potential. Note that the low power supply potential is lower than a high power supply potential that is set to the power supply line 6407. For example, GND or 0 V may be set as the low power supply potential. A potential difference between the high power supply potential and the low power supply potential is applied to the light-emitting element 6404 so that current flows through the light-emitting element 6404, whereby the light-emitting element 6404 emits light. In order to make the light-emitting element 6404 emit light, each potential is set so that the potential difference between the high power supply potential and the low power supply potential is higher than or equal to the forward threshold voltage of the light-emitting element 6404.

Note that gate capacitance of the light-emitting element driving transistor 6402 may be used as a substitute for the capacitor 6403, so that the capacitor 6403 can be omitted. The gate capacitance of the light-emitting element driving transistor 6402 may be formed between the channel region and the gate electrode.

In the case of employing a voltage-input voltage-driving method, a video signal is input to the gate of the light-emitting element driving transistor 6402 so that the light-emitting element driving transistor 6402 is in either of two states of being sufficiently turned on or turned off. That is, the light-emitting element driving transistor 6402 operates in a linear region. Since the light-emitting element driving transistor 6402 operates in the linear region, voltage higher than the voltage of the power supply line 6407 is applied to the gate of the light-emitting element driving transistor 6402. Note that voltage higher than or equal to the sum of the power supply line voltage and Vth of the light-emitting element driving transistor 6402 is applied to the signal line 6405.

In the case of employing an analog grayscale method instead of the digital time grayscale method, the same pixel structure as that in FIG. 12 can be employed by changing signal input.

In the case of performing analog grayscale driving, voltage higher than or equal to the sum of the forward voltage of the light-emitting element 6404 and Vth of the light-emitting element driving transistor 6402 is applied to the gate of the light-emitting element driving transistor 6402. The forward voltage of the light-emitting element 6404 indicates voltage at which a desired luminance is obtained, and is larger than at least forward threshold voltage. The video signal by which the light-emitting element driving transistor 6402 operates in a saturation region is input, so that current can be supplied to the light-emitting element 6404. In order to operate the light-emitting element driving transistor 6402 in the saturation region, the potential of the power supply line 6407 is set higher than the gate potential of the light-emitting element driving transistor 6402. When an analog video signal is used, current corresponding to the video signal can be supplied to the light-emitting element 6404, so that analog grayscale driving can be performed.

Note that the pixel structure is not limited to that illustrated in FIG. 12. For example, a switch, a resistor, a capacitor, a transistor, a logic circuit, or the like may be added to the pixel illustrated in FIG. 12.

Next, a structure of a light-emitting element will be described with reference to FIGS. 13A to 13C. Here, a cross-sectional structure of a pixel will be described using an n-channel TFT for a light-emitting element driving TFT as an example. TFTs 7001, 7011, and 7021 serving as light-emitting element driving TFTs, which are used in semiconductor devices illustrated in FIGS. 13A, 13B, and 13C, can be formed in a manner similar to that of the thin film transistor provided in the pixel, which is described in Embodiment 1, and are highly reliable thin film transistors each including an oxide semiconductor layer. Alternatively, any of the thin film transistors provided in the pixel, which is described in Embodiments 2 to 4, can be employed as the TFTs 7001, 7011, and 7021.

In order to extract light emitted from the light-emitting element, at least one of an anode and a cathode needs to transmit light. A thin film transistor and a light-emitting element are formed over a substrate. The light-emitting element can have a top emission structure in which light is extracted through the surface opposite to the substrate; a bottom emission structure in which light is extracted through the surface on the substrate side; or a dual emission structure in which light is extracted through the surface opposite to the substrate and the surface on the substrate side. The pixel structure can be applied to a light-emitting element having any of these emission structures.

A light-emitting element having the top emission structure is described with reference to FIG. 13A.

Figure 13A:
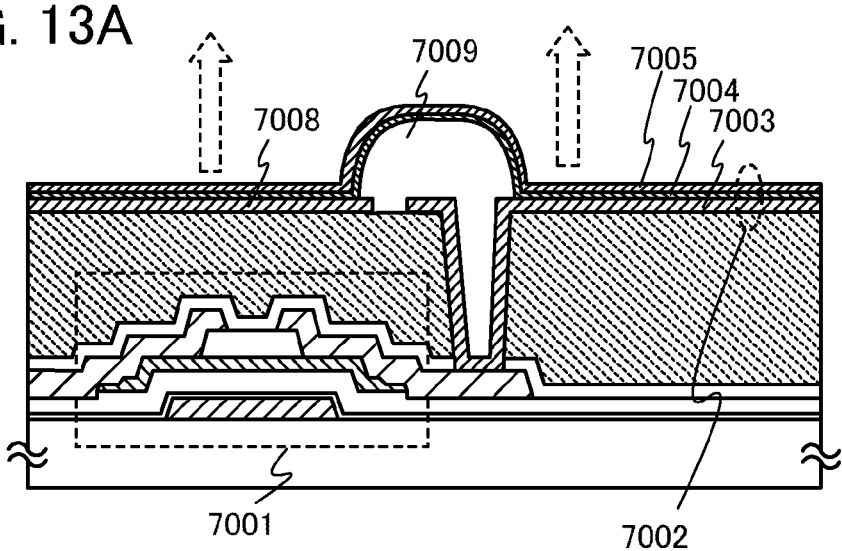
FIGS. 13A to 13C each illustrate a semiconductor device.

FIG. 13A is a cross-sectional view of a pixel in the case where the TFT 7001 serving as the TFT for driving a light-emitting element is an n-channel TFT and light emitted from a light-emitting element 7002 passes through an anode 7005. In FIG. 13A, a cathode 7003 of the light-emitting element 7002 is electrically connected to the TFT 7001 serving as the light-emitting element driving TFT, and a light-emitting layer 7004 and the anode 7005 are stacked in this order over the cathode 7003. The cathode 7003 can be formed using any of a variety of conductive materials as long as it has a low work function and reflect light. For example, Ca, Al, MgAg, AlLi, or the like is preferably used. The light-emitting layer 7004 may be formed using a single layer or a plurality of layers stacked. When the light-emitting layer 7004 is formed using a plurality of layers, the light-emitting layer 7004 is formed by stacking an electron injection layer, an electron transport layer, a light-emitting layer, a hole transport layer, and a hole injection layer in this order over the cathode 7003. Note that it is not necessary to form all of these layers. The anode 7005 is formed using a light-transmitting conductive material, for example, a light-transmitting conductive film such as a film of indium oxide containing tungsten oxide, indium zinc oxide containing tungsten oxide, indium oxide containing titanium oxide, indium tin oxide containing titanium oxide, indium tin oxide (ITO), indium zinc oxide, or indium tin oxide to which silicon oxide is added.

Moreover, a bank 7009 is provided between the cathode 7003 and a cathode 7008 in an adjacent pixel so as to cover edges of the cathodes 7003 and 7008. The bank 7009 is formed using an organic resin film of polyimide, an acrylic resin, polyamide, an epoxy resin, or the like; an inorganic insulating film; or organic polysiloxane. It is particularly preferable that the bank 7009 be formed using a photosensitive resin material so that its side surface is an inclined surface with continuous curvature. When a photosensitive resin material is used for the bank 7009, a step of forming a resist mask can be omitted.

The light-emitting element 7002 corresponds to a region where the light-emitting layer 7004 is sandwiched between the cathode 7003 and the anode 7005. In the pixel illustrated in FIG. 13A, light is emitted from the light-emitting element 7002 to the anode 7005 side as indicated by arrows.

Next, a light-emitting element having the bottom emission structure is described with reference to FIG. 13B. FIG. 13B is a cross-sectional view of a pixel in the case where the TFT 7011 for driving a light-emitting element is an n-channel TFT and light is emitted from a light-emitting element 7012 to a cathode 7013 side. In FIG. 13B, the cathode 7013 of the light-emitting element 7012 is formed over a light-transmitting conductive film 7017 that is electrically connected to the TFT 7011 for driving a light-emitting element, and a light-emitting layer 7014 and an anode 7015 are stacked in this order over the cathode 7013. Note that a light-blocking film 7016 for reflecting or blocking light may be formed so as to cover the anode 7015 when the anode 7015 has a light-transmitting property. The cathode 7013 can be formed using any of a variety of conductive materials as in the case of FIG. 13A as long as it has a low work function. Note that the cathode 7013 is formed to a thickness that allows light transmission (preferably approximately 5 nm to 30 nm). For example, a 20-nm-thick aluminum film can be used as the cathode 7013. As in the case of FIG. 13A, the light-emitting layer 7014 may be formed using a single layer or a plurality of layers stacked. The anode 7015 is not necessary to transmit light, but can be formed using a light-transmitting conductive material as in the case of FIG. 13A. For the light-blocking film 7016, a metal or the like that reflects light can be used, for example; however, the light-blocking film 7016 is not limited to a metal film. For example, a resin or the like to which a black pigment is added can be used.

Moreover, a bank 7019 is provided between the conductive film 7017 and a conductive film 7018 in an adjacent pixel so as to cover edges of the conductive films 7017 and 7018. The bank 7019 is formed using an organic resin film of polyimide, acrylic resin, polyamide, epoxy resin, or the like; an inorganic insulating film; or organic polysiloxane. It is particularly preferable that the bank 7019 be formed using a photosensitive resin material so that its side surface is an inclined surface with continuous curvature. When a photosensitive resin material is used for the bank 7019, a step of forming a resist mask can be omitted.

The light-emitting element 7012 corresponds to a region where the light-emitting layer 7014 is sandwiched between the cathode 7013 and the anode 7015. In the pixel illustrated in FIG. 13B, light is emitted from the light-emitting element 7012 to the cathode 7013 side as indicated by arrows.

Next, a light-emitting element having the dual emission structure is described with reference to FIG. 13C. In FIG. 13C, a cathode 7023 of a light-emitting element 7022 is formed over a light-transmitting conductive film 7027 that is electrically connected to the TFT 7021 for driving a light-emitting element, and a light-emitting layer 7024 and an anode 7025 are sequentially stacked over the cathode 7023. As in the case of FIG. 13A, the cathode 7023 can be formed using any of a variety of conductive materials as long as it has a low work function. Note that the cathode 7023 is formed to a thickness that allows light transmission. For example, a 20-nm-thick film of Al can be used as the cathode 7023. As in the case of FIG. 13A, the light-emitting layer 7024 may be formed using a single layer or a plurality of layers stacked. The anode 7025 can be formed using a light-transmitting conductive material as in the case of FIG. 13A.

Moreover, a bank 7029 is provided between the conductive film 7027 and a conductive film 7028 in an adjacent pixel so as to cover edges of the conductive films 7027 and 7028. The bank 7029 can be formed using an organic resin film of polyimide, an acrylic resin, polyamide, an epoxy resin, or the like; an inorganic insulating film; or organic polysiloxane. It is particularly preferable that the bank 7029 be formed using a photosensitive resin material so that its side surface is an inclined surface with continuous curvature. When a photosensitive resin material is used for the bank 7029, a step of forming a resist mask can be omitted.

The light-emitting element 7022 corresponds to a portion where the cathode 7023, the light-emitting layer 7024, and the anode 7025 overlap with one another. In the pixel illustrated in FIG. 13C, light is emitted from the light-emitting element 7022 to both the anode 7025 side and the cathode 7023 side as indicated by arrows.

Note that although the organic EL elements are described here as the light-emitting elements, an inorganic EL element may be provided as a light-emitting element.

Note that the example is described in which the thin film transistor (the light-emitting element driving TFT) which controls the driving of a light-emitting element is electrically connected to the light-emitting element; alternatively, a structure may be employed in which a TFT for current control is connected between the light-emitting element driving TFT and the light-emitting element.

Figure 13B:
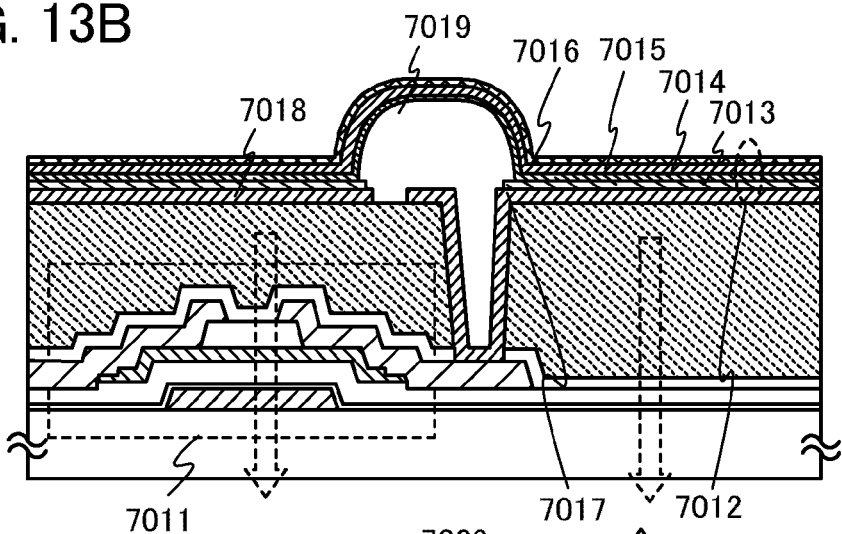
Figure 13C:
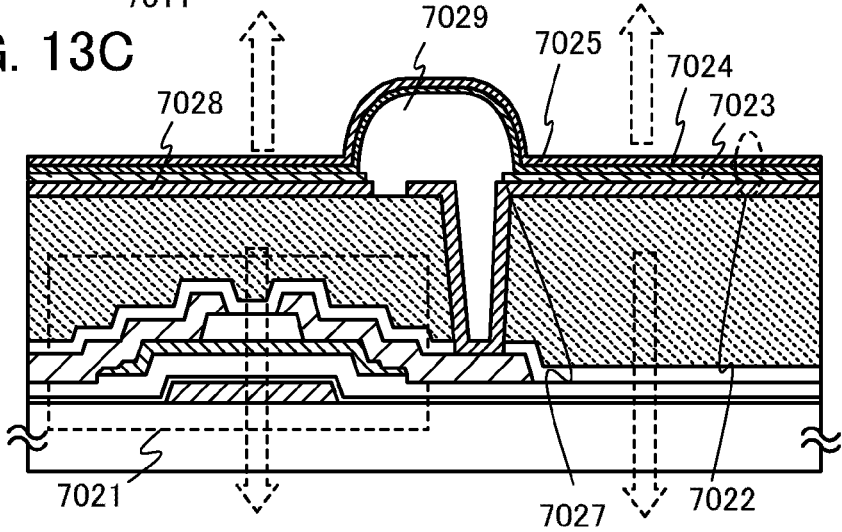

Note that the structure of the semiconductor device is not limited to those illustrated in FIGS. 13A to 13C and can be modified in various ways based on techniques disclosed in this specification.

Figure 11A:
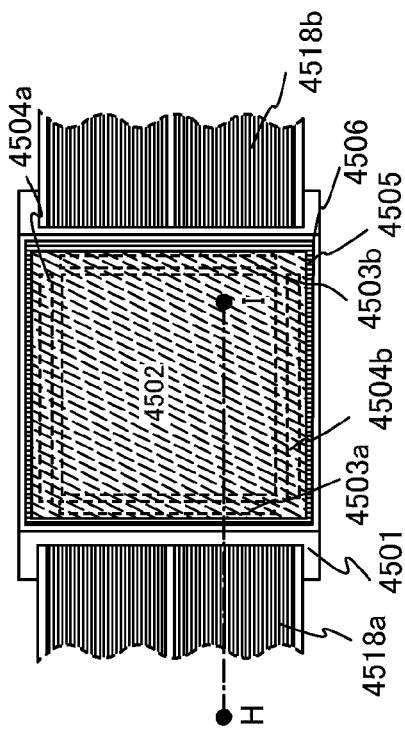
FIGS. 11A and 11B illustrate a semiconductor device.
Figure 11B:
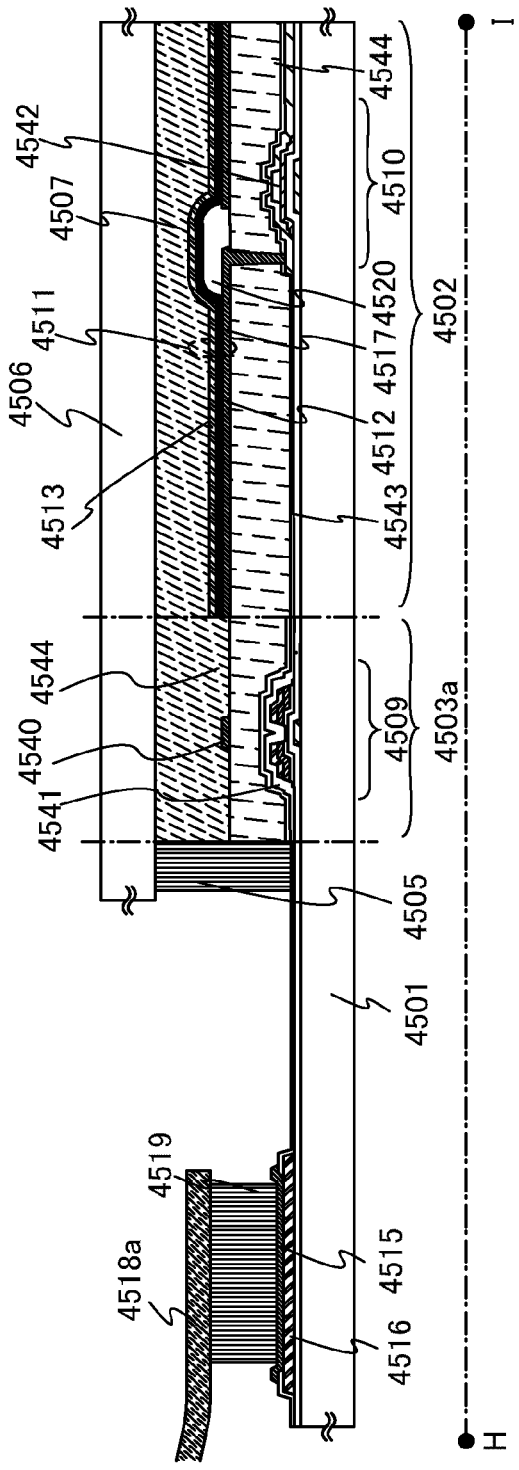

Next, the appearance and a cross section of a light-emitting display panel (also referred to as a light-emitting panel) which is one embodiment of a semiconductor device will be described with reference to FIGS. 11A and 11B. FIG. 11A is a plan view of a panel in which a thin film transistor and a light-emitting element that are formed over a first substrate are sealed between the first substrate and a second substrate with a sealant. FIG. 11B is a cross-sectional view along H-I in FIG. 11A.

A sealant 4505 is provided so as to surround a pixel portion 4502, signal line driver circuits 4503a and 4503b, and scan line driver circuits 4504a and 4504b which are provided over a first substrate 4501. Moreover, a second substrate 4506 is provided over the pixel portion 4502, the signal line driver circuits 4503a and 4503b, and the scan line driver circuits 4504a and 4504b. Consequently, the pixel portion 4502, the signal line driver circuits 4503a and 4503b, and the scan line driver circuits 4504a and 4504b are sealed together with a filler 4507 by the first substrate 4501, the sealant 4505, and the second substrate 4506. In this manner, a panel is preferably packaged (sealed) with a protective film (such as a laminate film or an ultraviolet curable resin film) or a cover material with high air-tightness and little degasification so that the panel is not exposed to the outside air.

The pixel portion 4502, the signal line driver circuits 4503a and 4503b, and the scan line driver circuits 4504a and 4504b, which are formed over the first substrate 4501, each include a plurality of thin film transistors. A thin film transistor 4510 included in the pixel portion 4502 and a thin film transistor 4509 included in the signal line driver circuit 4503a are illustrated as an example in FIG. 11B.

Any of the highly reliable thin film transistors including the oxide semiconductor layers described in any of Embodiments 1 to 4 can be used as the thin film transistors 4509 and 4510. The thin film transistor 460 or the thin film transistor 499 described in Embodiments 1 to 4 can be used as the thin film transistor 4509 provided in the driver circuit. The thin film transistor 470 and the thin film transistor 498 can be used in combination as the thin film transistor 4010 provided in the pixel. In this embodiment, the thin film transistors 4509 and 4510 are n-channel thin film transistors.

A conductive layer 4540 is provided over part of an insulating layer 4544, which overlaps with a channel formation region of an oxide semiconductor layer in the thin film transistor 4509 for the driver circuit. The conductive layer 4540 is provided at the position overlapping with the channel formation region of the oxide semiconductor layer, whereby the amount of change in threshold voltage of the thin film transistor 4509 between before and after the BT test can be reduced. A potential of the conductive layer 4540 may be the same or different from that of a gate electrode layer in the thin film transistor 4509. The conductive layer 4540 can also function as a second gate electrode layer. Alternatively, the potential of the conductive layer 4540 may be GND or 0 V, or the conductive layer 4540 may be in a floating state.

Furthermore, an insulating layer 4543 is formed over the thin film transistors 4509 and 4510. Here, a silicon nitride film is formed as the insulating layer 4543 with an RF sputtering method. Note that the insulating layer 4543 may be formed using a material and a method which are similar to those of the protective insulating layer 453 described in Embodiment 1.

The insulating layer 4544 is formed as a planarization insulating film. The insulating layer 4544 can be formed using a material and a method which are similar to those of the planarization insulating layer 454 described in Embodiment 1. Here, acrylic is used for the insulating layer 4544.

In this embodiment, a plurality of thin film transistors in the pixel portion may be surrounded together by a nitride insulating film. It is possible to use a nitride insulating film as each of the insulating layer 4543 and a gate insulating layer and to provide a region where the insulating layer 4543 is in contact with the gate insulating layer so as to surround at least the periphery of the pixel portion over the active matrix substrate as illustrated in FIGS. 11A and 11B. In this manufacturing process, entry of moisture from the outside can be prevented. Moreover, entry of moisture from the outside can be prevented in the long term after a device is completed as a semiconductor device, for example, as a display device; thus, the long-term reliability of the device can be achieved.

Reference numeral 4511 denotes a light-emitting element. A first electrode layer 4517 which is a pixel electrode included in the light-emitting element 4511 is electrically connected to a source electrode layer or a drain electrode layer of the thin film transistor 4510. Note that the structure of the light-emitting element 4511 is not limited to a layered structure of the first electrode layer 4517, an electroluminescent layer 4512, and a second electrode layer 4513. The structure of the light-emitting element 4511 can be changed as appropriate depending on the direction in which light is extracted from the light-emitting element 4511, or the like.

A bank 4520 is formed using an organic resin film, an inorganic insulating film, or organic polysiloxane. It is particularly preferable that the bank 4520 be formed using a photosensitive material and an opening portion be formed over the first electrode layer 4517 so that a sidewall of the opening portion is formed as an inclined surface with continuous curvature.

The electroluminescent layer 4512 may be formed with a single layer or a plurality of layers stacked.

A protective film may be formed over the second electrode layer 4513 and the bank 4520 in order to prevent entry of oxygen, hydrogen, moisture, carbon dioxide, or the like into the light-emitting element 4511. As the protective film, a silicon nitride film, a silicon nitride oxide film, a DLC film, or the like can be formed.

In addition, a variety of signals and potentials are supplied to the signal line driver circuits 4503a and 4503b, the scan line driver circuits 4504a and 4504b, or the pixel portion 4502 from FPCs 4518a and 4518b.

A connection terminal electrode 4515 is formed using the same conductive film as the first electrode layer 4517 included in the light-emitting element 4511, and a terminal electrode 4516 is formed using the same conductive film as the source and drain electrode layers included in the thin film transistor 4509.

The connection terminal electrode 4515 is electrically connected to a terminal included in the FPC 4518a through an anisotropic conductive film 4519.

The second substrate positioned in the direction in which light is extracted from the light-emitting element 4511 needs to have a light-transmitting property. In that case, a light-transmitting material such as a glass plate, a plastic plate, a polyester film, or an acrylic film is used for the second substrate.

As the filler 4507, an ultraviolet curable resin or a thermosetting resin can be used in addition to an inert gas such as nitrogen or argon. For example, PVC (polyvinyl chloride), an acrylic resin, polyimide, an epoxy resin, a silicone resin, PVB (polyvinyl butyral), or EVA (an ethylene-vinyl acetate copolymer) can be used. For example, nitrogen is used for the filler.

If needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, a polarizing plate or a circularly polarizing plate may be provided with an anti-reflection film. For example, anti-glare treatment can be performed by which reflected light can be diffused by projections and depressions on the surface so as to reduce glare.

Driver circuits formed using a single crystal semiconductor film or a polycrystalline semiconductor film over a substrate separately prepared may be mounted as the signal line driver circuits 4503a and 4503b and the scan line driver circuits 4504a and 4504b. Alternatively, only the signal line driver circuits or part thereof, or only the scan line driver circuits or part thereof may be separately formed and mounted. This embodiment is not limited to the structure illustrated in FIGS. 11A and 11B.

Through the above steps, a highly reliable light-emitting display device (display panel) can be manufactured as a semiconductor device.

This embodiment can be implemented in appropriate combination with any of the structures described in the other embodiments.

Embodiment 12

Figure 20:
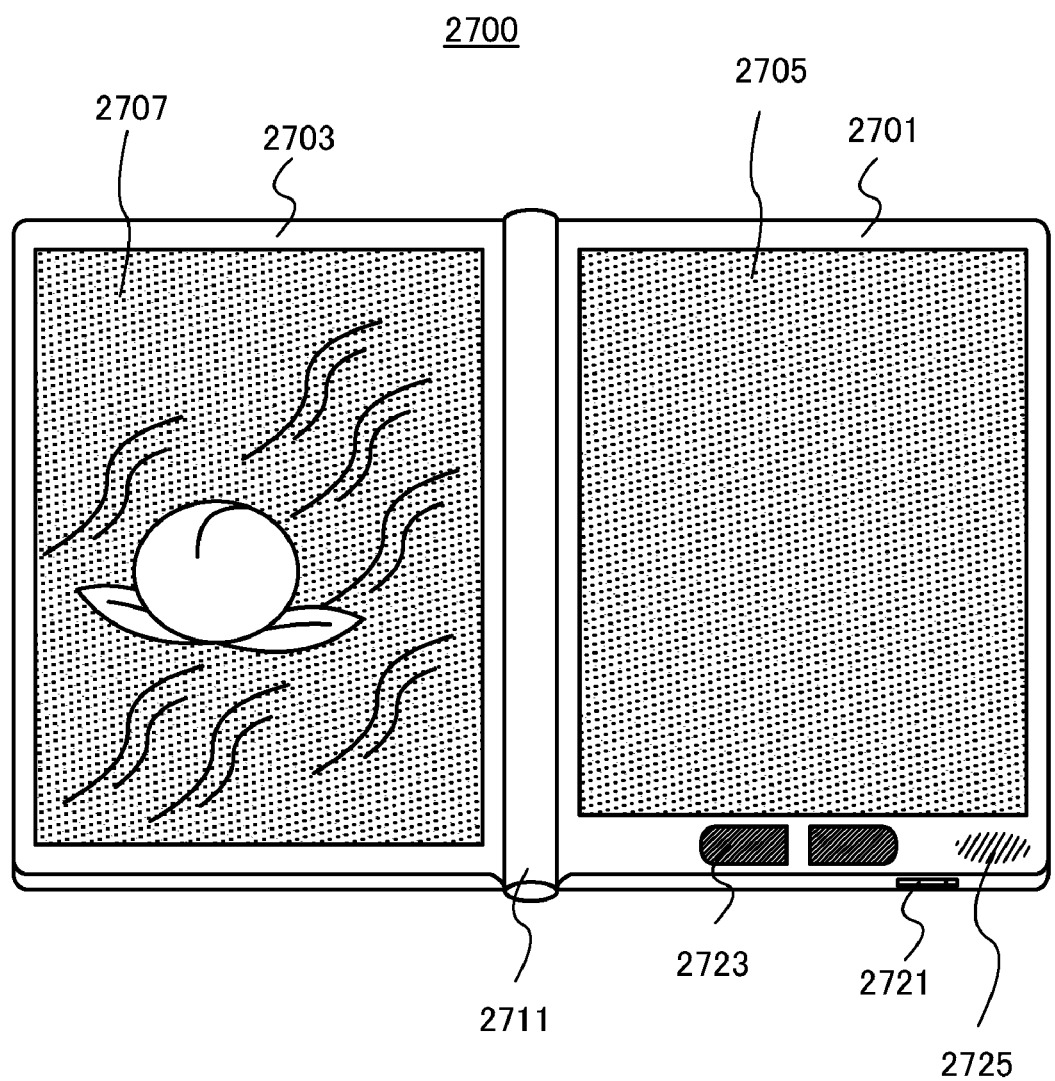
FIG. 20 is an external view illustrating an example of an e-book reader.

A semiconductor device disclosed in this specification can be applied to electronic paper. Electronic paper can be used for electronic devices in all fields as long as they display data. For example, electronic paper can be applied to an e-book reader (an electronic book), a poster, an advertisement in a vehicle such as a train, or displays of a variety of cards such as a credit card. FIG. 20 illustrates an example of the electronic devices.

FIG. 20 illustrates an e-book reader 2700. For example, the e-book reader 2700 includes two housings of a housing 2701 and a housing 2703. The housing 2701 and the housing 2703 are combined with a hinge 2711 so that the e-book reader 2700 can be opened and closed with the hinge 2711 as an axis. Such a structure enables the e-book reader 2700 to operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 20) can display text and a display portion on the left side (the display portion 2707 in FIG. 20) can display graphics.

FIG. 20 illustrates an example in which the housing 2701 is provided with an operation portion and the like. For example, the housing 2701 is provided with a power switch 2721, operation keys 2723, a speaker 2725, and the like. Pages can be turned with the operation keys 2723. Note that a keyboard, a pointing device, and the like may be provided on the same surface as the display portion of the housing. Moreover, an external connection terminal (an earphone terminal, a USB terminal, a terminal connectable to a variety of cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may be configured to wirelessly transmit and receive data. Through wireless communication, desired book data or the like can be purchased and downloaded from an electronic book server.

This embodiment can be implemented in appropriate combination with any of the structures described in the other embodiments.

Embodiment 13

A semiconductor device disclosed in this specification can be applied to a variety of electronic devices (including game machines). Examples of such electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pinball machine, and the like.

Figure 21A:
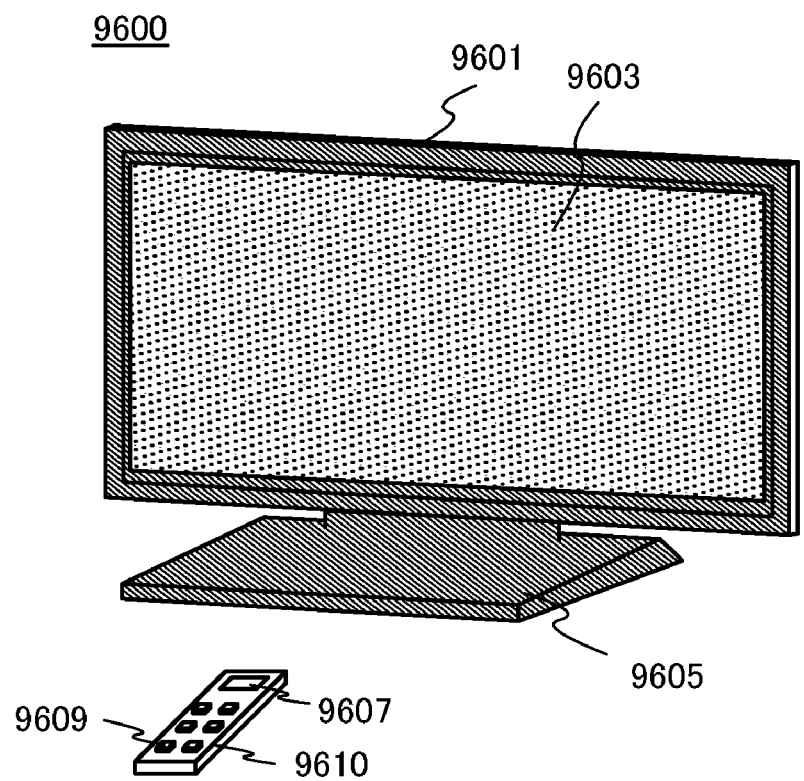
FIGS. 21A and 21B are external views illustrating an example of a television set and an example of a digital photo frame, respectively.

FIG. 21A illustrates a television set 9600. In the television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels can be switched and volume can be controlled with operation keys 9609 of the remote controller 9610, whereby an image displayed on the display portion 9603 can be controlled. Moreover, the remote controller 9610 may be provided with a display portion 9607 for displaying data outputted from the remote controller 9610.

Note that the television set 9600 is provided with a receiver, a modem, and the like. With the use of the receiver, general TV broadcasts can be received. Moreover, when the display device is connected to a communication network with or without wires via the modem, one-way (from a sender to a receiver) or two-way (between a sender and a receiver or between receivers) information communication can be performed.

Figure 21B:
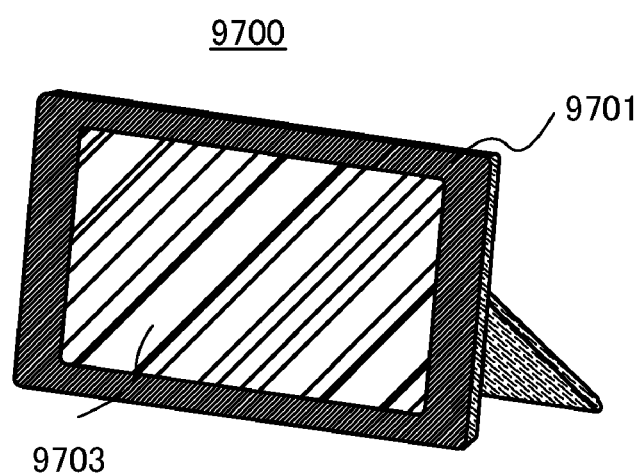

FIG. 21B illustrates a digital photo frame 9700. For example, in the digital photo frame 9700, a display portion 9703 is incorporated in a housing 9701. The display portion 9703 can display a variety of images. For example, the display portion 9703 can display data of an image taken with a digital camera or the like and function as a normal photo frame.

Note that the digital photo frame 9700 is provided with an operation portion, an external connection terminal (a USB terminal, a terminal connectable to a variety of cables such as a USB cable, or the like), a recording medium insertion portion, and the like. Although these components may be provided on the same surface as the display portion, it is preferable to provide them on the side surface or the back surface for design aesthetics. For example, a memory storing data of an image taken with a digital camera is inserted in the recording medium insertion portion of the digital photo frame 9700 and the data is loaded, whereby the image can be displayed on the display portion 9703.

The digital photo frame 9700 may be configured to transmit and receive data wirelessly. Through wireless communication, desired image data can be loaded to be displayed.

Figure 22A:
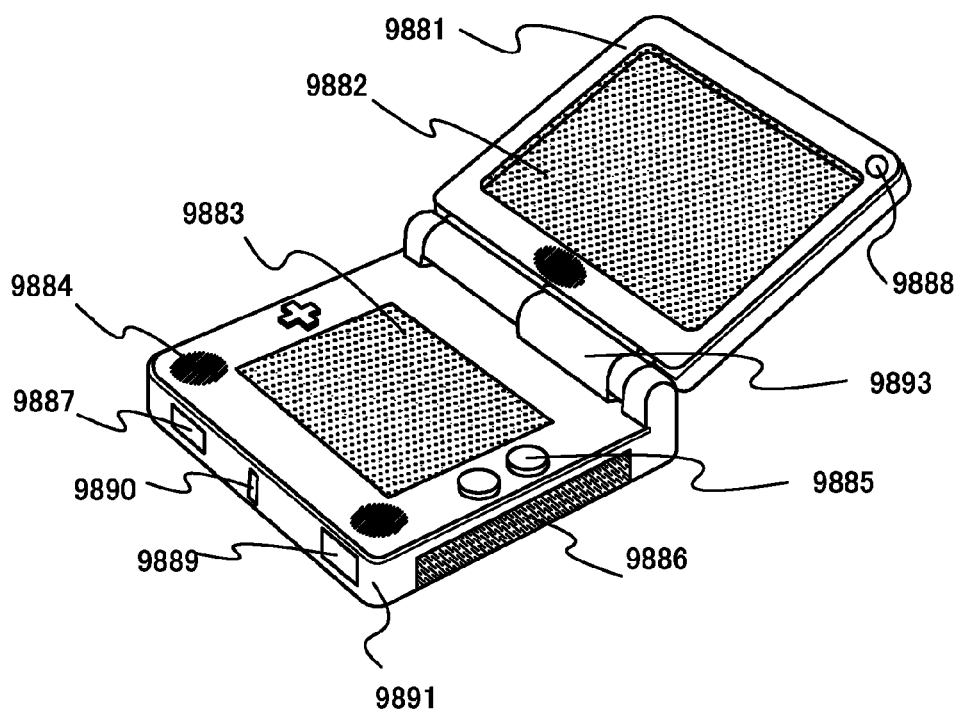
FIGS. 22A and 22B are external views each illustrating an example of a game machine.

FIG. 22A is a portable game machine and is constituted by two housings of a housing 9881 and a housing 9891 which are connected with a joint portion 9893 so that the portable game machine can be opened or folded. A display portion 9882 and a display portion 9883 are incorporated in the housing 9881 and the housing 9891, respectively. In addition, the portable game machine illustrated in FIG. 22A is provided with a speaker portion 9884, a recording medium insertion portion 9886, an LED lamp 9890, input means (operation keys 9885, a connection terminal 9887, a sensor 9888 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, smell, or infrared ray), and a microphone 9889), and the like. Needless to say, the structure of the portable game machine is not limited to the above and other structures provided with at least a semiconductor device disclosed in this specification can be employed. The portable game machine may include an additional accessory as appropriate. The portable game machine illustrated in FIG. 22A has a function of reading a program or data stored in the recording medium to display it on the display portion, and a function of sharing data with another portable game machine by wireless communication. Note that a function of the portable game machine illustrated in FIG. 22A is not limited to those described above, and the portable game machine can have a variety of functions.

Figure 22B:
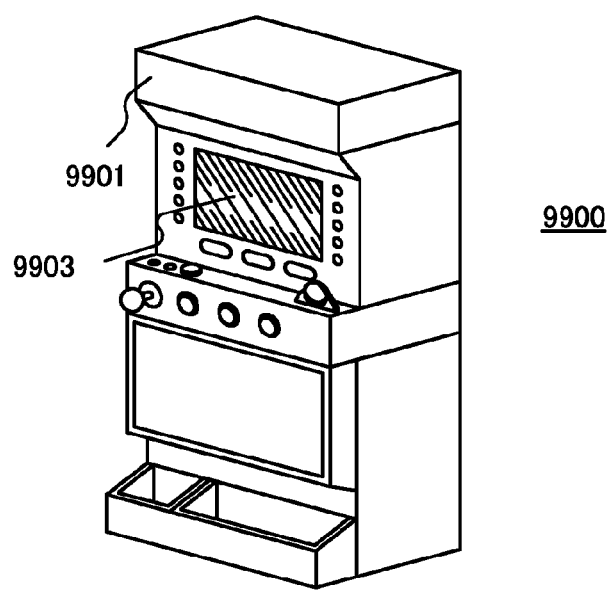

FIG. 22B illustrates a slot machine 9900 which is a large-sized game machine. In the slot machine 9900, a display portion 9903 is incorporated in a housing 9901. In addition, the slot machine 9900 includes an operation means such as a start lever or a stop switch, a coin slot, a speaker, and the like. Needless to say, the structure of the slot machine 9900 is not limited to the above and other structures provided with at least a semiconductor device disclosed in this specification may be employed. The slot machine 9900 may include an additional accessory as appropriate.

Figure 23A:
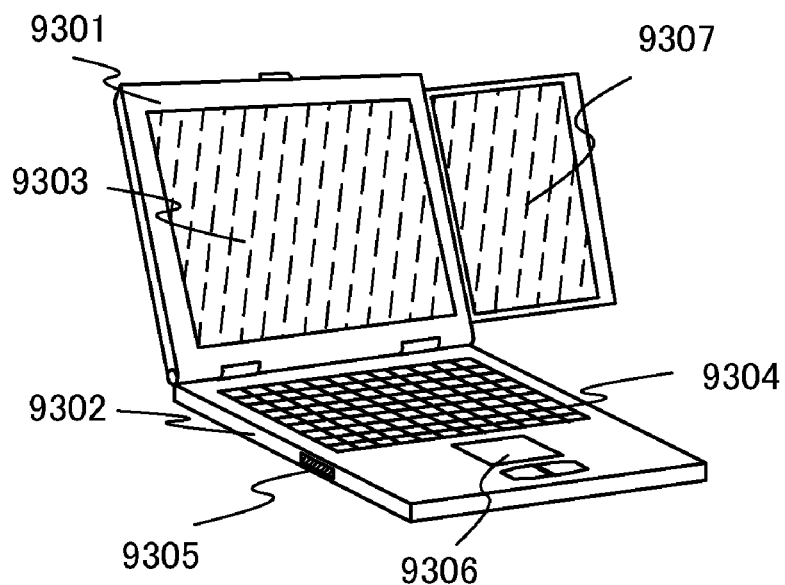
FIGS. 23A and 23B are external views illustrating an example of a portable computer and an example of a mobile phone, respectively.

FIG. 23A is a perspective view illustrating an example of a portable computer.

In the portable computer illustrated in FIG. 23A, a top housing 9301 having a display portion 9303 and a bottom housing 9302 having a keyboard 9304 can overlap with each other by closing a hinge unit which connects the top housing 9301 and the bottom housing 9302. Thus, the portable computer illustrated in FIG. 23A is conveniently carried. Moreover, in the case of using the keyboard for input of data, the hinge unit is opened so that a user can input data looking at the display portion 9303.

The bottom housing 9302 includes a pointing device 9306 with which input can be performed, in addition to the keyboard 9304. When the display portion 9303 is a touch panel, a user can input data by touching part of the display portion. The bottom housing 9302 includes an arithmetic function portion such as a CPU or hard disk. In addition, the bottom housing 9302 includes an external connection port 9305 into which another device, for example, a communication cable conformable to communication standards of a USB is inserted.

The top housing 9301 further includes a display portion 9307 which can be kept in the top housing 9301 by being slid therein. With the display portion 9307, a large display screen can be realized. In addition, a user can adjust the angle of a screen of the display portion 9307 which can be kept in the top housing 9301. If the display portion 9307 which can be kept in the top housing 9301 is a touch panel, the user can input data by touching part of the display portion 9307.

The display portion 9303 or the display portion 9307 which can be kept in the top housing 9301 is formed using an image display device such as a liquid crystal display panel or a light-emitting display panel using an organic light-emitting element, an inorganic light-emitting element, or the like.

In addition, the portable computer illustrated in FIG. 23A can be provided with a receiver and the like and can receive a TV broadcast to display an image on the display portion. The user can watch a TV broadcast by exposing the whole screen of the display portion 9307 slid while the hinge unit which connects the top housing 9301 and the bottom housing 9302 is kept closed and adjusting the angle of the screen. In this case, the hinge unit is not opened and display is not performed on the display portion 9303. In addition, start up of only a circuit for displaying a TV broadcast is performed. Thus, power consumption can be minimized, which is useful for the portable computer whose battery capacity is limited.

Figure 23B:
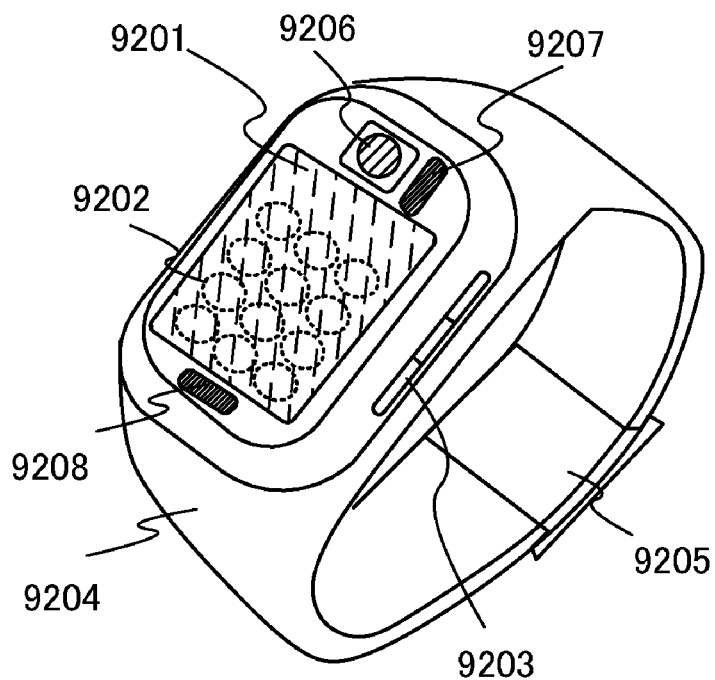

FIG. 23B is a perspective view of an example of a mobile phone that the user can wear on the wrist like a wristwatch.

This mobile phone is formed with a main body which includes a communication device including at least a telephone function, and a battery; a band portion 9204 which enables the main body to be worn on the wrist; an adjusting portion 9205 for adjusting the band portion 9204 to fit the wrist; a display portion 9201; a speaker 9207; and a microphone 9208.

In addition, the main body includes operation switches 9203. The operation switches 9203 can serve, for example, as a switch for starting a program for the Internet when pushed, in addition to serving as a power switch, a switch for switching displays, a switch for instruction to start taking images, or the like, and can be configured to have respective functions.

A user can input data into this mobile phone by touching the display portion 9201 with a finger or an input pen, operating the operation switches 9203, or inputting voice into the microphone 9208. In FIG. 23B, display buttons 9202 are displayed on the display portion 9201. A user can input data by touching the display buttons 9202 with a finger or the like.

Further, the main body includes a camera portion 9206 including an image pick-up means having a function of converting an image of an object, which is formed through a camera lens, to an electronic image signal. Note that the camera portion is not necessarily provided.

The mobile phone illustrated in FIG. 23B is provided with a receiver of a TV broadcast and the like, and can display an image on the display portion 9201 by receiving the TV broadcast. In addition, the mobile phone is provided with a memory device such as a memory, and the like, and can record the TV broadcast in the memory. The mobile phone illustrated in FIG. 23B may have a function of collecting location information such as GPS.

An image display device such as a liquid crystal display panel or a light-emitting display panel using an organic light-emitting element, an inorganic light-emitting element, or the like is used as the display portion 9201. The mobile phone illustrated in FIG. 23B is compact and lightweight and the battery capacity is limited. For the above reason, a panel which can be driven with low power consumption is preferably used as a display device for the display portion 9201.

Note that although FIG. 23B illustrates the electronic device which is worn on the wrist, this embodiment is not limited thereto as long as an electronic device is portable.

This embodiment can be implemented in appropriate combination with any of the structures described in the other embodiments.

Embodiment 14

In this embodiment, as one mode of a semiconductor device, examples of display devices each including the thin film transistor described in any of Embodiments 1 to 4 will be described with reference to FIGS. 24 to 37. In this embodiment, examples of liquid crystal display devices in each of which a liquid crystal element is used as a display element will be described with reference to FIG. 24 to FIG. 37. The thin film transistor described in any of Embodiments 1 to 4 can be used as each of TFTs 628 and 629. The TFTs 628 and 629 can be manufactured through a process similar to that described in any of Embodiments 1 to 4 and have excellent electric characteristics and high reliability. The TFT 628 and the TFT 629 include a channel protective layer 608 and a channel protective layer 611, respectively, and are inverted staggered thin film transistors in each of which a channel formation region is formed in an oxide semiconductor layer.

First, a vertical alignment (VA) liquid crystal display device is described. The VA is a kind of form in which alignment of liquid crystal molecules of a liquid crystal display panel is controlled. In the VA liquid crystal display device, liquid crystal molecules are aligned in a vertical direction with respect to a panel surface when no voltage is applied. In this embodiment, in particular, a pixel is divided into some regions (subpixels), and liquid crystal molecules are aligned in different directions in their respective regions. This is referred to as multi-domain or multi-domain design. Liquid crystal display devices of the multi-domain design are described below.

Figure 24:
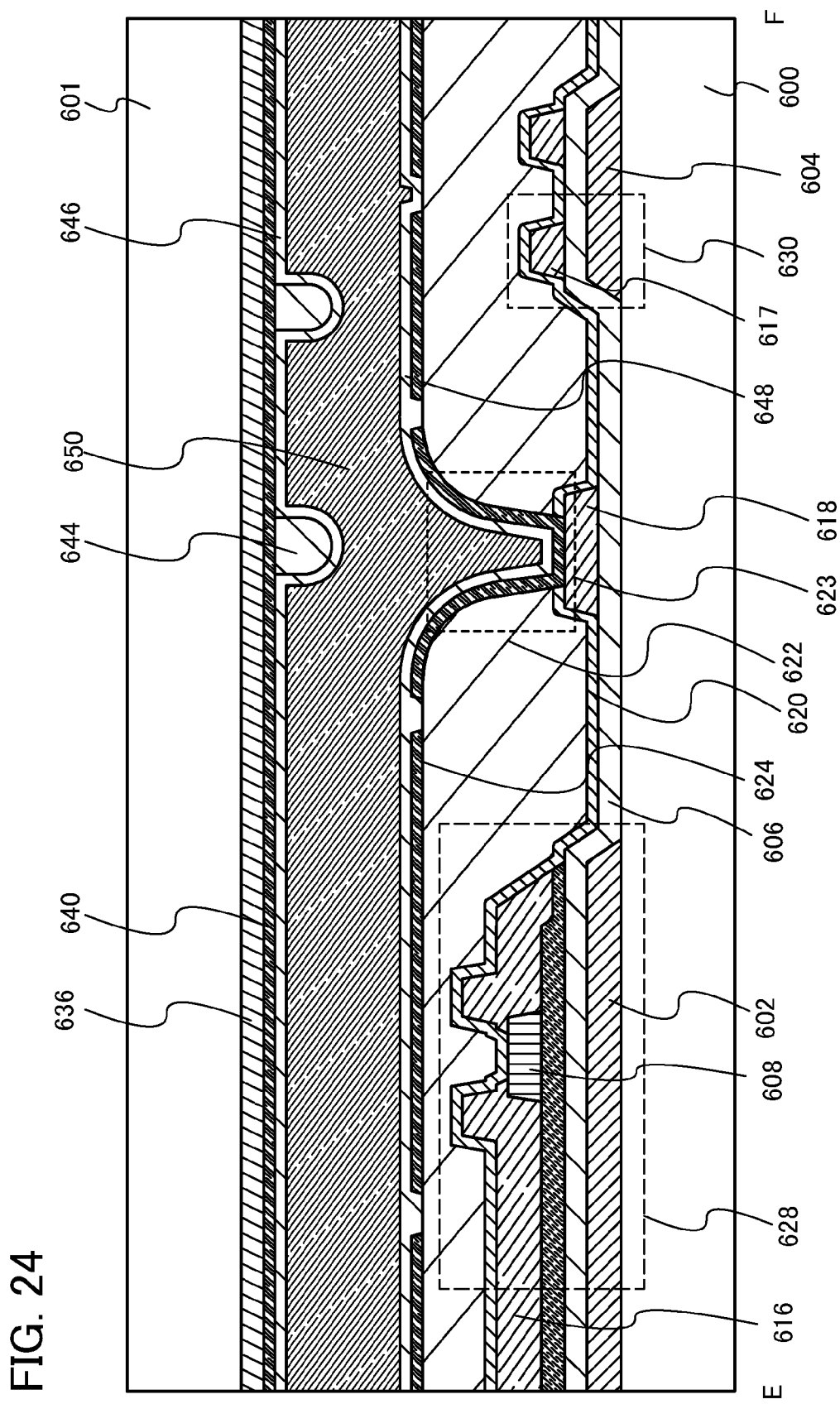
FIG. 24 illustrates a semiconductor device.
Figure 25:
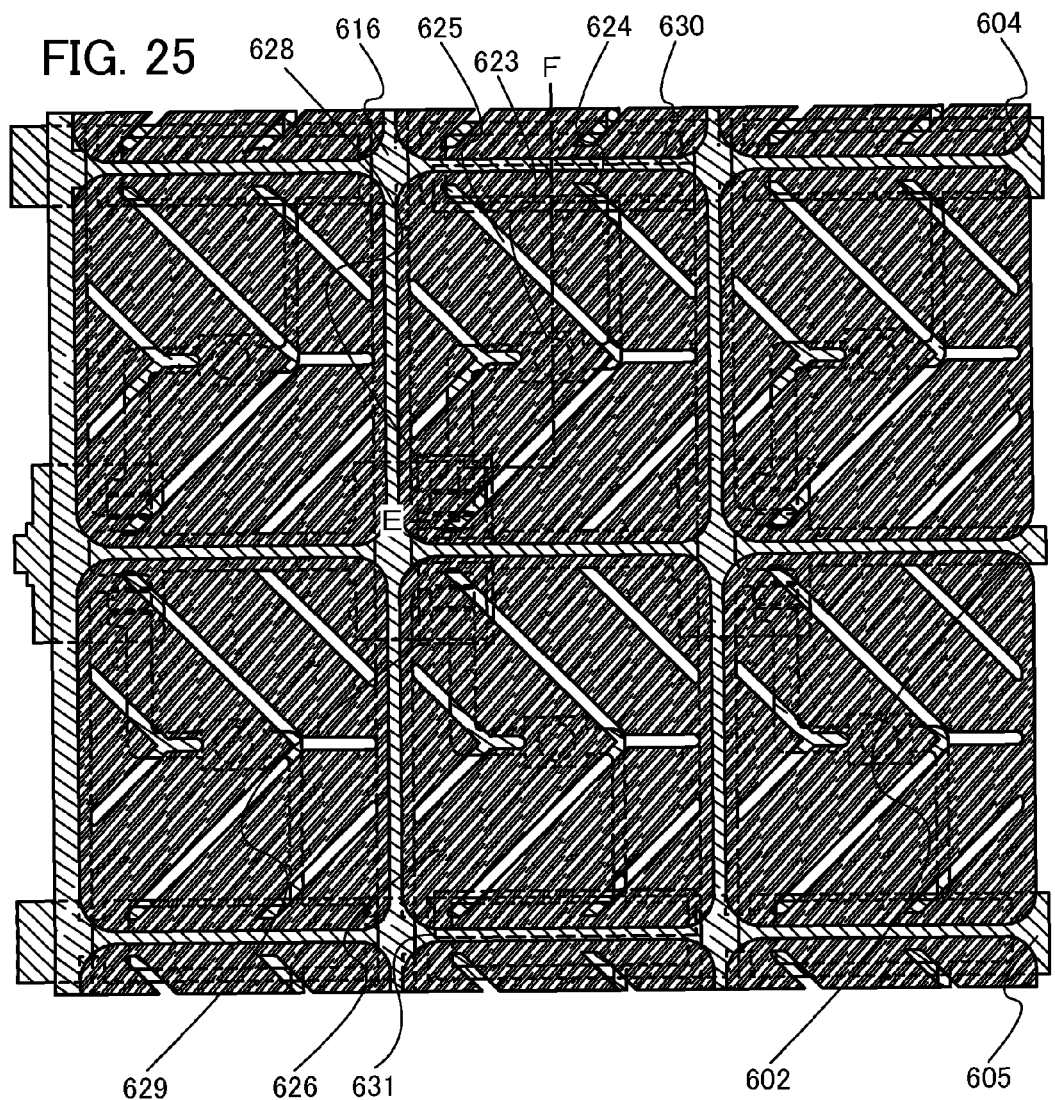
FIG. 25 illustrates a semiconductor device.
Figure 26:
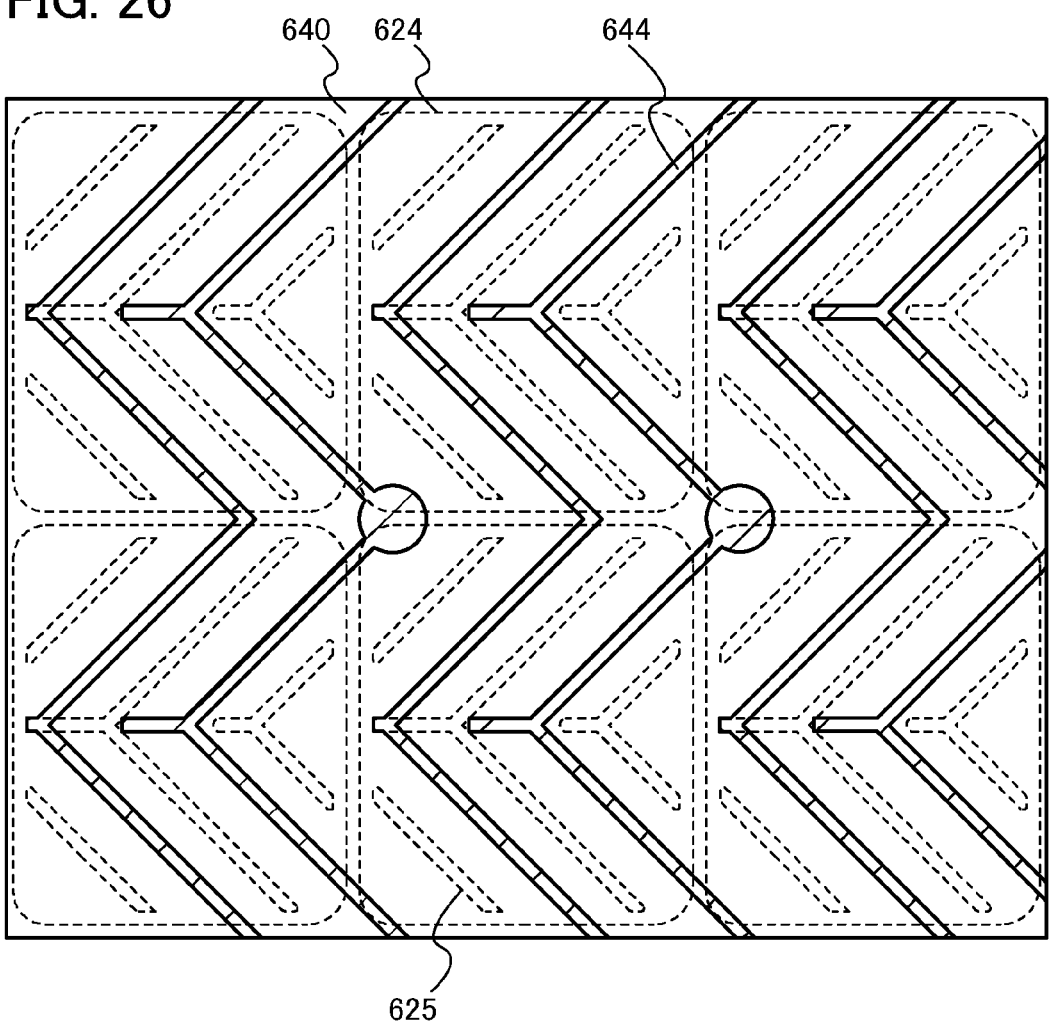
FIG. 26 illustrates a semiconductor device.

FIG. 25 and FIG. 26 illustrate a pixel electrode and a counter electrode, respectively. FIG. 25 is a plan view showing the substrate side where the pixel electrode is formed. FIG. 24 illustrates a cross-sectional structure taken along section line E-F in FIG. 25. FIG. 26 is a plan view showing the substrate side where the counter electrode is formed. Description below is given with reference to those drawings.

In FIG. 24, a substrate 600 over which a TFT 628, a pixel electrode layer 624 connected to the TFT 628, and a storage capacitor portion 630 are formed and a counter substrate 601 provided with a counter electrode layer 640 and the like overlap with each other, and liquid crystals are injected between the substrate 600 and the counter substrate 601.

The counter substrate 601 is provided with a coloring film 636 and the counter electrode layer 640, and protrusions 644 are formed on the counter electrode layer 640. An alignment film 648 is formed over the pixel electrode layer 624, and in a similar manner, an alignment film 646 is formed on the counter electrode layer 640 and the protrusions 644. A liquid crystal layer 650 is formed between the substrate 600 and the counter substrate 601.

The TFT 628, the pixel electrode layer 624 connected to the TFT 628, and the storage capacitor portion 630 are formed over the substrate 600. The pixel electrode layer 624 is connected to a wiring 618 through a contact hole 623 which penetrates an insulating film 620 for covering the TFT 628, a wiring 616, and the storage capacitor portion 630 and also penetrates an insulating film 622 for covering the insulating film 620. The thin film transistor described in any of Embodiments 1 to 4 can be used as the TFT 628 as appropriate.

Further, the storage capacitor portion 630 includes a first capacitor wiring 604 which is formed at the same time as a gate wiring 602 of the TFT 628; a gate insulating film 606; and a second capacitor wiring 617 which is formed at the same time as the wirings 616 and 618.

The pixel electrode layer 624, the liquid crystal layer 650, and the counter electrode layer 640 overlap with each other, whereby a liquid crystal element is formed.

FIG. 25 illustrates a planar structure over the substrate 600. The pixel electrode layer 624 is formed using the material described in Embodiment 1. The pixel electrode layer 624 is provided with slits 625. The slits 625 are provided for controlling the alignment of the liquid crystals.

A TFT 629, a pixel electrode layer 626 connected to the TFT 629, and a storage capacitor portion 631 which are illustrated in FIG. 25 can be formed in a similar manner to the TFT 628, the pixel electrode layer 624, and the storage capacitor portion 630, respectively. Both of the TFTs 628 and 629 are connected to the wiring 616. One pixel of this liquid crystal display panel includes the pixel electrode layers 624 and 626. The pixel electrode layers 624 and 626 constitute subpixels.

FIG. 26 illustrates a planar structure of the counter substrate side. The counter electrode layer 640 is formed over a light-blocking film 632. The counter electrode layer 640 is preferably formed using a material similar to that of the pixel electrode layer 624. The protrusions 644 which control the alignment of the liquid crystals are formed on the counter electrode layer 640.

Figure 27:
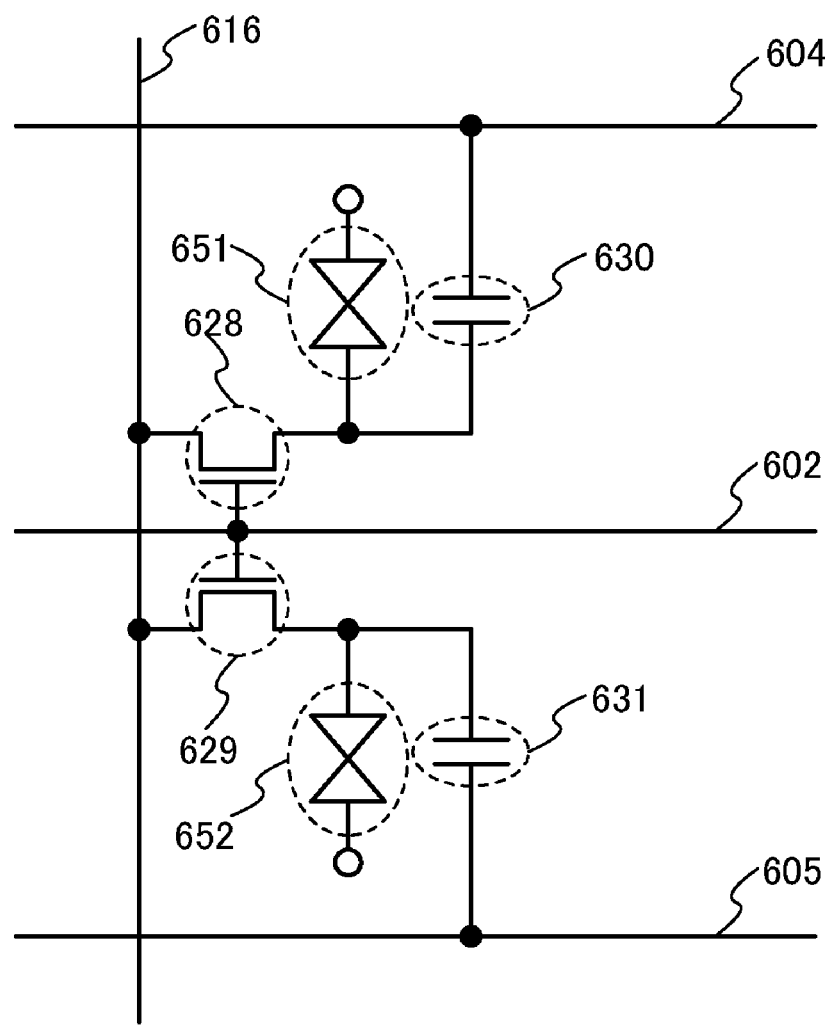
FIG. 27 illustrates a circuit diagram of a semiconductor device.

FIG. 27 illustrates an equivalent circuit of this pixel structure. Both of the TFTs 628 and 629 are connected to the gate wiring 602 and the wiring 616. In that case, when potentials of the capacitor wiring 604 and a capacitor wiring 605 are different from each other, operations of liquid crystal elements 651 and 652 can vary. In other words, the alignment of the liquid crystals is precisely controlled and a viewing angle is increased by separate control of potentials of the capacitor wirings 604 and 605.

When voltage is applied to the pixel electrode layer 624 provided with the slits 625, a distorted electric field (an oblique electric field) is generated in the vicinity of the slits 625. The protrusions 644 on the counter substrate 601 side and the slits 625 are arranged so as not to overlap with each other so that the oblique electric field is effectively generated to control the alignment of the liquid crystals, whereby the direction of the alignment of the liquid crystals varies depending on the location. In other words, a viewing angle of the liquid crystal display panel is increased by multi-domain.

Next, a VA liquid crystal display device, which is different from the above-described device, will be described with reference to FIG. 28, FIG. 29, FIG. 30, and FIG. 31.

Figure 28:
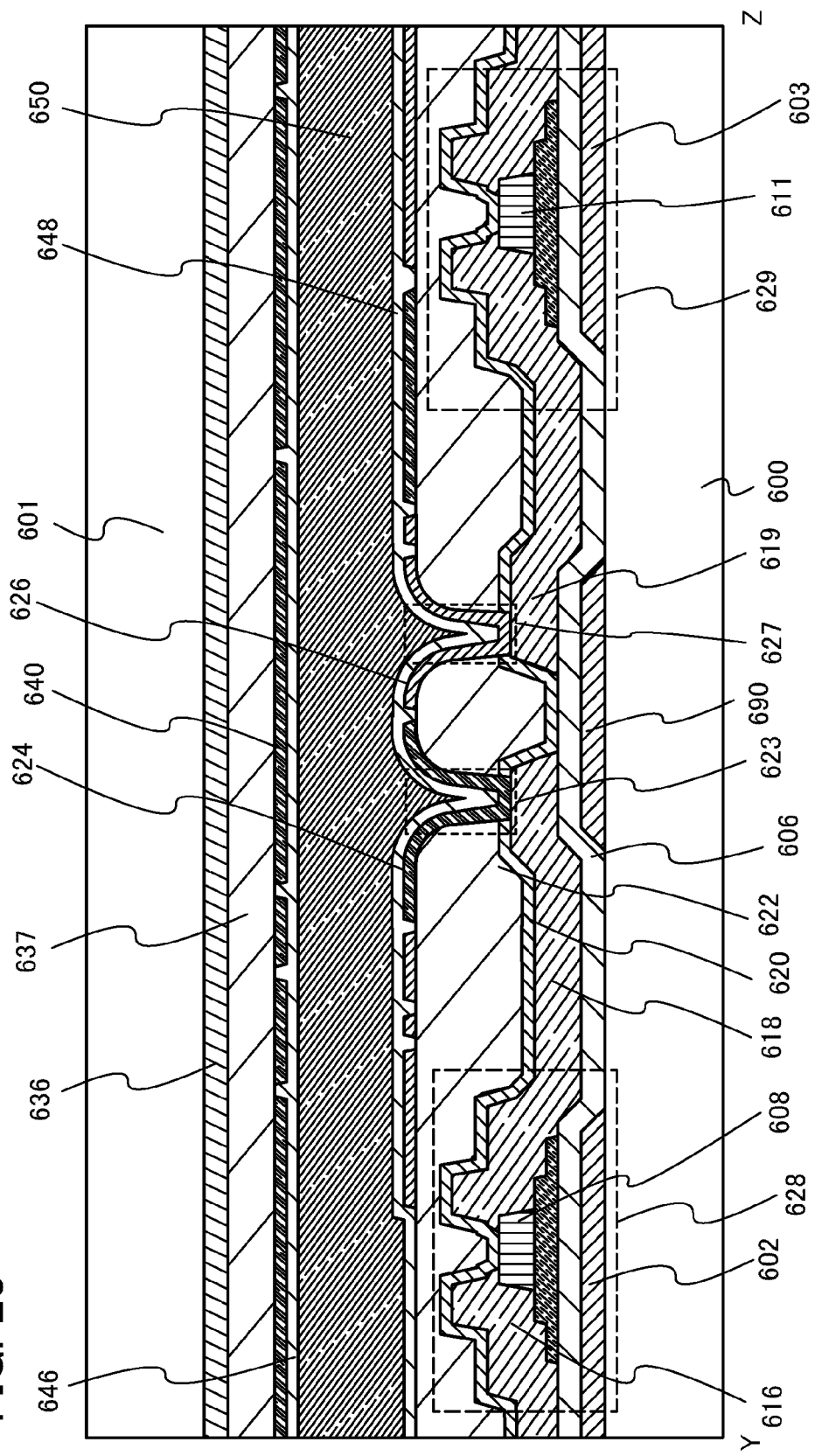
FIG. 28 illustrates a semiconductor device.
Figure 29:
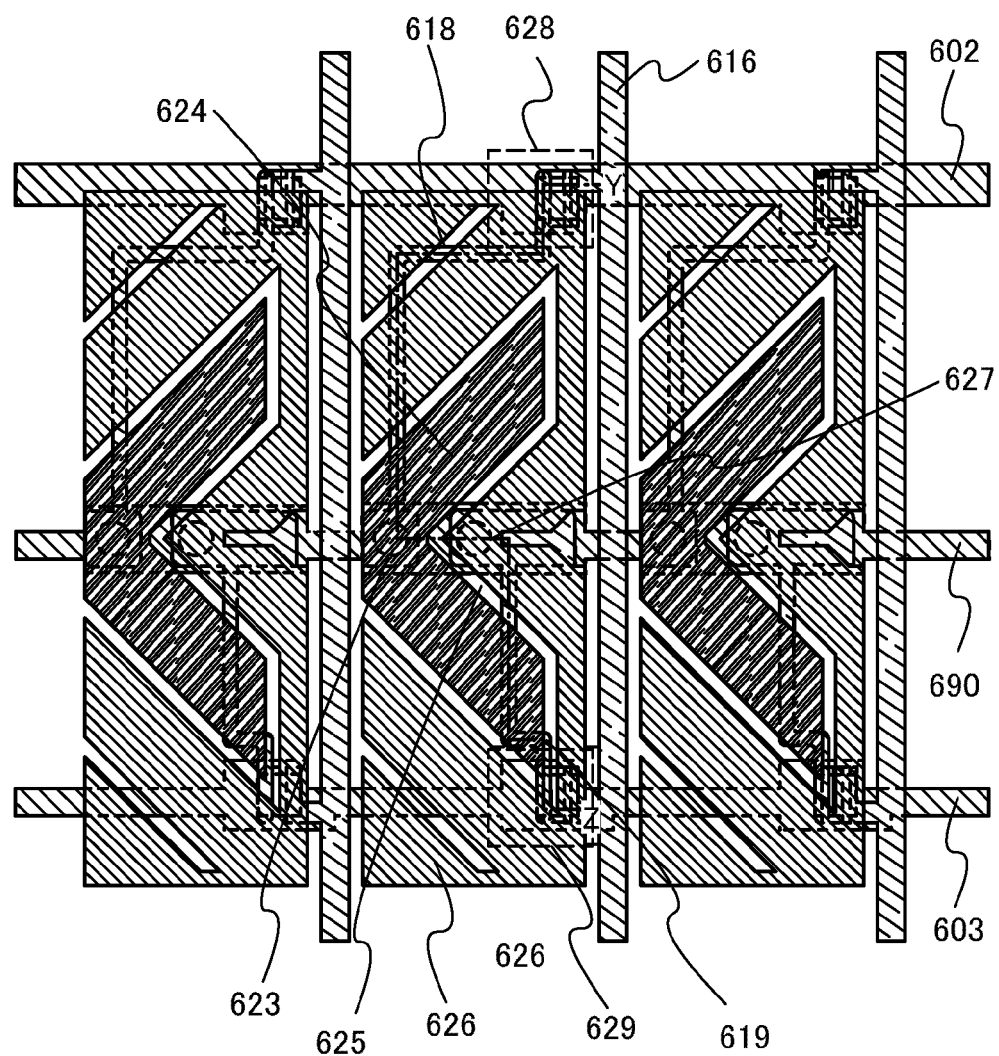
FIG. 29 illustrates a semiconductor device.

FIG. 28 and FIG. 29 illustrate a pixel structure of a VA liquid crystal display panel. FIG. 29 is a plan view of the substrate 600. FIG. 28 illustrates a cross-sectional structure taken along section line Y-Z in FIG. 29. Hereinafter, description is given with reference to both of the drawings.

In this pixel structure, a plurality of pixel electrodes are provided in one pixel, and a TFT is connected to each of the pixel electrodes. The plurality of TFTs are driven by different gate signals. In other words, signals applied to individual pixel electrodes in a multi-domain pixel are controlled independently of each other.

A pixel electrode layer 624 is connected to a TFT 628 through a wiring 618 in a contact hole 623 penetrating the insulating films 620 and 622. The pixel electrode layer 626 is connected to a TFT 629 through a wiring 619 in a contact hole 627 penetrating the insulating films 620 and 622. A gate wiring 602 of the TFT 628 is separated from a gate wiring 603 of the TFT 629 so that different gate signals can be supplied. On the other hand, a wiring 616 serving as a data line is shared by the TFTs 628 and 629. The thin film transistor described in any of Embodiments 1 to 4 can be used as appropriate as each of the TFTs 628 and 629. Further, a capacitor wiring 690 is provided. Note that a gate insulating film 606 is formed over the gate wiring 602, the gate wiring 603, and the capacitor wiring 690.

Figure 31:
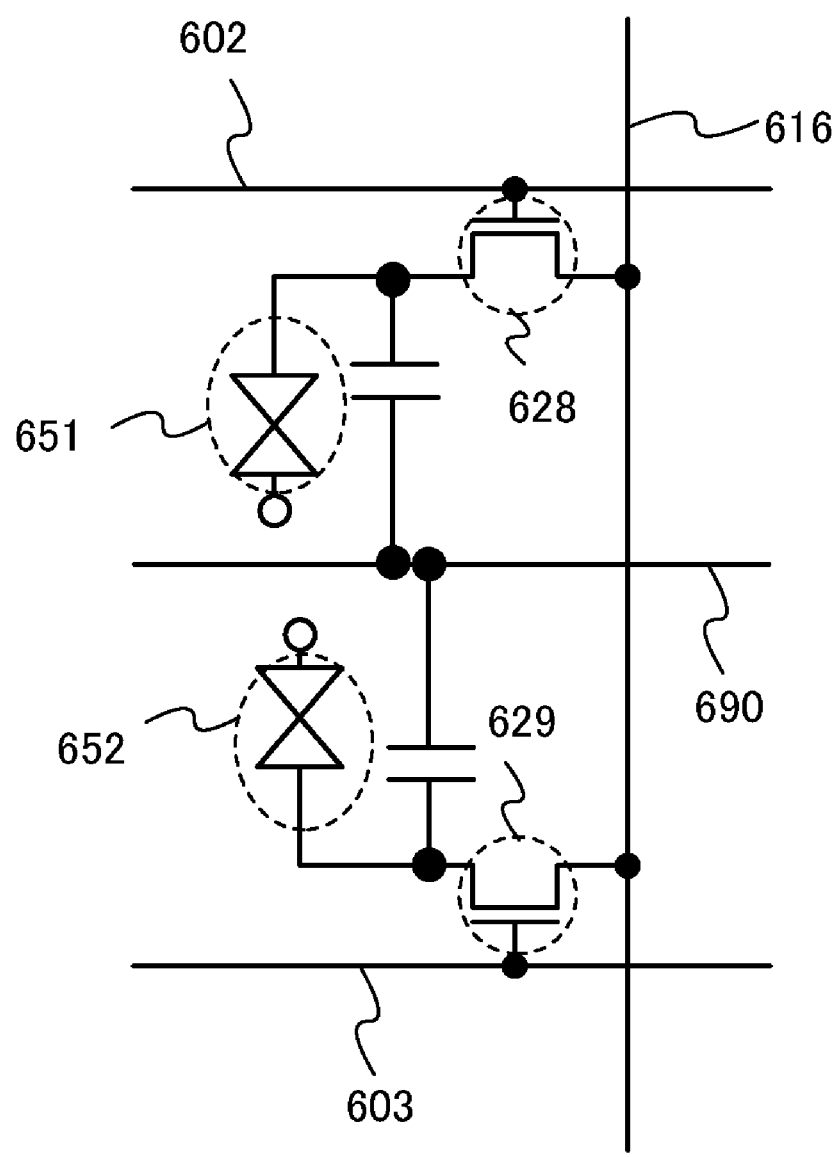
FIG. 31 illustrates a circuit diagram of a semiconductor device.

The shape of the pixel electrode layer 624 is different from that of the pixel electrode layer 626, and the pixel electrode layer 626 is formed so as to surround the external side of the pixel electrode layer 624 which spreads into a V shape. The timings at which voltages are applied to the pixel electrode layers 624 and 626 are made to be different in TFTs 628 and 629, whereby alignment of liquid crystals is controlled. FIG. 31 illustrates an equivalent circuit of this pixel structure. The TFT 628 is connected to the gate wiring 602, and the TFT 629 is connected to the gate wiring 603. Both of the TFTs 628 and 629 are connected to the wiring 616. When different gate signals are supplied to the gate wirings 602 and 603, operations of liquid crystal elements 651 and 652 can vary. In other words, the operations of the TFTs 628 and 629 are controlled separately to precisely control the alignment of the liquid crystals in the liquid crystal elements 651 and 652, which leads to a wider viewing angle.

Figure 30:
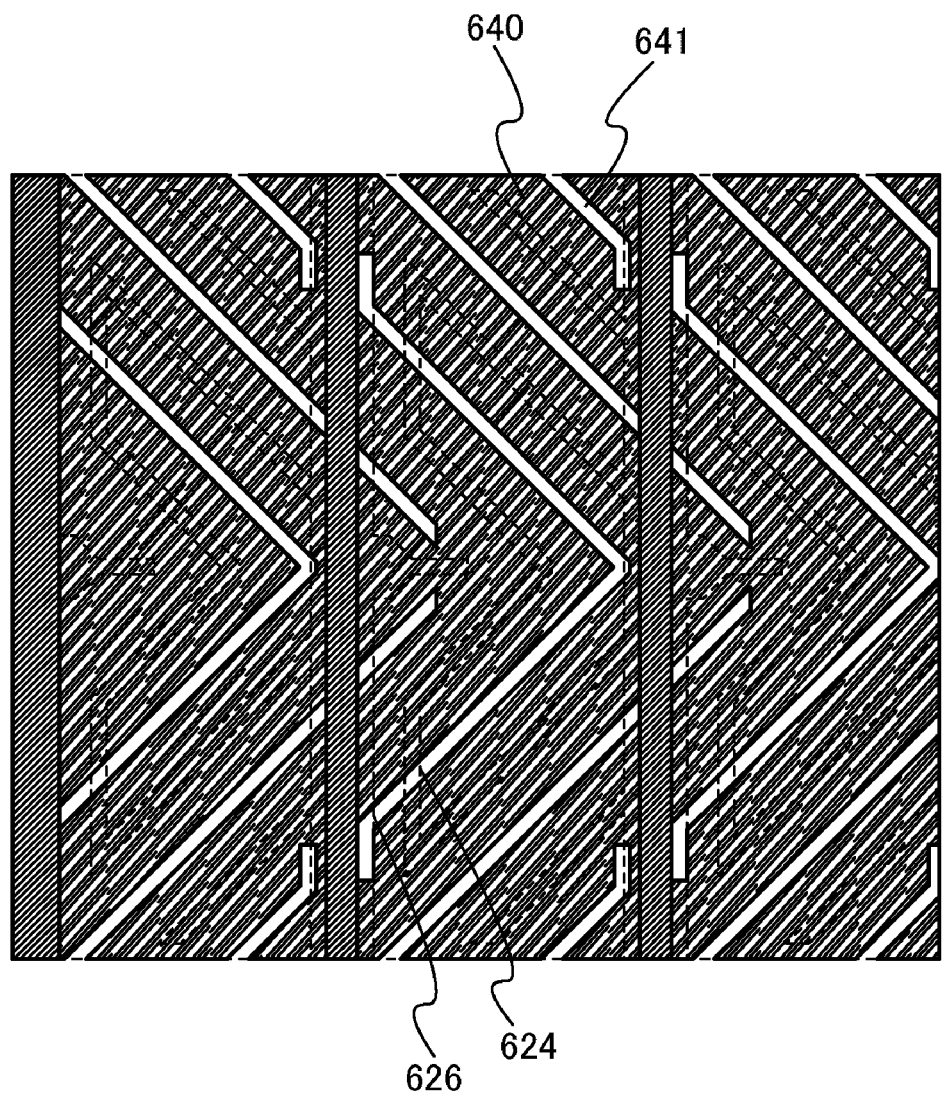
FIG. 30 illustrates a semiconductor device.

A counter substrate 601 is provided with a coloring film 636 and a counter electrode layer 640. A planarization film 637 is formed between the coloring film 636 and the counter electrode layer 640 to prevent alignment disorder of the liquid crystals. FIG. 30 illustrates a planar structure of the counter substrate side. The counter electrode layer 640 is an electrode shared by different pixels and slits 641 are formed. The slits 641 and the slits 625 on the pixel electrode layer 624 and 626 sides are arranged so as not to overlap with each other so that an oblique electric field is effectively generated, whereby the alignment of the liquid crystals can be controlled. Accordingly, the direction of the alignment of the liquid crystals can vary dependent on the location, which leads to a wider viewing angle.

An alignment film 648 is formed over the pixel electrode layer 624 and the pixel electrode layer 626, and the counter electrode layer 640 is similarly provided with an alignment film 646. A liquid crystal layer 650 is formed between the substrate 600 and a counter substrate 601. The pixel electrode layer 624, the liquid crystal layer 650, and the counter electrode layer 640 overlap with each other to form a first liquid crystal element. The pixel electrode layer 626, the liquid crystal layer 650, and the counter electrode layer 640 overlap with each other to form a second liquid crystal element. The pixel structure of the display panel illustrated in FIG. 28, FIG. 29, FIG. 30, and FIG. 31 is a multi-domain structure in which the first liquid crystal element and the second liquid crystal element are provided in one pixel.

Next, a liquid crystal display device in a horizontal electric field mode is described. In the horizontal electric field mode, an electric field is applied in a horizontal direction with respect to liquid crystal molecules in a cell, whereby liquid crystals are driven to express a gray scale. With this method, a viewing angle can be increased to about 180°. Hereinafter, a liquid crystal display device in the horizontal electric field mode is described.

Figure 32:
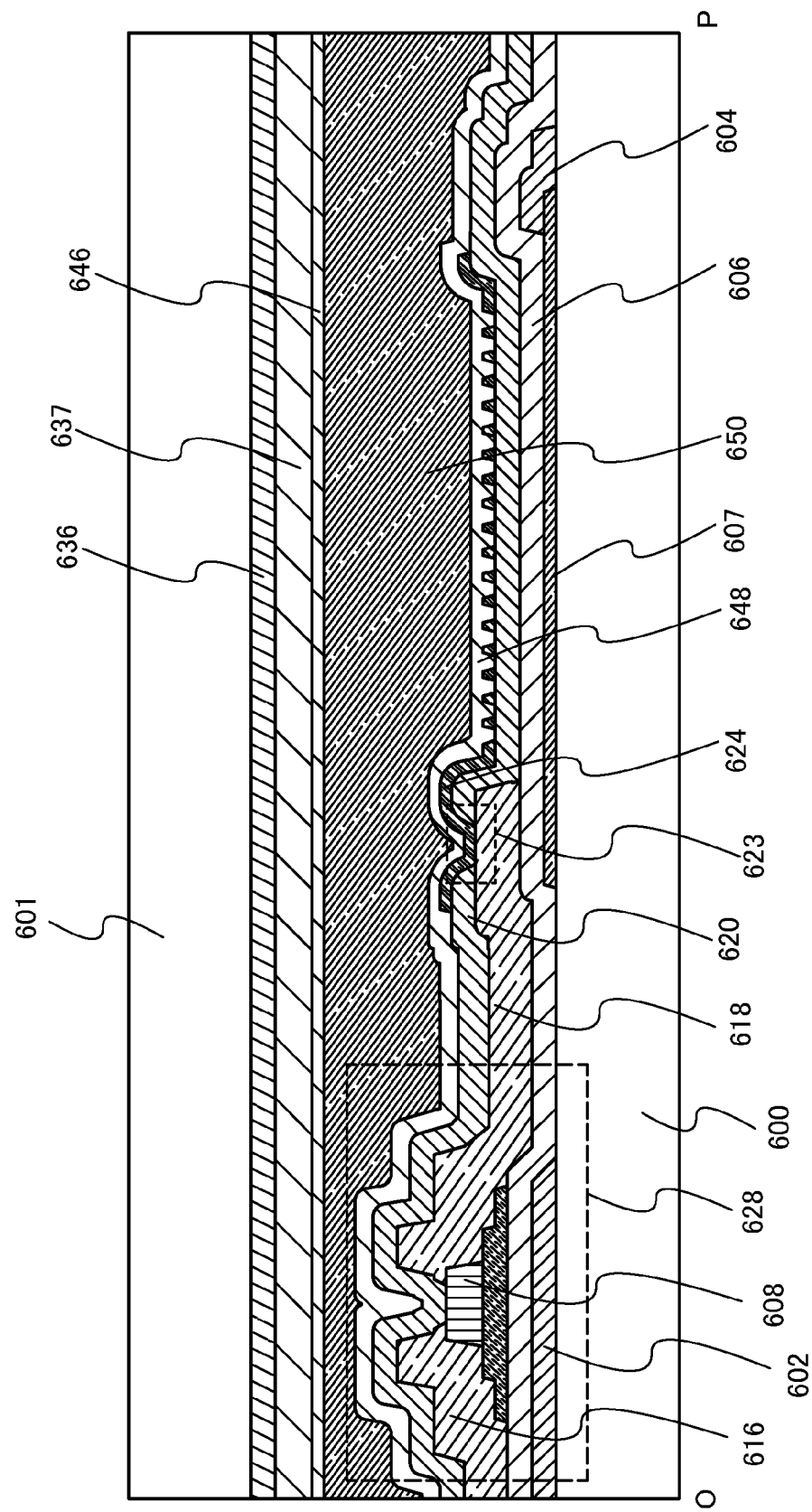
FIG. 32 illustrates a semiconductor device.

In FIG. 32, a substrate 600 over which an electrode layer 607, a TFT 628, and a pixel electrode layer 624 connected to the TFT 628 are formed overlaps with a counter substrate 601, and liquid crystals are injected between the substrate 600 and the counter substrate 601. The counter substrate 601 is provided with a coloring film 636, a planarization film 637, and the like. Note that a counter electrode is not provided on the counter substrate 601 side. In addition, a liquid crystal layer 650 is formed between the substrate 600 and the counter substrate 601 with the alignment films 646 and 648 therebetween.

The electrode layer 607 and a capacitor wiring 604 connected to the electrode layer 607, and the TFT 628 are formed over the substrate 600. The capacitor wiring 604 can be formed at the same time as a gate wiring 602 of the TFT 628. The thin film transistor described in any of Embodiments 1 to 5 can be used as the TFT 628. The electrode layer 607 can be formed using a material similar to that of the pixel electrode layer 427 described in any of Embodiments 1 to 4. The electrode layer 607 is divided almost in a pixel form. Note that a gate insulating film 606 is formed over the electrode layer 607 and the capacitor wiring 604.

Wirings 616 and 618 of the TFT 628 are formed over the gate insulating film 606. The wiring 616 is a data line through which a video signal travels, extends in one direction in a liquid crystal display panel, is connected to a source or drain region of the TFT 628, and functions as one of source and drain electrodes. The wiring 618 functions as the other of the source and drain electrodes and is connected to the pixel electrode layer 624.

An insulating film 620 is formed over the wirings 616 and 618. Over the insulating film 620, the pixel electrode layer 624 is formed to be connected to the wiring 618 through a contact hole 623 formed in the insulating film 620. The pixel electrode layer 624 is formed using a material similar to that of the pixel electrode layer 427 described in Embodiment 1.

In such a manner, the TFT 628 and the pixel electrode layer 624 connected to the TFT 628 are formed over the substrate 600. Note that a storage capacitor is formed with the electrode layer 607, the gate insulating film 606, the insulating film 620, and the pixel electrode layer 624.

Figure 33:
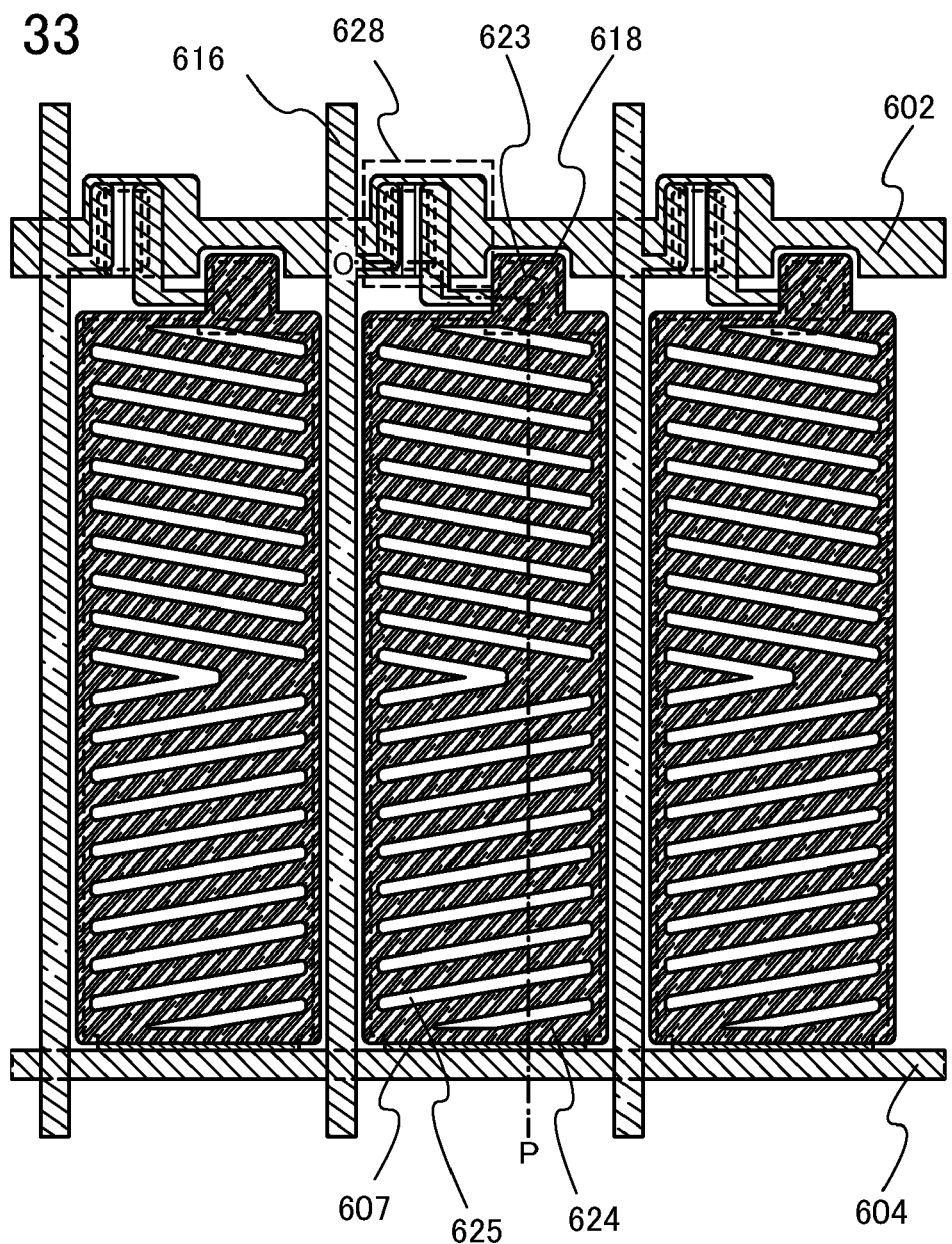
FIG. 33 illustrates a semiconductor device.

FIG. 33 is a plan view illustrating a structure of the pixel electrode. FIG. 32 illustrates a cross-sectional structure taken along section line O-P in FIG. 33. The pixel electrode layer 624 is provided with slits 625. The slits 625 are provided for controlling alignment of liquid crystals. In that case, an electric field is generated between the electrode layer 607 and the pixel electrode layer 624. The thickness of the gate insulating film 606 formed between the electrode layer 607 and the pixel electrode layer 624 is 50 nm to 200 nm, which is much smaller than the thickness of the liquid crystal layer of 2 μm to 10 μm. Thus, an electric field is generated substantially in parallel (in a horizontal direction) to the substrate 600. The alignment of the liquid crystals is controlled with this electric field. Liquid crystal molecules are horizontally rotated with the use of the electric field in the direction substantially parallel to the substrate. In that case, the liquid crystal molecules are horizontally aligned in any state, and thus the contrast or the like is less influenced by the viewing angle, which leads to a wider viewing angle. In addition, since both the electrode layer 607 and the pixel electrode layer 624 are light-transmitting electrodes, an aperture ratio can be improved.

Next, a different example of the liquid crystal display device in the horizontal electric field mode is described.

Figure 34:
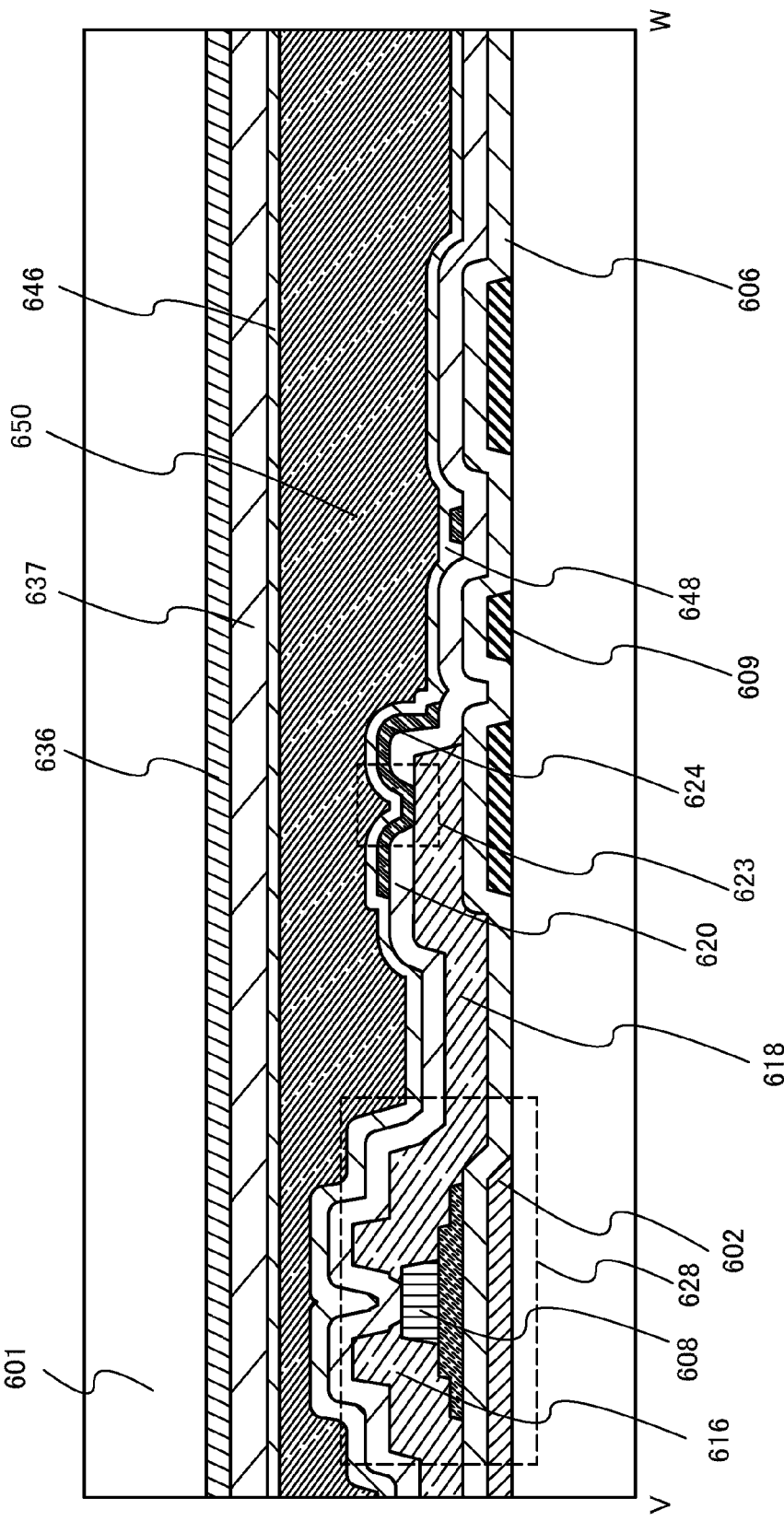
FIG. 34 illustrates a semiconductor device.
Figure 35:
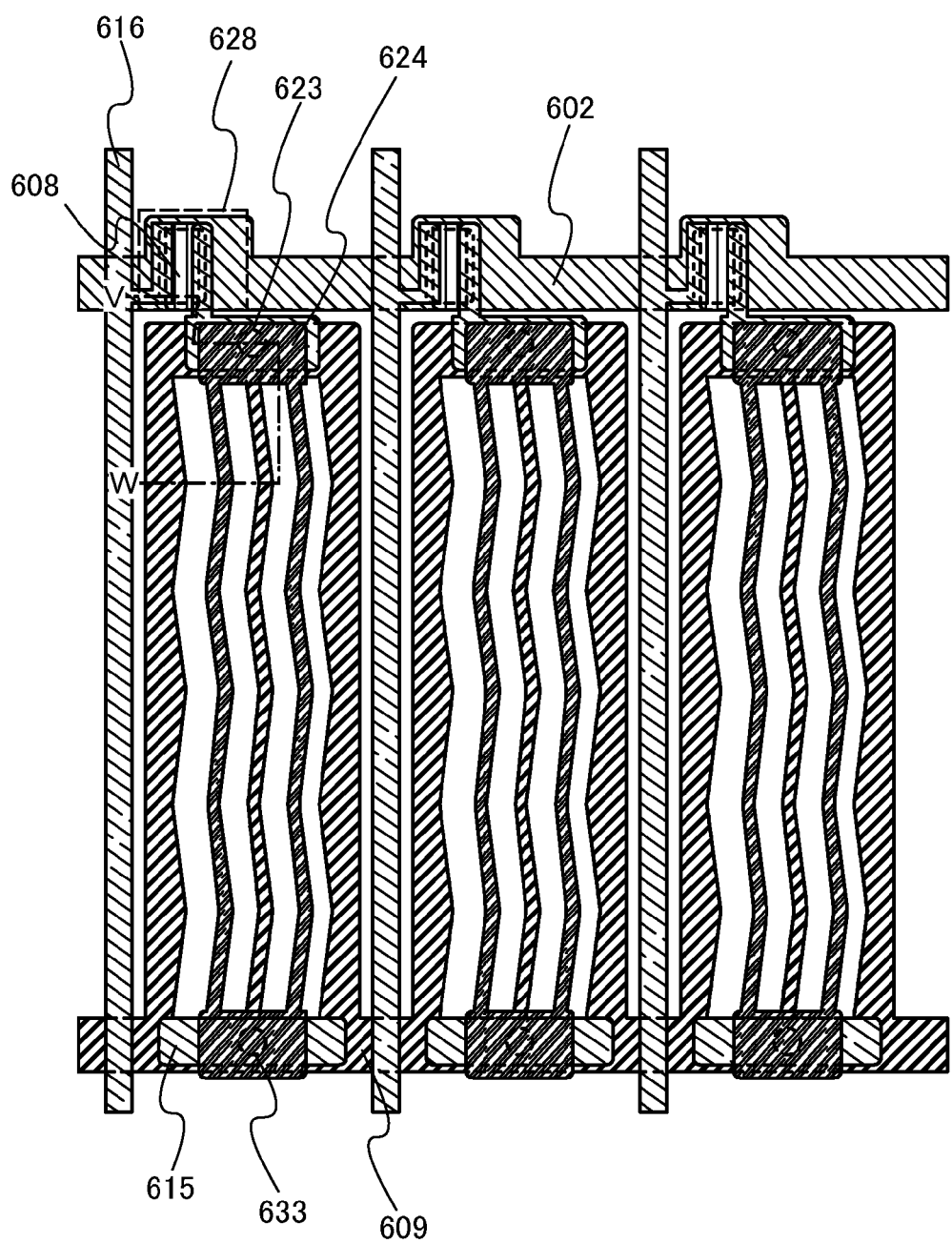
FIG. 35 illustrates a semiconductor device.

FIG. 34 and FIG. 35 illustrate a pixel structure of a liquid crystal display device in an IPS mode. FIG. 35 is a plan view. FIG. 34 illustrates a cross-sectional structure taken along section line V-W in FIG. 35. Description below is given with reference to both of the drawings.

In FIG. 34, a substrate 600 over which a TFT 628 and a pixel electrode layer 624 connected to the TFT 628 are formed overlaps with a counter substrate 601, and liquid crystals are injected between the substrate 600 and the counter substrate 601. The counter substrate 601 is provided with a coloring film 636, a planarization film 637, and the like. Note that a counter electrode layer is not provided on the counter substrate 601 side. A liquid crystal layer 650 is formed between the substrate 600 and the counter substrate 601 with the alignment films 646 and 648 therebetween.

A common potential line 609 and the TFT 628 are formed over the substrate 600. The common potential line 609 can be formed at the same time as a gate wiring 602 of the TFT 628. The thin film transistor described in any of Embodiments 1 to 4 can be used as the TFT 628.

Wirings 616 and 618 of the TFT 628 are formed over the gate insulating film 606. The wiring 616 is a data line through which a video signal travels, extends in one direction in a liquid crystal display panel, is connected to a source or drain region of the TFT 628, and functions as one of source and drain electrodes. The wiring 618 functions as the other of the source and drain electrodes and is connected to the pixel electrode layer 624.

An insulating film 620 is formed over the wirings 616 and 618. Over the insulating film 620, the pixel electrode layer 624 is formed to be connected to the wiring 618 through a contact hole 623 formed in the insulating film 620. The pixel electrode layer 624 is formed using a material similar to that of the pixel electrode layer described in any of Embodiments 1 to 4. Note that, as illustrated in FIG. 35, the pixel electrode layer 624 is formed such that the pixel electrode layer 624 and a comb-like electrode that is formed at the same time as the common potential line 609 can generate a horizontal electric field. Further, the pixel electrode layer 624 is formed so that comb-teeth portions of the pixel electrode layer 624 and those of the comb-like electrode that is formed at the same time as the common potential line 609 are arranged so as not to overlap with each other.

The alignment of the liquid crystals is controlled by an electric field generated between a potential applied to the pixel electrode layer 624 and a potential of the common potential line 609. Liquid crystal molecules are horizontally rotated with the use of the electric field in the direction substantially parallel to the substrate. In that case, the liquid crystal molecules are horizontally aligned in any state, and thus the contrast or the like is less influenced by the viewing angle, which leads to a wider viewing angle.

In such a manner, the TFT 628 and the pixel electrode layer 624 connected to the TFT 628 are formed over the substrate 600. A storage capacitor is formed with the gate insulating film 606, the common potential line 609, and a capacitor electrode 615. The capacitor electrode 615 and the pixel electrode layer 624 are connected to each other through a contact hole 633.

Next, a mode of a liquid crystal display device in a TN mode is described.

Figure 36:
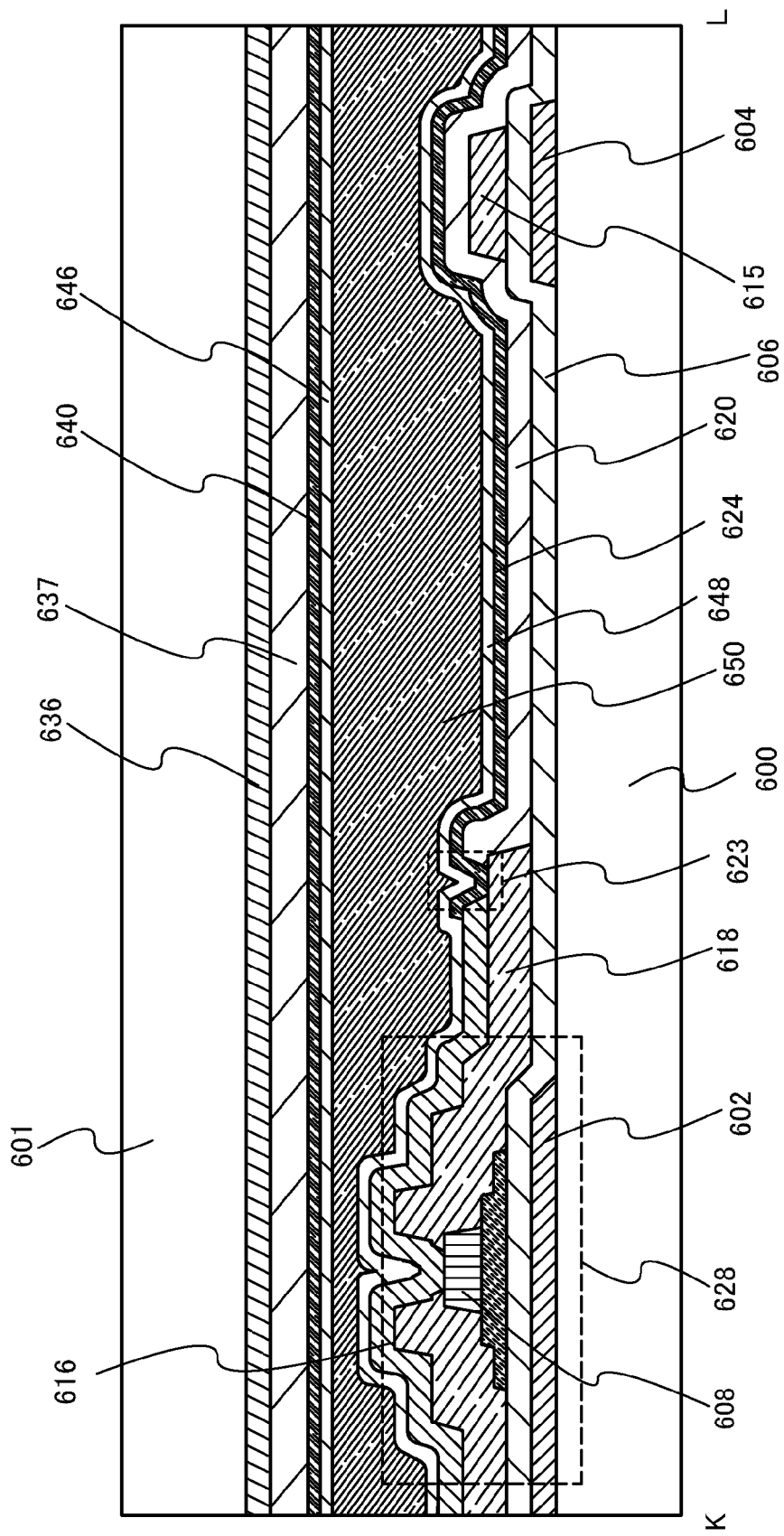
FIG. 36 illustrates a semiconductor device.
Figure 37:
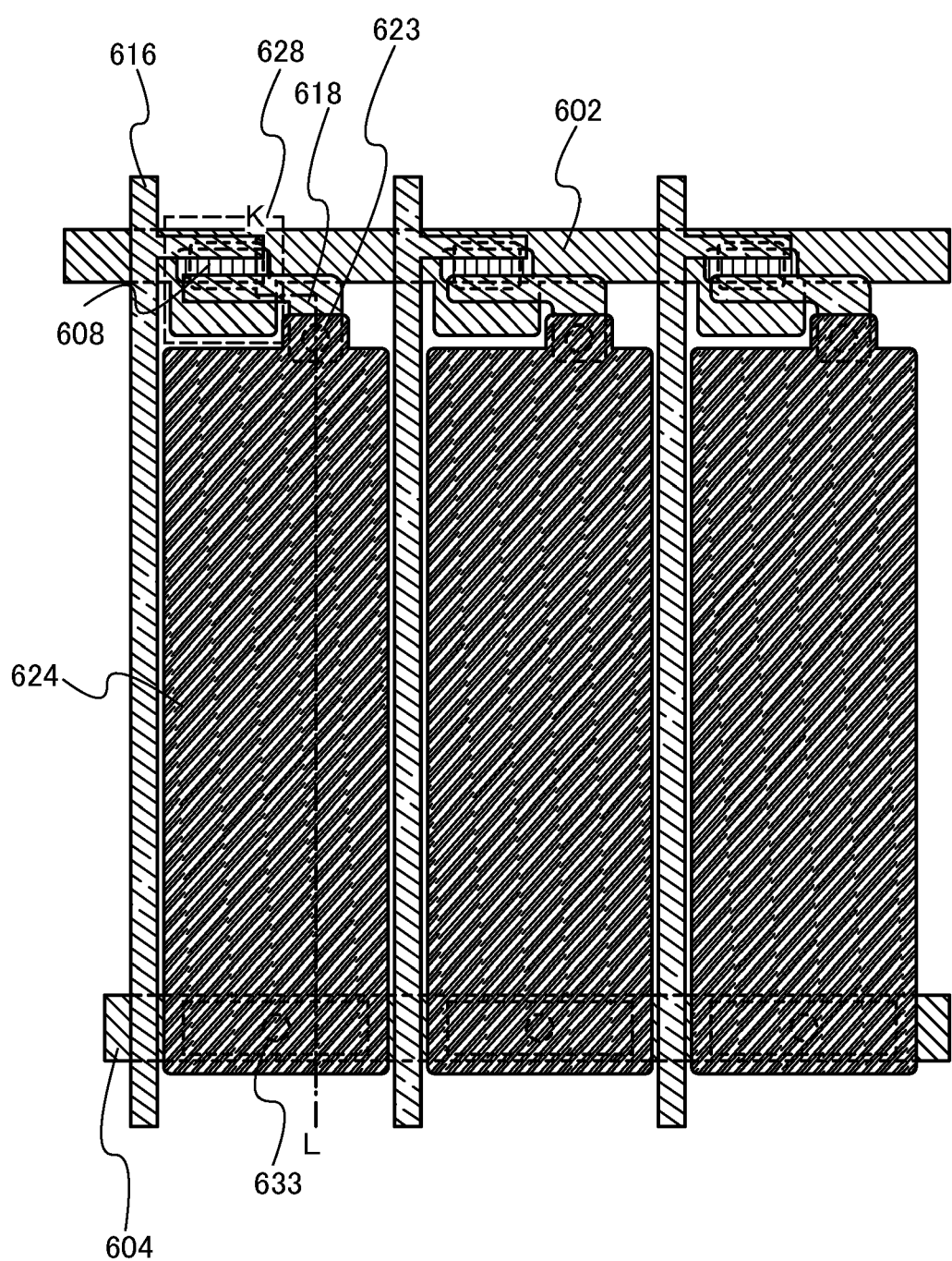
FIG. 37 illustrates a semiconductor device.

FIG. 36 and FIG. 37 illustrate a pixel structure of a liquid crystal display device in a TN mode. FIG. 37 is a plan view. FIG. 36 illustrates a cross-sectional structure taken along section line K-L in FIG. 37. Description below is given with reference to both of the drawings.

The pixel electrode layer 624 is connected to the TFT 628 through the wiring 618 through the contact hole 623. The wiring 616 functioning as a data line is connected to the TFT 628. The TFT described in any of Embodiments 1 to 4 can be used as the TFT 628.

The pixel electrode layer 624 is formed using a structure similar to that of the pixel electrode described in any of Embodiments 1 to 4. The capacitor wiring 604 can be formed at the same time as a gate wiring 602 of the TFT 628. The gate insulating film 606 is formed over the gate wiring 602 and the capacitor wiring 604. A storage capacitor is formed with the gate insulating film 606, the capacitor wiring 604, and the capacitor electrode 615. The capacitor electrode 615 and the pixel electrode layer 624 are connected to each other through the contact hole 633.

The counter substrate 601 is provided with the coloring film 636 and the counter electrode layer 640. The planarization film 637 is formed between the coloring film 636 and the counter electrode layer 640 to prevent alignment disorder of liquid crystals. The liquid crystal layer 650 is formed between the pixel electrode layer 624 and the counter electrode layer 640 with the alignment films 646 and 648 therebetween.

The pixel electrode layer 624, the liquid crystal layer 650, and the counter electrode layer 640 overlap with each other, whereby a liquid crystal element is formed.

The coloring film 636 may be formed on the substrate 600 side. A polarizing plate is attached to a surface of the substrate 600, which is reverse of the surface provided with the thin film transistor, and a polarizing plate is attached to a surface of the counter substrate 601, which is reverse of the surface provided with the counter electrode layer 640.

Through the above-described process, liquid crystal display devices can be manufactured as display devices. The liquid crystal display devices of this embodiment each have a high aperture ratio.

Embodiment 15

Figure 38:
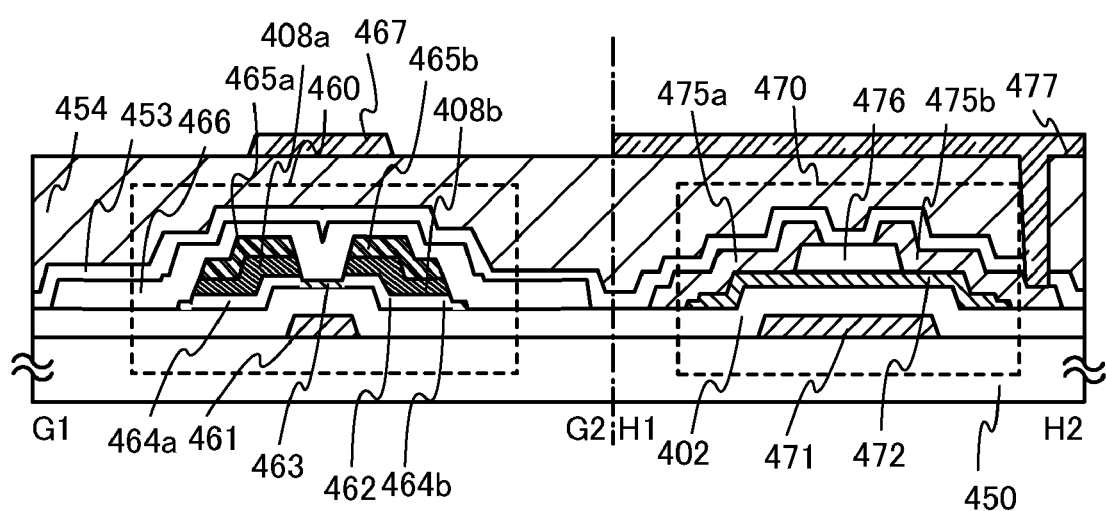
FIG. 38 illustrates a semiconductor device.

In this embodiment, FIG. 38 illustrates an example in which an oxide semiconductor layer is surrounded by nitride insulating films when seen in cross section. FIG. 38 is the same as FIG. 1B except the top surface shape of the oxide insulating layer 466, the positions of end portions of the oxide insulating layer 466, and the structure of the gate insulating layer. Thus, the same portions are denoted by common reference numerals and specific description of the same portions is omitted.

The thin film transistor 460 provided in a driver circuit is a channel-etched thin film transistor and includes, over the substrate 450 having an insulating surface, the gate electrode layer 461, a gate insulating layer 402 formed using a nitride insulating film, an oxide semiconductor layer 462 including at least the channel formation region 463, the first high-resistance drain region 464a, and the second high-resistance drain region 464b, the first low-resistance drain region 408a, the second low-resistance drain region 408b, the source electrode layer 465a, and the drain electrode layer 465b. In addition, the oxide insulating layer 466 is provided so as to cover the thin film transistor 460 and be in contact with the channel formation region 463.

The oxide insulating layer 466 is processed so that a portion of the gate insulating layer 402, which is on the outer side than the thin film transistor 460, is exposed when the channel protective layer 476 of the thin film transistor 470 provided in a pixel is formed through a photolithography process. At least the area of the top surface of the oxide insulating layer 466 is larger than that of the top surface of the oxide semiconductor layer and the top surface of the oxide insulating layer 466 preferably covers the thin film transistor 460.

Further, the protective insulating layer 453 formed using a nitride insulating film is formed so as to cover a top surface and side surfaces of the oxide insulating layer 466.

In the thin film transistor 460, the first high-resistance drain region 464a is formed in contact with a bottom surface of the first low-resistance drain region 408a in a self-aligned manner. Further, the second high-resistance drain region 464b is formed in contact with a bottom surface of the second low-resistance drain region 408b in a self-aligned manner. The channel formation region 463 is in contact with the oxide insulating layer 466, has a smaller thickness than the first high-resistance drain region 464a and the second high-resistance drain region 464b, and is a region (i-type region) having higher resistance than the first high-resistance drain region 464a and the second high-resistance drain region 464b.

The gate insulating layer 402 is formed, using a nitride insulating film, in contact with undersurfaces of the channel formation region 463, the first high-resistance drain region 464a, and the second high-resistance drain region 464b.

For the protective insulating layer 453 formed using a nitride insulating film, an inorganic insulating film which does not contain impurities such as moisture, a hydrogen ion, and OH⁻ and blocks entry of these from the outside is used: for example, a silicon nitride film, a silicon oxynitride film, an aluminum nitride film, or an aluminum oxynitride film obtained with a sputtering method is used.

In this embodiment, as the protective insulating layer 453 formed using a nitride insulating film, a silicon nitride film is formed to a thickness of 100 nm with an RF sputtering method so as to cover a top surface and side surfaces of the oxide semiconductor layer. In addition, the protective insulating layer 453 is in contact with the gate insulating layer 402 formed using a nitride insulating film.

With the structure illustrated in FIG. 38, entry of moisture from the outside can be prevented in a manufacturing process after formation of the protective insulating layer 453 formed using a nitride insulating film. Further, even after a device is completed as a semiconductor device such as a liquid crystal display device, entry of moisture from the outside can be prevented in the long term; therefore, reliability of the device can be improved.

In a similar manner, in the thin film transistor 470, the protective insulating layer 453 formed using a nitride insulating film is formed using a silicon nitride film to a thickness of 100 nm with an RF sputtering method so as to cover a top surface and side surfaces of the oxide semiconductor layer 472. In addition, the protective insulating layer 453 is in contact with the gate insulating layer 402 formed using a nitride insulating film.

In this embodiment, the structure is described in which one thin film transistor is covered with a nitride insulating film; however, one embodiment of the present invention is not limited thereto. Alternatively, a plurality of thin film transistors may be covered with a nitride insulating film or a plurality of thin film transistors in a pixel portion may be collectively covered with a nitride insulating film. A region where the protective insulating layer 453 and the gate insulating layer 402 are in contact with each other may be formed so that at least the pixel portion of the active matrix substrate is surrounded.

This embodiment can be freely combined with any of the other embodiments. This application is based on Japanese Patent Application serial no. 2009-169597 filed with Japan Patent Office on Jul. 17, 2009, the entire contents of which are hereby incorporated by reference.

EXPLANATION OF REFERENCE

10: pulse output circuit, 11: wiring, 12: wiring, 13: wiring, 14: wiring, 15: wiring, 21: input terminal, 22: input terminal, 23: input terminal, 24: input terminal, 25: input terminal, 26: output terminal, 27: output terminal, 31: transistor, 32: transistor, 33: transistor, 34: transistor, 35: transistor, 36: transistor, 37: transistor, 38: transistor, 39: transistor, 40: transistor, 41: transistor, 42: transistor, 43: transistor, 51: power supply line, 52: power supply line, 53: agate: insulating layer, 203: protective insulating layer, 204: planarization insulating layer, 210: thin film transistor, 216: oxide: insulating layer, 217: conductive layer, 220: thin film transistor, 227: pixel electrode layer, 230: capacitor wiring layer, 231: capacitor electrode, 232: gate wiring layer, 234a: oxide semiconductor layer, 234b: low-resistance drain region, 234c: source wiring, 235: terminal electrode, 236: metal wiring layer, 237: metal wiring layer, 238: gate wiring layer, 240: thin film transistor, 241: metal wiring layer, 242: metal wiring layer, 250: capacitor wiring layer, 251: oxide semiconductor layer, 402: gate insulating layer, 406: low-resistance drain region, 407: low-resistance drain region, 408a: low-resistance drain region, 408b: low-resistance drain region, 409: low-resistance drain region, 427: pixel electrode layer, 450: substrate, 452a: gate insulating layer, 452b: gate insulating layer, 453: protective insulating layer, 454: planarization insulating layer, 460: thin film transistor, 461: gate electrode layer, 462: oxide semiconductor layer, 463: channel formation region, 464a: high-resistance drain region, 464b: high-resistance drain region, 465a: source electrode layer, 465b: drain electrode layer, 466: oxide: insulating layer, 467: conductive layer, 470: thin film transistor, 471: gate electrode layer, 472: oxide semiconductor layer, 473: channel formation region, 474a: high-resistance drain region, 474b: high-resistance drain region, 475a: source electrode layer, 475b: drain electrode layer, 476: channel protective layer, 477: pixel electrode layer, 480: oxide semiconductor film, 481: oxide semiconductor layer, 482a: resist mask, 482b: resist mask, 483: oxide semiconductor layer, 484: conductive layer, 485: oxide semiconductor layer, 486: conductive layer, 487a: resist mask, 487b: resist mask, 488: oxide semiconductor layer, 489: oxide semiconductor layer, 490: conductive layer, 491: resist mask, 492: oxide insulating film, 493a: resist mask, 494: contact hole, 495: oxide semiconductor layer, 496: oxide semiconductor film, 497: oxide semiconductor layer, 498: thin film transistor, 499: thin film transistor, 580: substrate, 581: thin film transistor, 583: insulating film, 585: insulating layer, 587: electrode layer, 588: electrode layer, 589: spherical particle, 590a: black region, 590b: white region, 594: cavity, 595: filler, 596: substrate, 600: substrate, 601: counter substrate, 602: gate wiring, 603: gate wiring, 604: capacitor wiring, 605: capacitor wiring, 606: gate: insulating film, 607: electrode layer, 608: channel protective layer, 609: common potential line, 611: channel protective layer, 615: capacitor electrode, 616: wiring, 617: capacitor wiring, 618: wiring, 619: wiring, 620: insulating film, 622: insulating film, 623: contact hole, 624: pixel electrode layer, 625: slit, 626: pixel electrode layer, 627: contact hole, 628: TFT, 629: TFT, 630: storage capacitor portion, 631: storage capacitor portion, 632: light blocking film, 633: contact hole, 636: coloring film, 637: planarization film, 640: counter electrode layer, 641: slit, 644: protrusion, 646: alignment film, 648: alignment film, 650: liquid crystal layer, 651: liquid crystal element, 652: liquid crystal element, 690: capacitor wiring, 2600: TFT substrate, 2601: counter substrate, 2602: sealant, 2603: pixel portion, 2604: display element, 2605: coloring layer, 2606: polarizing plate, 2607: polarizing plate, 2608: wiring circuit portion, 2609: flexible wiring board, 2610: cold cathode tube, 2611: reflective plate, 2612: circuit board, 2613: diffusion plate, 2700: e-book reader, 2701: housing, 2703: housing, 2705: display portion, 2707: display portion, 2711: hinge portion, 2721: power switch, 2723: operation key, 2725: speaker, 4001: substrate, 4002: pixel portion, 4003: signal line driver circuit, 4004: scan line driver circuit, 4005: sealant, 4006: substrate, 4008: liquid crystal layer, 4010: thin film transistor, 4011: thin film transistor, 4013: liquid crystal element, 4015: connection terminal electrode, 4016: terminal electrode, 4018: FPC, 4019: anisotropic conductive film, 4020: protective insulating layer, 4021: insulating layer, 4030: pixel electrode layer, 4031: counter electrode layer, 4032: insulating layer, 4033: insulating layer, 4035: spacer, 4040: conductive layer, 4501: substrate, 4502: pixel portion, 4503a: signal line driver circuit, 4503b: signal line driver circuit, 4504a: scan line driver circuit, 4504b: scan line driver circuit, 4505: sealant, 4506: substrate, 4507: filler, 4509: thin film transistor, 4510: thin film transistor, 4511: light-emitting element, 4512: electroluminescent layer, 4513: electrode layer, 4515: connection terminal electrode, 4516: terminal electrode, 4517: electrode layer, 4518a: FPC, 4518b: FPC, 4519: anisotropic conductive film, 4520: partition wall, 4540: conductive layer, 4543: insulating layer, 4544: insulating layer, 5300: substrate, 5301: pixel portion, 5302: scan line driver circuit, 5303: scan line driver circuit, 5304: signal line driver circuit, 5305: timing control circuit, 5601: shift register, 5602: switching circuit, 5603: thin film transistor, 5604: wiring, 5605: wiring, 6400: pixel, 6401: switching transistor, 6402: light-emitting element driving transistor, 6403: capacitor element, 6404: light-emitting element, 6405: signal line, 6406: scan line, 6407: power supply line, 6408: common electrode, 7001: TFT, 7002: light-emitting element, 7003: cathode, 7004: light-emitting layer, 7005: anode, 7008: cathode, 7009: partition wall, 7011: light-emitting element driving TFT, 7012: light-emitting element, 7013: cathode, 7014: light-emitting layer, 7015: anode, 7016: light-blocking film, 7017: conductive film, 7018: conductive film, 7019: bank, 7021: light-emitting element driving TFT, 7022: light-emitting element, 7023: cathode, 7024: light-emitting layer, 7025: anode, 7027: conductive film, 7028: conductive film, 7029: partition wall, 9201: display portion, 9202: display button, 9203: operation switch, 9204: band portion, 9205: adjusting portion, 9206: camera portion, 9207: speaker, 9208: microphone, 9301: top housing, 9302: bottom housing, 9303: display portion, 9304: keyboard, 9305: external connection port, 9306: pointing device, 9307: display portion, 9600: television set, 9601: housing, 9603: display portion, 9605: stand, 9607: display portion, 9609: operation key, 9610: remote controller, 9700: digital photo frame, 9701: housing, 9703: display portion, 9881: housing, 9882: display portion, 9883: display portion, 9884: speaker portion, 9885: input means, 9886: recording medium insertion portion, 9887: connection terminal, 9888: sensor, 9889: microphone, 9890: LED lamp, 9891: housing, 9893: joint portion, 9900: slot machine, 9901: housing, and 9903: display portion.

The invention claimed is:

1. A semiconductor device comprising:
a driver circuit comprising a first transistor and a pixel portion comprising a second transistor over a substrate;
the first transistor comprising:
a first gate electrode layer over the substrate;
a gate insulating layer over the first gate electrode layer;
a first oxide semiconductor layer comprising a first channel formation region over the first gate electrode layer with the gate insulating layer interposed therebetween;
a first source electrode layer and a first drain electrode layer over the first oxide semiconductor layer; and
an oxide insulating layer over the first source electrode layer and the first drain electrode layer;
the second transistor comprising:
a second gate electrode layer over the substrate;
the gate insulating layer over the second gate electrode layer;

a second oxide semiconductor layer over the second gate electrode layer with the gate insulating layer interposed therebetween;

a channel protective layer over the second gate electrode layer with the second oxide semiconductor layer interposed therebetween; and a second source electrode layer and a second drain electrode layer over the second oxide semiconductor layer, wherein the oxide insulating layer is in contact with the first channel formation region, and wherein each of the second gate electrode layer, the gate insulating layer, the second oxide semiconductor layer, the channel protective layer, the second source electrode layer, and the second drain electrode layer has a light-transmitting property.

2. The semiconductor device according to claim 1, further comprising a pair of low-resistance drain regions between the first oxide semiconductor layer and each of the first source electrode layer and the first drain electrode layer.

3. The semiconductor device according to claim 1, further comprising:
an interlayer insulating film over the oxide insulating layer; and
a conductive layer over the first channel formation region with the interlayer insulating film interposed therebetween.

4. The semiconductor device according to claim 1, further comprising a pixel electrode layer electrically connected to one of the second source electrode layer and the second drain electrode layer.

5. The semiconductor device according to claim 1, wherein the first channel formation region is thinner than a region of the first oxide semiconductor layer which overlaps with one of the first source electrode layer and the first drain electrode layer.

6. The semiconductor device according to claim 1,
wherein an end portion of the first oxide semiconductor layer is positioned outer than a side surface of one of the first source electrode layer and the first drain electrode layer, and
wherein the end portion of the first oxide semiconductor layer is thinner than a region of the first oxide semiconductor layer which overlaps with one of the first source electrode layer and the first drain electrode layer.

7. The semiconductor device according to claim 2, wherein the pair of low-resistance drain regions, the second source electrode layer and the second drain electrode layer comprise the same material.

8. The semiconductor device according to claim 1, wherein the first source electrode layer and the first drain electrode layer comprise an element selected from Al, Cr, Cu, Ta, Ti, Mo and W as a main component or a stack of any of the above elements.

9. The semiconductor device according to claim 1, wherein the second source electrode layer and the second drain electrode layer comprise an indium oxide, an indium oxide-tin oxide alloy, an indium oxide-zinc oxide alloy, or zinc oxide.

10. The semiconductor device according to claim 1, further comprising:
a capacitor portion over the substrate,
wherein the capacitor portion comprises a capacitor wiring and a capacitor electrode overlapping with the capacitor wiring, and
wherein each of the capacitor wiring and the capacitor electrode has a light-transmitting property.

11. The semiconductor device according to claim 1, further comprising:
a protective insulating film over the oxide insulating layer, the second source electrode layer and the second drain electrode layer,
wherein the protective insulating film is provided so as to be in contact with the gate insulating layer.

12. The semiconductor device according to claim 1, wherein the second oxide semiconductor layer comprises a pair of second high-resistance drain regions and a second channel formation region provided between the pair of second high-resistance drain regions.

13. A semiconductor device comprising:
a driver circuit comprising a first transistor and a pixel portion comprising a second transistor over a substrate;
the first transistor comprising:
a first gate electrode layer over the substrate;
a gate insulating layer over the first gate electrode layer;
a first oxide semiconductor layer over the first gate electrode layer with the gate insulating layer interposed therebetween;
a first source electrode layer and a first drain electrode layer over the first oxide semiconductor layer; and
an oxide insulating layer over the first source electrode layer and the first drain electrode layer;
the second transistor comprising:
a second gate electrode layer over the substrate;
the gate insulating layer over the second gate electrode layer;
a second oxide semiconductor layer over the second gate electrode layer with the gate insulating layer interposed therebetween;
a channel protective layer over the second gate electrode layer with the second oxide semiconductor layer interposed therebetween; and
a second source electrode layer and a second drain electrode layer over the second oxide semiconductor layer,
wherein the first oxide semiconductor layer comprises a pair of first high-resistance drain regions and a first channel formation region provided between the pair of first high-resistance drain regions,
wherein the oxide insulating layer is in contact with the first channel formation region, and
wherein each of the second gate electrode layer, the gate insulating layer, the second oxide semiconductor layer, the channel protective layer, the second source electrode layer, and the second drain electrode layer has a light-transmitting property.

14. The semiconductor device according to claim 13, further comprising a pair of low-resistance drain regions between the first oxide semiconductor layer and each of the first source electrode layer and the first drain electrode layer.

15. The semiconductor device according to claim 13, further comprising:
an interlayer insulating film over the oxide insulating layer; and
a conductive layer over the first channel formation region with the interlayer insulating film interposed therebetween.

16. The semiconductor device according to claim 13, further comprising a pixel electrode layer electrically connected to one of the second source electrode layer and the second drain electrode layer.

17. The semiconductor device according to claim 13, wherein the first channel formation region is thinner than a region of the first oxide semiconductor layer which overlaps with one of the first source electrode layer and the first drain electrode layer.

18. The semiconductor device according to claim 13,
wherein an end portion of the first oxide semiconductor layer is positioned outer than a side surface of one of the first source electrode layer and the first drain electrode layer, and
wherein the end portion of the first oxide semiconductor layer is thinner than a region of the first oxide semiconductor layer which overlaps with one of the first source electrode layer and the first drain electrode layer.

19. The semiconductor device according to claim 14, wherein the pair of low-resistance drain regions, the second source electrode layer and the second drain electrode layer comprise the same material.

20. The semiconductor device according to claim 13, wherein the first source electrode layer and the first drain electrode layer comprise an element selected from Al, Cr, Cu, Ta, Ti, Mo and W as a main component or a stack of any of the above elements.

21. The semiconductor device according to claim 13, wherein the second source electrode layer and the second drain electrode layer comprise an indium oxide, an indium oxide-tin oxide alloy, an indium oxide-zinc oxide alloy, or a zinc oxide.

22. The semiconductor device according to claim 13, further comprising:
a capacitor portion over the substrate,
wherein the capacitor portion comprises a capacitor wiring and a capacitor electrode overlapping with the capacitor wiring, and
wherein each of the capacitor wiring and the capacitor electrode has a light-transmitting property.

23. The semiconductor device according to claim 13, further comprising:
a protective insulating film over the oxide insulating layer, the second source electrode layer and the second drain electrode layer,
wherein the protective insulating film is provided so as to be in contact with the gate insulating layer.

24. The semiconductor device according to claim 13, wherein the second oxide semiconductor layer comprises a pair of second high-resistance drain regions and a second channel formation region provided between the pair of second high-resistance drain regions.

25. A method for manufacturing a semiconductor device comprising:
forming a first gate electrode layer and a second gate electrode layer over a substrate;
forming a gate insulating layer over the first gate electrode layer and the second gate electrode layer;
forming an oxide semiconductor film over the gate insulating layer;
performing first heat treatment in order to decrease a hydrogen concentration in the oxide semiconductor film;
forming an oxide conductive film over the oxide semiconductor film after performing the first heat treatment;
forming a first conductive film over the oxide conductive film;
patterning the oxide semiconductor film, the oxide conductive film and the first conductive film to form a first oxide semiconductor layer over the first gate electrode layer with the gate insulating layer interposed therebetween, a second oxide semiconductor layer over the second gate electrode layer with the gate insulating layer interposed therebetween, a pair of low-resistance drain regions over the first oxide semiconductor layer, a first source electrode layer and a first drain electrode layer over the pair of low-resistance drain regions;
forming an oxide insulating layer over the first source electrode layer, the first drain electrode layer, and the second oxide semiconductor layer so as to be in contact with the second oxide semiconductor layer and a first channel formation region of the first oxide semiconductor layer which is provided between the first source electrode layer and the first drain electrode layer;
performing second heat treatment after forming the oxide insulating layer;
forming a channel protective layer over the second gate electrode layer with the second oxide semiconductor layer interposed therebetween by patterning the oxide insulating layer after performing the second heat treatment; and
forming a second source electrode layer and a second drain electrode layer over the second oxide semiconductor layer so that each of the second source electrode layer and the second drain electrode layer partly overlaps with the channel protective layer.

26. The method for manufacturing a semiconductor device according to claim 25, wherein the first source electrode layer and the first drain electrode layer comprise an element selected from Al, Cr. Cu, Ta, Ti, Mo, and W as a main component or a stack of any of the above elements.

27. The method for manufacturing a semiconductor device according to claim 25, wherein the second source electrode layer and the second drain electrode layer comprise an indium oxide, an indium oxide-tin oxide alloy, an indium oxide-zinc oxide alloy, or a zinc oxide.

28. The method for manufacturing a semiconductor device according to claim 25, wherein the first heat treatment is performed in an inert gas atmosphere or under a reduced pressure.

29. The method for manufacturing a semiconductor device according to claim 25, wherein the first oxide semiconductor layer is formed so that the first channel formation region is thinner than a region of the first oxide semiconductor layer which overlaps with one of the first source electrode layer and the first drain electrode layer.

30. The method for manufacturing a semiconductor device according to claim 25, further comprising:
forming an interlayer insulating film over the oxide insulating layer, the second source electrode layer and the second drain electrode layer;
forming a second conductive film over the interlayer insulating film; and
patterning the second conductive film to form a conductive layer and a pixel electrode layer,
wherein the conductive layer is formed so as to overlap with the first channel formation region, and
wherein the pixel electrode layer is formed so as to be electrically connected to one of the second source electrode layer and the second drain electrode layer.

31. The method for manufacturing a semiconductor device according to claim 25, further comprising forming a protective insulating layer over the oxide insulating layer, the second source electrode layer and the second drain electrode layer so as to be in contact with the gate insulating layer.

32. The method for manufacturing a semiconductor device according to claim 25, wherein the first oxide semiconductor layer is formed so that an end portion of the first oxide semiconductor layer is provided outer than a side surface of one of the first source electrode layer and the first drain electrode layer and thinner than a region of the first oxide semiconductor layer which overlaps with one of the first source electrode layer and the first drain electrode layer.

33. The method for manufacturing a semiconductor device according to claim 25, further comprising performing third heat treatment after forming the channel protective layer.

34. A method for manufacturing a semiconductor device comprising:
    forming a first gate electrode layer and a second gate electrode layer over a substrate;
    forming a gate insulating layer over the first gate electrode layer and the second gate electrode layer;
    forming an oxide semiconductor film over the gate insulating layer;
    performing first heat treatment in order to decrease a hydrogen concentration in the oxide semiconductor film;
    performing second heat treatment for the oxide semiconductor film after performing the first heat treatment;
    forming an oxide conductive film over the oxide semiconductor film after performing the second heat treatment;
    forming a first conductive film over the oxide conductive film;
    patterning the oxide semiconductor film, the oxide conductive film, and the first conductive film to form a first oxide semiconductor layer over the first gate electrode layer with the gate insulating layer interposed therebetween, a second oxide semiconductor layer over the second gate electrode layer with the gate insulating layer interposed therebetween, a pair of low-resistance drain regions over the first oxide semiconductor layer, a first source electrode layer and a first drain electrode layer over the pair of low-resistance drain regions;
    forming an oxide insulating layer so as to be in contact with the second oxide semiconductor layer and a first channel formation region of the first oxide semiconductor layer which is provided between the first source electrode layer and the first drain electrode layer;
    performing third heat treatment after forming the oxide insulating layer;
    forming a channel protective layer over the second gate electrode layer with the second oxide semiconductor layer interposed therebetween by patterning the oxide insulating layer after performing the third heat treatment; and
    forming a second source electrode layer and a second drain electrode layer over the second oxide semiconductor layer so that each of the second source electrode layer and the second drain electrode layer partly overlaps with the channel protective layer,
    wherein the second heat treatment is performed in an oxygen atmosphere, an N₂O gas atmosphere or ultra-dry air.

35. The method for manufacturing a semiconductor device according to claim 34, wherein the first source electrode layer and the first drain electrode layer comprise an element selected from Al, Cr. Cu, Ta, Ti, Mo, and W as a main component or a stack of any of the above elements.

36. The method for manufacturing a semiconductor device according to claim 34, wherein the second source electrode layer and the second drain electrode layer comprise an indium oxide, an indium oxide-tin oxide alloy, an indium oxide-zinc oxide alloy, or a zinc oxide.

37. The method for manufacturing a semiconductor device according to claim 34, wherein the first heat treatment is performed in an inert gas atmosphere or under a reduced pressure.

38. The method for manufacturing a semiconductor device according to claim 34, wherein the first oxide semiconductor layer is formed so that the first channel formation region is thinner than a region of the first oxide semiconductor layer which overlaps with one of the first source electrode layer and the first drain electrode layer.

39. The method for manufacturing a semiconductor device according to claim 34, further comprising:
    forming an interlayer insulating film over the oxide insulating layer, the second source electrode layer and the second drain electrode layer;
    forming a second conductive film over the interlayer insulating film; and
    patterning the second conductive film to form a conductive layer and a pixel electrode layer,
    wherein the conductive layer is formed so as to overlap with the first channel formation region, and
    wherein the pixel electrode layer is formed so as to be electrically connected to one of the second source electrode layer and the second drain electrode layer.

40. The method for manufacturing a semiconductor device according to claim 34, further comprising forming a protective insulating layer over the oxide insulating layer, the second source electrode layer and the second drain electrode layer so as to be in contact with the gate insulating layer.

41. The method for manufacturing a semiconductor device according to claim 34, wherein the first oxide semiconductor layer is formed so that an end portion of the first oxide semiconductor layer is provided outer than a side surface of one of the first source electrode layer and the first drain electrode layer and thinner than a region of the first oxide semiconductor layer which overlaps with one of the first source electrode layer and the first drain electrode layer.

42. The method for manufacturing a semiconductor device according to claim 34, further comprising performing fourth heat treatment after forming the channel protective layer.

* * * * *